US 9,997,380 B2

(12) United States Patent
Nakai

(10) Patent No.: US 9,997,380 B2
(45) Date of Patent: Jun. 12, 2018

(54) SUBSTRATE PROCESSING APPARATUS

(71) Applicant: SCREEN Holdings Co., Ltd., Kyoto (JP)

(72) Inventor: Hitoshi Nakai, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 22 days.

(21) Appl. No.: 15/109,921

(22) PCT Filed: Dec. 22, 2014

(86) PCT No.: PCT/JP2014/083836
§ 371 (c)(1),
(2) Date: Jul. 6, 2016

(87) PCT Pub. No.: WO2015/107838
PCT Pub. Date: Jul. 23, 2015

(65) Prior Publication Data
US 2016/0329220 A1 Nov. 10, 2016

(30) Foreign Application Priority Data

Jan. 16, 2014 (JP) .................. 2014-006105
Jan. 16, 2014 (JP) .................. 2014-006106
Dec. 5, 2014 (JP) .................. 2014-246815

(51) Int. Cl.
*H01L 21/67* (2006.01)
*H01L 21/687* (2006.01)
*B08B 3/10* (2006.01)

(52) U.S. Cl.
CPC .. *H01L 21/67051* (2013.01); *H01L 21/67017* (2013.01); *H01L 21/6719* (2013.01);
(Continued)

(58) Field of Classification Search
None
See application file for complete search history.

(56) References Cited

U.S. PATENT DOCUMENTS 6,589,338 B1  7/2003  Nakamori et al. .............. 118/50
7,648,578 B1  1/2010  Itatani et al. ................. 118/715
(Continued)

FOREIGN PATENT DOCUMENTS

JP  2002-177856  6/2002
JP  2007-180379  7/2007
(Continued)

OTHER PUBLICATIONS

International Search Report and Written Opinion dated Mar. 31, 2015 in corresponding PCT International Application No. PCT/JP2014/083836.
(Continued)

*Primary Examiner* — Michael E Barr
*Assistant Examiner* — Cristi J Tate-Sims
(74) *Attorney, Agent, or Firm* — Ostrolenk Faber LLP

(57) ABSTRACT

In a substrate processing apparatus, a chamber bottom has a plurality of large chamber exhaust ports arranged in a circumferential direction. A cup rotation mechanism rotates a cup part so that a cup exhaust port selectively overlaps with one of the large chamber exhaust ports. With the cup exhaust port overlapping with one large chamber exhaust port, the gas in the cup part is discharged to the outside of the chamber via a first exhaust mechanism. With the cup exhaust port overlapping with another large chamber exhaust port, the gas in cup part is discharged to the outside of the chamber via a second exhaust mechanism. By rotating the cup part in the chamber via the cup rotation mechanism, the substrate processing apparatus can easily switch the exhaust mechanism for exhausting gas from the cup part.

33 Claims, 26 Drawing Sheets

(52) U.S. Cl.
CPC .. *H01L 21/67126* (2013.01); *H01L 21/68742* (2013.01); *B08B 3/10* (2013.01)

(56) References Cited

U.S. PATENT DOCUMENTS

| | | |
|---|---|---|
| 8,193,101 B2 | 6/2012 | Sato et al. .................... 438/765 |
| 2011/0073565 A1 | 3/2011 | Hayashi .......................... 216/83 |
| 2013/0284288 A1 | 10/2013 | Kim .............................. 137/526 |

FOREIGN PATENT DOCUMENTS

| | | |
|---|---|---|
| JP | 2010-010554 | 1/2010 |
| JP | 2010-226043 | 10/2010 |
| JP | 2010226043 A * | 10/2010 |
| JP | 2011-204933 | 10/2011 |
| JP | 2013-207265 | 10/2013 |
| JP | 2013-207266 | 10/2013 |
| KR | 10-2013-0060521 | 6/2013 |
| KR | 10-2013-0122500 | 11/2013 |

OTHER PUBLICATIONS

Notification Concerning Transmitaal of International Preliminary Report on Patentability including PCT/IB/373 and PCT/ISA/237 (in Japanese) dated Jul. 28, 2016.

Notification of Transmittal of Translation of the International Preliminary Report on Patentability including PCT/IB/373 and PCT/ISA/237 (in English) dated Jul. 28, 2016.

* cited by examiner

SUBSTRATE PROCESSING APPARATUS

CROSS-REFERENCE TO RELATED APPLICATIONS

The present application is a 35 U.S.C. § § 371 national phase conversion of PCT/JP2014/083836, filed Dec. 22, 2014, which claims priority to Japanese Patent Application Nos. 2014-006105, 2014-006106 and 2014-246815, filed Jan. 16, 2014, Jan. 16, 2014 and Dec. 5, 2014, respectively, the contents of all of which are incorporated herein by reference. The PCT International Application was published in the Japanese language.

TECHNICAL FIELD

The present invention relates to a substrate processing apparatus for processing substrates.

BACKGROUND ART

A process of manufacturing semiconductor substrates (hereinafter, simply referred to as "substrates") has conventionally used a substrate processing apparatus that performs various types of processing on a rotating substrate by supplying processing liquids to the substrate. Such a substrate processing apparatus may include a cup part that is disposed around a substrate and for receiving, for example, processing liquids dispersed by centrifugal force from the substrate.

Japanese Patent Application Laid-Open No. 2010-10554 (Document 1) relates to a spin processing apparatus for processing substrates by sequentially supplying a plurality of types of processing liquids to the substrates. The spin processing apparatus includes a cup body around a rotary table that holds a substrate. Between the rotary table and the cup body is a processing-liquid receiver that is moved up and down to switch between passages that are connected to a lower portion of the side surface of the processing liquid receiver. This spin processing apparatus switches the passage for each type of processing liquid received by the processing liquid receiver so that the plurality of types of processing liquids are recovered separately. The atmosphere in the cup body is exhausted through a common exhaust pipe provided in the side surface of the cup body.

A substrate processing apparatus disclosed in Japanese Patent Application Laid-Open No. 2011-204933 (Document 2) includes a cup around a spin chuck inside a treatment chamber. The bottom of the cup has a discharge groove for discharging the atmosphere in the cup, together with processing liquids such as deionized water spinned off from the substrate. Exhaust gas and drainage are guided through the discharge groove to a gas-liquid separator located outside the treatment chamber, and separated exhaust gases are guided to an exhaust switcher. The exhaust switcher switches the destinations to which the exhaust gases flow, among three individual exhaust pipes.

A cup of a substrate processing apparatus disclosed in Japanese Patent Application Laid-Open No. 2002-177856 (Document 3) includes a circular ring-shaped first drain tank located on the outer side of the edge of a substrate, and a circular ring-shaped second drain tank located around the first drain tank. The first drain tank has a drain port and an exhaust port in the bottom, and the top of the exhaust port is covered with a skirt part that is inclined in the circumferential direction. The second drain tank also has a drain port and an exhaust port in the bottom, and the top of the exhaust port is covered with a skirt part that is inclined in the circumferential direction.

Substrate processing apparatuses disclosed in Japanese Patent Application Laid-Open Nos. 2013-207265 (Document 4) and 2013-207266 (Document 5) have a plurality of discharge ports in the side surface of a cup. The discharge ports are opened and closed independently of each other by a switchgear. Each discharge port is connected to a gas-liquid separator and an exhaust device that are not connected to the other discharge ports, and a processing liquid discharged from the gas-liquid separator is guided to a recovery system or a drainage system.

Now, the spin processing apparatus of Document 1 cannot switch the exhaust pipe for exhausting the atmosphere in the cup body, even when the type of processing liquid to be used in the processing of substrates has been changed. The substrate processing apparatus of Document 2 can switch the exhaust pipe depending on, for example, the type of processing liquid, but the size of the substrate processing apparatus may increase because the exhaust switcher is provided outside the treatment chamber. In addition, the plurality of types of processing liquids and the exhaust gas are guided through the common piping to the outside of the treatment chamber and thus may mix with the other processing liquids remaining in, for example, the piping. This may cause undesirable mixing and contact and a reduction in the recovery rate of processing liquids.

In Document 3, the discharge of liquid and gas via the first drainage tank and the discharge of liquid and gas via the second drainage tank are switchable according to, for example, the type of processing liquid, but the size of the substrate processing apparatus may increase because a plurality of drain tanks that correspond to the types of processing liquids need to be provided concentrically outside the substrate. In the substrate processing apparatuses of Documents 4 and 5, each of the plurality of discharge ports of the cup is provided with a switchgear that operates independently of the other discharge ports. This may result in a complexity of the structure related to the switching of the discharge of gas and liquid and control of the structure, as well as an increase in the sizes of the apparatuses.

In the substrate processing apparatuses as described above, when there is demand for adjustment of the flow rate of exhaust gas from the exhaust port, a mechanism for adjusting the flow rate of exhaust gas is provided in the exhaust pipe, separately from the structure for switching the discharge of gas. This may complicate the structures of the apparatuses and increase the sizes of the apparatuses.

SUMMARY OF INVENTION

The present invention is intended for a substrate processing apparatus for processing substrates, and it is an object of the present invention to easily switch an exhaust mechanism. The present invention also aims to easily change the flow rate of exhaust gas.

A substrate processing apparatus according to the present invention includes a substrate holder for holding a substrate in a horizontal position, a processing liquid supply part for supplying a processing liquid to the substrate, a cup part having a cup exhaust port and for receiving a processing liquid from the substrate, a chamber for internally housing the substrate holder and the cup part, a cup rotation mechanism for rotating the cup part about a central axis pointing in an up-down direction, and a controller for rotating the cup part via the cup rotation mechanism and determining a position of the cup exhaust port in a circumferential direction about the central axis. The chamber has a first chamber exhaust port and a second chamber exhaust port that are arranged in the circumferential direction. The controller controls the cup rotation mechanism to cause the cup exhaust port to selectively overlap with either the first chamber exhaust port or the second chamber exhaust port. In a state in which the cup exhaust port overlaps with the first chamber exhaust port, gas in the cup part is discharged through the cup exhaust port and the first chamber exhaust port to an outside of the chamber by a first exhaust mechanism that is connected to the first chamber exhaust port. In a state in which the cup exhaust port overlaps with the second chamber exhaust port, the gas in the cup part is discharged through the cup exhaust port and the second chamber exhaust port to the outside of the chamber by a second exhaust mechanism that is connected to the second chamber exhaust port. Thus, the exhaust mechanism can be easily switched.

In a preferred embodiment of the present invention, the cup exhaust port is provided in a bottom of the cup part, and the first chamber exhaust port and the second chamber exhaust port are provided in a bottom of the chamber.

In another preferred embodiment of the present invention, the cup part has a ring shape about the central axis. The cup part includes a circular ring-shaped bottom, a cylindrical inner wall part that extends upward from an inner circumferential portion of the bottom, and a cylindrical outer wall part that extends upward from an outer circumferential portion of the bottom. The cup exhaust port is provided in either the inner wall part or the outer wall part. The first chamber exhaust port and the second chamber exhaust port are provided in a side wall part of the chamber that opposes either the inner wall part or the outer wall part of the cup part.

In another preferred embodiment of the present invention, the bottom of the cup part has a cup drain port. The bottom of the chamber has a first chamber drain port and a second chamber drain port that are arranged in the circumferential direction. In a state in which the cup exhaust port overlaps with the first chamber exhaust port, the cup drain port overlaps with the first chamber drain port to discharge a processing liquid in the cup part to a first drainage part that is connected to the first chamber drain port and located outside the chamber. In a state in which the cup exhaust port overlaps with the second chamber exhaust port, the cup drain port overlaps with the second chamber drain port to discharge a processing liquid in the cup part to a second drainage part that is connected to the second chamber drain port and located outside the chamber.

More preferably, the bottom of the chamber has another first chamber drain port that is arranged along with the first chamber drain port and the second chamber drain port in the circumferential direction and connected to the first drainage part. In a state in which the cup drain port overlaps with the another first chamber drain port, a processing liquid in the cup part is discharged to the first drainage part, and the cup exhaust port is located at a position spaced in the circumferential direction from the first chamber exhaust port and the second chamber exhaust port.

Yet more preferably, a length of the first chamber drain port in the circumferential direction is longer than a length of the cup drain port in the circumferential direction. By rotating the cup part from a state in which the cup drain port overlaps with the first chamber drain port and the cup exhaust port overlaps with the first chamber exhaust port while maintaining the overlap between the cup drain port and the first chamber drain port, the cup exhaust port is moved to a position shifted from the first chamber exhaust port.

In another preferred embodiment of the present invention, the cup part has a ring shape about the central axis. The cup part includes the bottom having a circular ring shape, a cylindrical inner wall part that extends upward from an inner circumferential portion of the bottom, a cylindrical outer wall part that extends upward from an outer circumferential portion of the bottom, and a cylindrical partition wall that is located between the inner wall part and the outer wall part and extends upward from the bottom. A processing liquid from the processing liquid supply part flows into a space between the outer wall part and the partition wall of the cup part. The cup drain port is located on an outer side of the partition wall in a radial direction about the central axis. The cup exhaust port is located on an inner side of the partition wall in the radial direction.

More preferably, the substrate processing apparatus further includes an elevating mechanism for moving the substrate holder relative to the cup part in the up-down direction. The cup part further includes another tubular partition wall that is located between the partition wall and the outer wall part and extends upward from the bottom. The cup drain port is located on an inner side of the another partition wall in the radial direction. The bottom of the cup part has another cup drain port that is located on an outer side of the another partition wall in the radial direction. The bottom of the chamber has another chamber drain port that is located on an outer side of the first chamber drain port and the second chamber drain port in the radial direction and connected to another drainage part. The substrate is moved along with the substrate holder between a first position relative to the cup part and a second position that is above the first position by the elevating mechanism. In a state in which the substrate is located at the first position, a processing liquid supplied from the processing liquid supply part to the substrate flows into a space between the another partition wall and the partition wall of the cup part. In a state in which the substrate is located at the second position, a processing liquid supplied from the processing liquid supply part to the substrate flows into a space between the outer wall part and the another partition wall of the cup part, and the another cup drain port overlaps with the another chamber drain port to discharge the processing liquid to the another drainage part located outside the chamber.

In another preferred embodiment of the present invention, the substrate holder includes a disc-shaped holder body centered on the central axis. The holder body opposes the cup part in the up-down direction above the cup part. The holder body has a ring-shaped protruding part that protrudes downward from a lower surface of the holder body and surrounds the central axis either on the outer side of the partition wall in the radial direction or at the same position in the radial direction as the partition wall.

Another substrate processing apparatus according to the present invention includes a substrate holder for holding a substrate in a horizontal position, a processing liquid supply part for supplying a processing liquid to the substrate, a cup part having a cup exhaust port in a bottom and for receiving a processing liquid from the substrate, a chamber for internally housing the substrate holder and the cup part and having a chamber exhaust port in a bottom, a cup rotation mechanism for rotating the cup part about a central axis pointing in an up-down direction, and a controller for rotating the cup part via the cup rotation mechanism and determining a position of the cup exhaust port in a circumferential direction about the central axis. In a state in which the cup exhaust port overlaps with the chamber exhaust port, gas in the cup part is discharged through the cup exhaust port and the chamber exhaust port to an outside of the chamber by an exhaust mechanism that is connected to the chamber exhaust port. A flow rate of exhaust gas discharged from the chamber via the exhaust mechanism is changed by the controller controlling the cup rotation mechanism to change an area of overlap between the cup exhaust port and the chamber exhaust port. Thus, the flow rate of exhaust gas can be easily changed.

In a preferred embodiment of the present invention, the chamber exhaust port includes a large chamber exhaust port, and a small chamber exhaust port that is arranged along with the large chamber exhaust port in the circumferential direction and has a smaller area than the large chamber exhaust port. Changing the area of overlap between the cup exhaust port and the chamber exhaust port corresponds to causing the cup exhaust port to selectively overlap with either the large chamber exhaust port or the small chamber exhaust port.

In another preferred embodiment of the present invention, the cup exhaust port includes a large cup exhaust port, and a small cup exhaust port that is arranged along with the large cup exhaust port in the circumferential direction and has a smaller area than the large cup exhaust port. Changing the area of overlap between the cup exhaust port and the chamber exhaust port corresponds to causing either the large cup exhaust port or the small cup exhaust port to selectively overlap with the chamber exhaust port.

In another preferred embodiment of the present invention, changing the area of overlap between the cup exhaust port and the chamber exhaust port is achieved by rotating the cup part while maintaining the overlap between the cup exhaust port and the chamber exhaust port.

In another preferred embodiment of the present invention, the cup rotation mechanism includes a ring-shaped rotor that is disposed within the chamber and attached to the cup part, and a stator that is disposed around the rotor outside the chamber and for generating a torque between the rotor and the stator.

In another preferred embodiment of the present invention, the rotor is rotated in a floating state within the chamber by a magnetic force acting between the stator and the rotor.

In another preferred embodiment of the present invention, the chamber is a sealed-space forming part for forming a sealed space for disposing the substrate holder and the cup part.

These and other objects, features, aspects and advantages of the present invention will become more apparent from the following detailed description of the present invention when taken in conjunction with the accompanying drawings.

DESCRIPTION OF EMBODIMENTS

Figure 1:
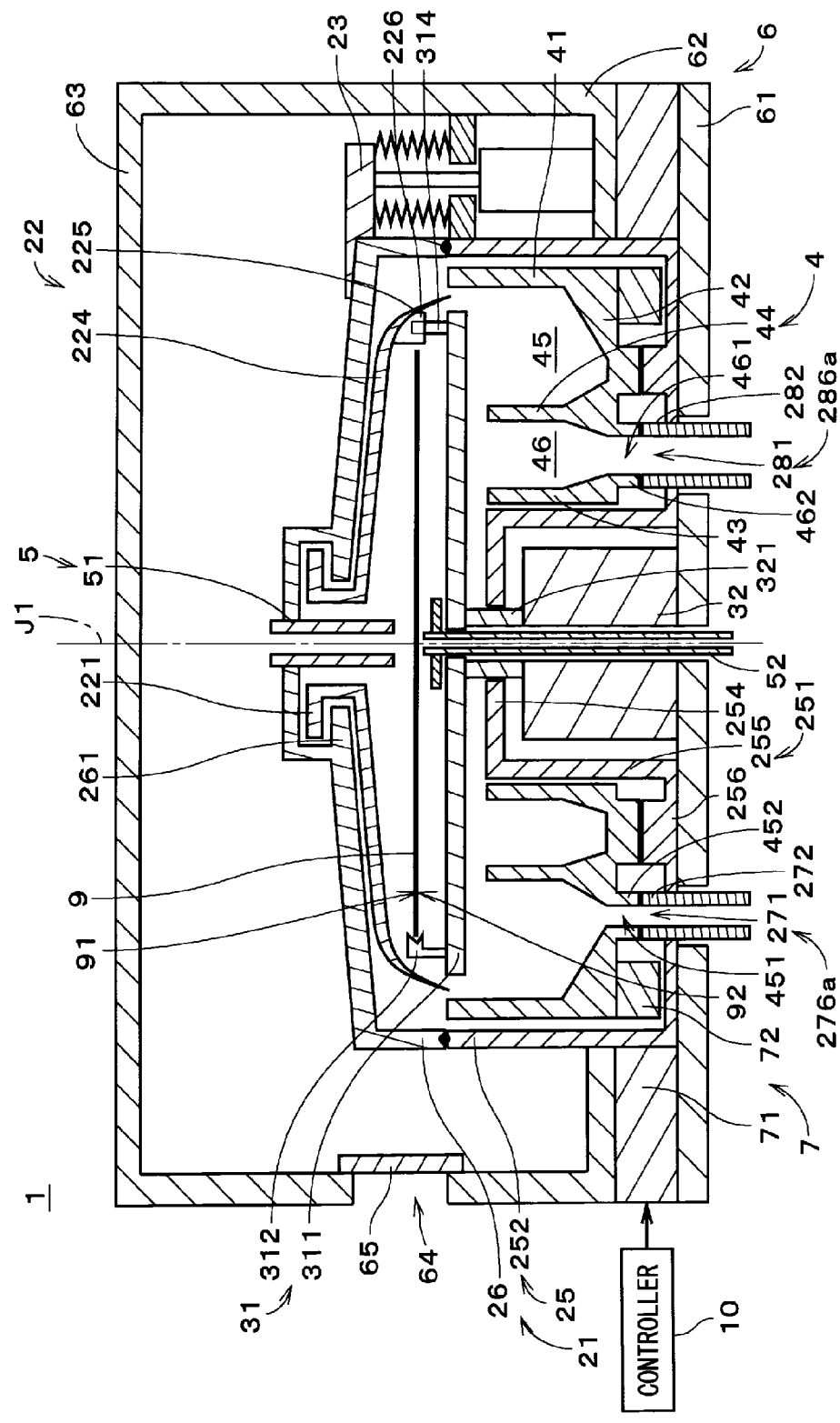
FIG. 1 is a cross-sectional view of a substrate processing apparatus according to a first embodiment.

FIG. 1 is a cross-sectional view of a substrate processing apparatus 1 according to a first embodiment of the present invention. The substrate processing apparatus 1 is a single wafer processing apparatus for processing generally disc-shaped semiconductor substrates 9 (hereinafter, simply referred to as "substrates 9") one at a time by supplying processing liquids to the substrates 9. The substrate processing apparatus 1 uses, for example, deionized water, acid chemical solutions, and alkaline chemical solutions as processing liquids and performs various types of processing such as cleaning the substrates 9. For some constituent elements of the substrate processing apparatus 1, cross-hatching of the cross-sections is omitted from FIG. 1 (the same applies to the other cross-sectional views).

The substrate processing apparatus 1 includes a chamber 21, a top plate 22, a chamber opening-and-closing mechanism 23, a substrate holder 31, a substrate rotation mechanism 32, a cup part 4, a cup rotation mechanism 7, a processing liquid supply part 5, a housing 6, and a controller 10. Illustration of the controller 10 is omitted from FIG. 2 onward.

The housing 6 internally houses the chamber 21, the top plate 22, the chamber opening-and-closing mechanism 23, the substrate holder 31, the substrate rotation mechanism 32, the cup part 4, and the processing liquid supply part 5. The housing 6 includes a housing bottom 61, a housing side wall part 62, and a housing canopy part 63. The housing bottom 61 that is the bottom of the housing 6 supports the chamber 21 and other constituent elements from the underside. The housing side wall part 62 surrounds the chamber 21 and other constituent elements. The housing canopy part 63 covers the tops of the chamber 21 and other constituent elements. The housing side wall part 62 has a carrying-in port 64 for carrying a substrate 9 into the housing 6. The carrying-in port 64 is closed by a lid part 65 that is movable in the up-down direction.

The chamber 21 includes a chamber body 25 and a chamber lid part 26. The chamber 21 has a generally cylindrical shape about a central axis J1 pointing in the up-down direction. The chamber body 25 includes a chamber lower surface part 251 and a chamber outer wall part 252. The chamber lower surface part 251 includes a lower surface central part 254, a chamber inner wall part 255, and a chamber bottom 256. The lower surface central part 254 has a generally circular ring plate-like shape about the central axis J1. The chamber inner wall part 255 has a generally cylindrical shape about the central axis J1 and extends downward from the outer edge portion of the lower surface central part 254. The chamber bottom 256 has a generally circular ring plate-like shape about the central axis J1 and extends outward in a radial direction about the central axis J1 (hereinafter, simply referred to as "radially" or "in the radial direction") from the lower end of the chamber inner wall parts 255. The chamber outer wall part 252 has a generally cylindrical shape about the central axis J1. The chamber outer wall part 252 protrudes upward from the outer edge portion of the chamber lower surface part 251. The chamber outer wall part 252 and the chamber inner wall parts 255 constitute a side wall part of the chamber 21, and the chamber bottom 256 is the bottom of the chamber 21.

The chamber lid part 26 has a generally circular ring plate-like shape perpendicular to the central axis J1. An upper opening of the chamber body 25 is blocked when the lower end of the outer edge portion of the chamber lid part 26 is in contact with the upper portion of the chamber outer wall part 252. Blocking the upper opening of the chamber body 25 with the chamber lid part 26 produces a chamber space that is a sealed space within the chamber 21. In other words, the chamber 21 is a sealed-space forming part for forming the chamber space. The substrate holder 31, the top plate 22, and the cup part 4 are housed in the chamber space that is the inside of the chamber 21.

Figure 2:
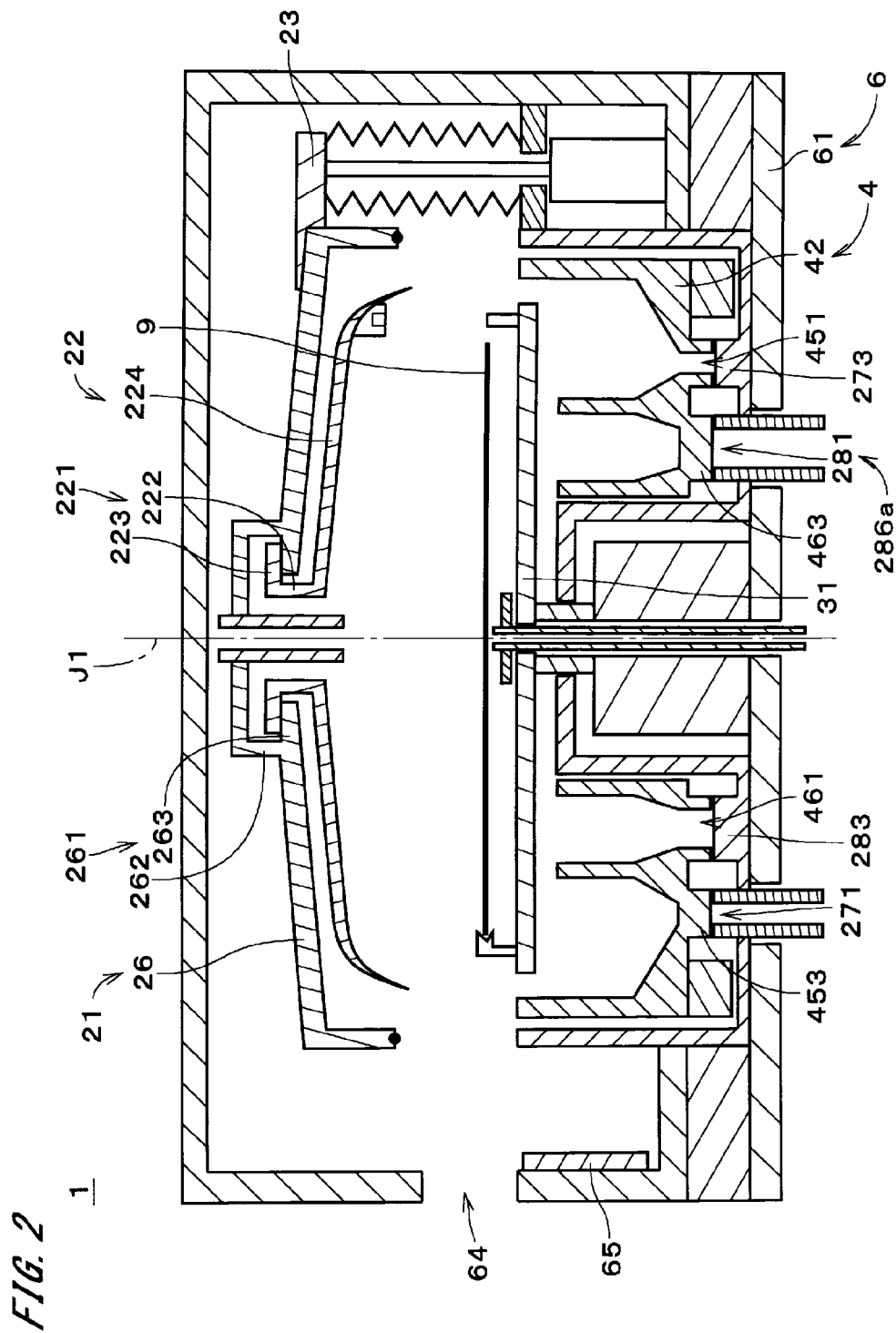
FIG. 2 is a cross-sectional view of the substrate processing apparatus.

The chamber opening-and-closing mechanism 23 moves the chamber lid part 26 relative to the chamber body 25 in the up-down direction, the chamber lid part 26 being a movable part of the chamber 21, and the chamber body 25 being the other part of the chamber 21. The chamber opening-and-closing mechanism 23 is a lid elevating mechanism for moving the chamber lid part 26 up and down. When the chamber lid part 26 is moved in the up-down direction by the chamber opening-and-closing mechanism 23, the top plate 22 moves along with the chamber lid part 26 in the up-down direction while being suspended from the chamber lid part 26. The chamber 21 is opened by the chamber opening-and-closing mechanism 23 moving the chamber lid part 26 and the top plate 22 upward from the position illustrated in FIG. 1 to the position illustrated in FIG. 2. In the following description, the positions of the chamber lid part 26 and the top plate 22 illustrated in FIG. 1 are referred to as "processing positions." The positions of the chamber lid part 26 and the top plate 22 illustrated in FIG. 2 are referred to as "retracted positions." Although the details will be described later, the relative orientation of the cup part 4 with respect to the housing 6 in FIG. 2 (i.e., the relative orientation in the circumferential direction about the central axis J1) differs from that in FIG. 1.

The top plate 22 illustrated in FIG. 1 has a generally circular ring plate-like shape about the central axis J1 and has an opening in the center. The top plate 22 includes a plate body part 224, a plate side wall part 225, and a held part 221. The plate body part 224 has a generally circular ring plate-like shape about the central axis J1. The plate body part 224 has a generally circular opening in the central portion, and the held part 221 is provided around this opening. The plate body part 224 is disposed below the chamber lid part 26 and above the substrate holder 31 and the substrate 9. The upper and lower surfaces of the plate body part 224 are inclined surfaces that are inclined downward, away in the radial direction from the central axis J1. The lower surface of the plate body part 224 opposes an upper surface 91 of the substrate 9 held by the substrate holder 31 in the up-down direction.

The plate side wall part 225 extends diagonally downward outwardly in the radial direction from the outer edge portion of the plate body part 224. In other words, the plate side wall part 225 protrudes from the outer edge portion of the plate body part 224 on the lower surface side of the plate body part 224 and extends downward away from the central axis J1 in the radial direction. The plate side wall part 225 has a generally cylindrical shape about the central axis J1. The plate side wall part 225 is disposed on the radially outer side of the substrate 9 and surrounds the substrate 9. The lower end of the plate side wall part 225 is located at approximately the same position in the up-down direction as a base part 311 (described later) of the substrate holder 31.

The plate body part 224 has a larger diameter than the substrate 9. The lower end of the plate side wall part 225 has a larger diameter than the base part 311 of the substrate holder 31. The lower end of the plate side wall part 225 is spaced outwardly in the radial direction from the outer edge of the base part 311 throughout the circumference. The top plate 22 extends radially outward of the entire outer circumference of the substrate 9 and the entire outer circumference of the base part 311 of the substrate holder 31.

As illustrated in FIG. 2, the top plate 22 located at the retracted position is supported by the chamber lid part 26 in a suspended manner. The chamber lid part 26 includes a generally ring-shaped plate holder 261 in the central portion. The plate holder 261 includes a tubular part 262 having a generally cylindrical shape about the central axis J1, and a generally disc-shaped flange part 263 centered on the central axis J1. The flange part 263 extends radially inward from the lower end of the tubular part 262.

The held part 221 is a generally ring-shaped part that protrudes upward from the central portion of the plate body part 224. The held part 221 includes a tubular part 222 having a generally cylindrical shape about the central axis J1, and a generally disc-shaped flange part 223 centered on the central axis J1. The tubular part 222 extends upward from the upper surface of the plate body part 224. The flange part 223 extends radially outward from the upper end of the tubular part 222. The tubular part 222 is located on the radially inner side of the tubular part 262 of the plate holder 261. The flange part 223 is located above the flange part 263 of the plate holder 261 and opposes the flange part 263 in the up-down direction. By bringing the lower surface of the flange part 223 of the held part 221 into contact with the upper surface of the flange part 263 of the plate holder 261, the top plate 22 is attached to the chamber lid part 26 while being suspended from the chamber lid part 26.

As illustrated in FIG. 1, the substrate holder 31 holds the substrate 9 in a horizontal position. That is, the substrate 9 is held by the substrate holder 31, with its upper surface 91 on which a fine pattern is formed facing upward perpendicularly to the central axis J1. The substrate holder 31 includes the base part 311 and a plurality of chucks 312. The base part 31 is a generally disc-shaped holder body centered on the central axis J1. The base part 311 is perpendicular to the central axis J1 and has an opening in the center. The base part 31 is located above the cup part 4 and opposes the cup part 4 in the up-down direction. The plurality of (e.g., three) chucks 312 are fixed to the upper surface of the base part 311. The chucks 312 are equiangularly disposed in a circumferential direction about the central axis J1 (hereinafter, simply referred to as the "circumferential direction"). The chucks 312 allow the outer edge portion of the substrate 9 to be held above the base part 311.

The substrate rotation mechanism 32 is disposed below the lower surface central part 254 of the chamber lower surface part 251. The substrate rotation mechanism 32 may, for example, be an axial-rotation electric motor. A rotation shaft 321 of the substrate rotation mechanism 32 extends to the inside of the chamber 21 through the lower surface central part 254 of the chamber lower surface part 251. The rotation shaft 321 has a generally cylindrical shape about the central axis J1. The base part 311 of the substrate holder 31 is fixed to the tip portion of the rotation shaft 321. A seal for preventing passage of gas and liquid is provided between the rotation shaft 321 and the lower surface central part 254 of the chamber lower surface part 251. Rotation of the rotation shaft 321 causes the substrate holder 31 to rotate along with the substrate 9 about the central axis J1.

The upper surface of the base part 311 of the substrate holder 31 has a plurality of first engagement parts 314 arranged in the circumferential direction. Each first engagement part 314 has a generally columnar shape that protrudes upward. The lower surface of the top plate 22 has a plurality of second engagement parts 226 arranged in the circumferential direction. Each second engagement part 226 has an upwardly opening recess in the lower portion.

In the state in which the top plate 22 is located at the processing position, the first engagement parts 314 fit in the recesses formed in the lower portions of the second engagement parts 226. The top plate 22 thus engages with the base part 311 of the substrate holder 31 in the circumferential direction. In other words, the first engagement parts 314 and the second engagement parts 226 restrict the relative position of the top plate 22 with respect to the substrate holder 31 in the rotational direction.

In the state in which the top plate 22 is located at the processing position, the top plate 22 is supported by the base part 311 of the substrate holder 31 via the first engagement parts 314 and the second engagement parts 226. The flange part 223 of the held part 221 of the top plate 22 is spaced above the flange part 263 of the plate holder 261 of the chamber lid part 26. That is, the held part 221 and the plate holder 261 are not in contact with each other, and the plate holder 261 releases hold of the top plate 22. Thus, the top plate 22 is rotated independently of the chamber lid part 26, along with the substrate holder 31 and the substrate 9, by the substrate rotation mechanism 32. The first engagement parts 314 and the second engagement parts 226 constitute a position fixing member that fixes the relative circumferential position of the top plate 22 with respect to the substrate holder 31 during the rotation of the top plate 22.

The processing liquid supply part 5 includes an upper nozzle 51 and a lower nozzle 52. The upper nozzle 51 is fixed to the chamber lid part 26 and disposed on the inner side of the held part 221 of the top plate 22. The upper nozzle 51 is not in contact with the top plate 22 and does not rotate during the rotation of the top plate 22. The upper nozzle 51 is connected to a processing liquid supply source (not shown) provided outside the housing 6. The lower end of the upper nozzle 51 is located above the substrate 9 and opposes the central portion of the upper surface 91 of the substrate 9. A processing liquid supplied from the processing liquid supply source to the upper nozzle 51 is supplied from the lower end of the upper nozzle 51 toward the central portion of the upper surface 91 of the substrate 9.

The lower nozzle 52 is disposed on the inner side of the rotation shaft 321 of the substrate rotation mechanism 32 and protrudes upward from the base part 311 through the opening located in the center of the base part 311 of the substrate holder 31. The lower nozzle 52 is not in contact with the rotation shaft 321 and does not rotate during the rotation of the rotation shaft 321. A seal for preventing passage of gas and liquid is provided between the lower nozzle 52 and the base part 311. The lower nozzle 52 is connected to a processing liquid supply source (not shown) provided outside the housing 6. The upper end of the lower nozzle 52 is located below the substrate 9 and opposes the central portion of the lower surface 92 of the substrate 9. A processing liquid supplied from the processing liquid supply source to the lower nozzle 52 is supplied from the upper end of the lower nozzle 52 toward the central portion of the lower surface 92 of the substrate 9.

The cup part 4 is a ring-shaped member centered on the central axis J1. The cup part 4 is disposed below the substrate holder 31 and receives processing liquids from the substrate 9. The cup part 4 is located on the radially outer side of the chamber inner wall parts 255 of the chamber lower surface part 251 and surrounds the chamber inner wall parts 255 and the substrate rotation mechanism 32.

The cup rotation mechanism 7 is a so-called hollow motor and rotates the cup part 4 about the central axis J1. The cup rotation mechanism 7 includes a ring-shaped stator 71 and a ring-shaped rotor 72 that are centered on the central axis J1. The rotor 72 includes a generally circular ring-shaped permanent magnet. The surface of the permanent magnet is molded of a PTFE resin. The rotor 72 is attached to the cup part 4 within the housing 6. More specifically, the rotor 72 is attached to the vicinity of the outer edge portion of a cup bottom 42 within the chamber 21.

The stator 71 is disposed around, i.e., on the radially outer side of, the rotor 72 outside the chamber 21. In the example illustrated in FIG. 1, the stator 71 is fixed to the housing bottom 61 around the chamber 21. The stator 71 includes a plurality of coils arrayed in the circumferential direction about the central axis J1.

Supplying current to the stator 71 generates a torque about the central axis J1 between the stator 71 and the rotor 72. This torque causes the rotor 72 to rotate in a horizontal position about the central axis J1. The magnetic force acting between the stator 71 and the rotor 72 allows the rotor 72 to float in the chamber 21 of the housing 6 without coming in contact with the chamber 21 either directly or indirectly and rotate along with the cup part 4 about the central axis J1 in a floating state. In the substrate processing apparatus 1, the cup part 4 is rotated by the cup rotation mechanism 7 under the control of the controller 10 to determine the circumferential positions of a cup drain port 451 and a cup exhaust port 461, which will be described later.

The cup part 4 includes a cup outer wall part 41, the cup bottom 42, a cup inner wall part 43, and a partition wall 44. The cup bottom 42, which is the bottom of the cup part 4, has a generally circular ring shape about the central axis J1. The cup outer wall part 41, which is the outer wall part of the cup part 4, has a generally cylindrical shape about the central axis J1. The cup outer wall part 41 extends upward generally in parallel with the central axis J1 from the outer circumferential portion of the cup bottom 42. The cup inner wall part 43, which is the inner wall part of the cup part 4, has a generally cylindrical shape about the central axis J1. The cup inner wall part 43 is located on the radially inner side of the cup outer wall part 41 and extends upward generally in parallel with the central axis J1 from the inner circumferential portion of the cup bottom 42.

The partition wall 44 has a generally cylindrical shape about the central axis J1. The partition wall 44 is located between the cup inner wall part 43 and the cup outer wall part 41 in the radial direction and extends upward generally in parallel with the central axis J1 from the cup bottom 42. In the following description, the space between the cup outer wall part 41 and the partition wall 44 of the cup part 4 is referred to as an "outer cup space 45." The space between the partition wall 44 and the cup inner wall part 43 of the cup part 4 is referred to as an "inner cup space 46." The outer cup space 45 is a generally cylindrical space surrounded by the cup outer wall part 41, the cup bottom 42, and the partition wall 44. The inner cup space 46 is a generally cylindrical space surrounded by the partition wall 44, the cup bottom 42, and the cup inner wall part 43.

The inner cup space 46 is located below the base part 311 of the substrate holder 31. A portion of the cup bottom 42 that forms the bottom of the inner cup space 46 has the cup exhaust port 461. In other words, the cup exhaust port 461 is located on the radially inner side of the lower end of the partition wall 44. In the state illustrated in FIG. 1, the cup exhaust port 461 overlaps in the up-down direction with the chamber exhaust port 281 provided in the chamber bottom 256 of the chamber lower surface part 251. The lower end of the cup exhaust port 461 is in close proximity to and opposes the upper end of the chamber exhaust port 281 in the up-down direction. The gas in the chamber 21 is exhausted to the outside of the chamber 21 and the housing 6 through the inner cup space 46, the cup exhaust port 461, and the chamber exhaust port 281. The size and shape of the lower end of the cup exhaust port 461 are approximately the same as the size and shape of the upper end of the chamber exhaust port 281. In other words, the area of the lower end of the cup exhaust port 461 is approximately equal to the area of the upper end of the chamber exhaust port 281. Note that the lower end of the cup exhaust port 461 may, for example, have a smaller area than the upper end of the chamber exhaust port 281.

In the example illustrated in FIG. 1, a portion of the cup bottom 42 that is on the radially inner side of the lower end of the partition wall 44 has a generally cylindrical bottom protruding part 462 that protrudes downward, and the cup exhaust port 461 is provided in the bottom protruding part 462. Also, the chamber bottom 256 of the chamber lower surface part 251 has a generally cylindrical bottom protruding part 282 that protrudes upward, and the chamber exhaust port 281 is provided in the bottom protruding part 282. The chamber exhaust port 281 protrudes to the outside of the chamber space through the housing bottom 61.

The outer cup space 45 is located on the radially outer side of the inner cup space 46 and below the base part 311 of the substrate holder 31. The cup outer wall part 41 of the cup part 4 is located on the radially outer side of the substrate 9, the substrate holder 31, and the top plate 22 throughout the circumference. The upper end of the cup outer wall part 41 is located at approximately the same position in the up-down direction as the base part 311 of the substrate holder 31 and the lower end of the plate side wall part 225 of the top plate 22. To be more specific, the upper end of the cup outer wall part 41 is located above the lower end of the plate side wall part 225. That is, the upper end portion of the cup outer wall part 41 and the lower end portion of the plate side wall part 225 overlap with each other in the radial direction. The upper end of the cup part 4 has a larger diameter than the lower end of the plate side wall part 225. The upper end of the cup part 4 is spaced on the radially outer side from the lower end of the plate side wall part 225 throughout the circumference.

The processing liquid supplied from the processing liquid supply part 5 and dispersed from the rotating substrate 9 is received by the plate side wall part 225 located around the substrate 9 and flows down on the inner circumferential surface of the plate side wall part 225. The processing liquid dropping from the plate side wall part 225 then flows into the outer cup space 45 of the cup part 4. That is, the processing liquid from the processing liquid supply part 5 flows into the outer cup space 45 of the cup part 4.

A portion of the cup bottom 42 that forms the bottom of the outer cup space 45 has the cup drain port 451. In other words, the cup drain port 451 is located on the radially outer side of the lower end of the partition wall 44. In the state illustrated in FIG. 1, the cup drain port 451 overlaps in the up-down direction with a chamber drain port 271 provided in the chamber bottom 256 of the chamber lower surface part 251. The lower end of the cup drain port 451 is in close proximity to and opposes the upper end of the chamber drain port 271 in the up-down direction. Then, the liquid flowing in the outer cup space 45 is discharged to the outside of the chamber 21 and the housing 6 through the cup drain port 451 and the chamber drain port 271. The size and shape of the lower end of the cup drain port 451 are approximately the same as the size and shape of the upper end of the chamber drain port 271. In other words, the area of the lower end of the cup drain port 451 is approximately equal to the area of the upper end of the chamber drain port 271. Note that the lower end of the cup drain port 451 may, for example, have a smaller area than the upper end of the chamber drain port 271.

In the example illustrated in FIG. 1, a portion of the cup bottom 42 that is on the radially outer side of the lower end of the partition wall 44 has a generally cylindrical bottom protruding part 452 that protrudes downward, and the cup drain port 451 is provided in the bottom protruding part 452. Also, the chamber bottom 256 of the chamber lower surface part 251 has a generally cylindrical bottom protruding part 272 that protrudes upward, and the chamber drain port 271 is provided in the bottom protruding part 272. The chamber drain port 271 protrudes to the outside of the chamber space through the housing bottom 61.

Figure 3:
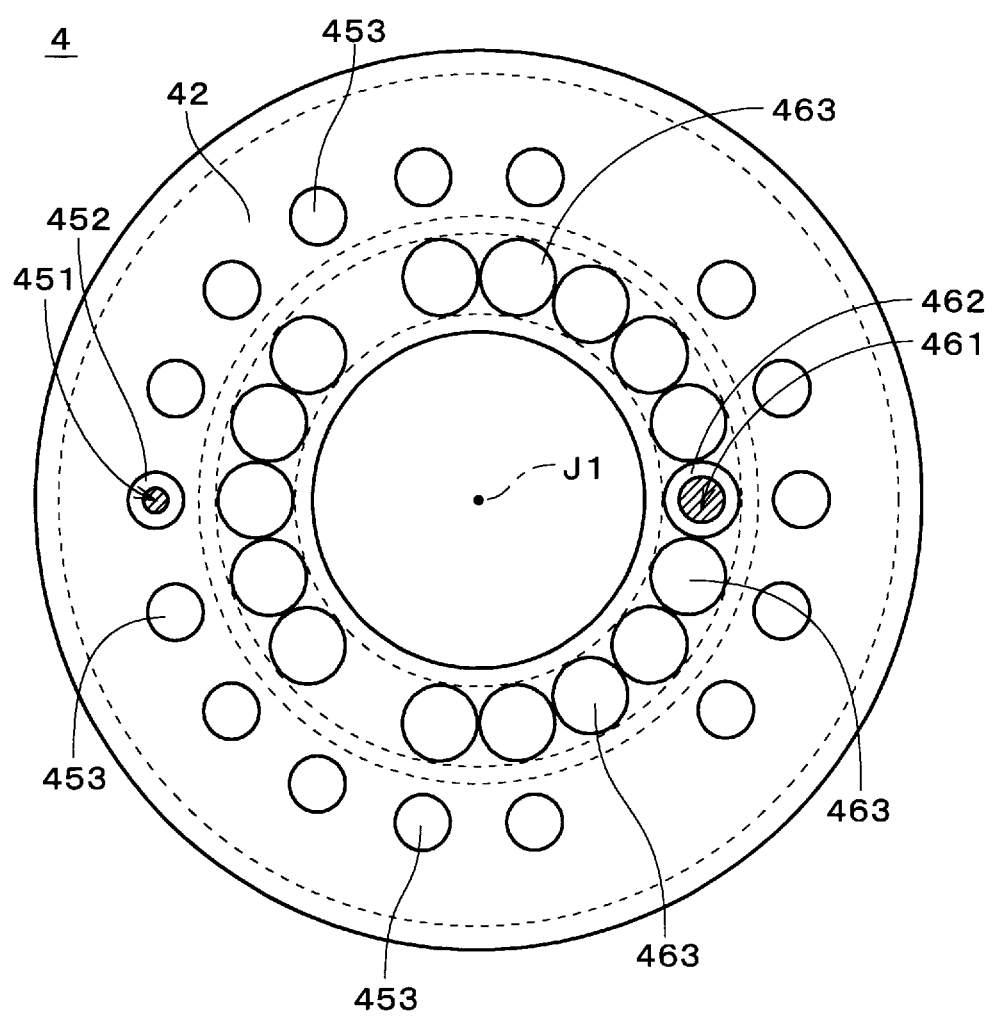
FIG. 3 is a bottom view of a cup part.

FIG. 3 is a bottom view of the cup part 4. The cup part 4 has one cup drain port 451 and one cup exhaust port 461 in the cup bottom 42. In order to facilitate comprehension of the drawing, the cup drain port 451 and the cup exhaust port 461 are cross-hatched in FIG. 3 (the same applies to FIGS. 12, 15, and 19). In the example illustrated in FIG. 3, the cup drain port 451 is located on the opposite side of the cup exhaust port 461, with the central axis J1 located therebetween. In other words, the cup drain port 451 and the cup exhaust port 461 are arranged approximately 180 degrees apart in the circumferential direction. The cup drain port 451 is located on the radially outer side of the cup exhaust port 461.

The cup bottom 42 has a plurality of outer projections 453 that protrude downward, and a plurality of inner projections 463 that protrude downward. The outer projections 453 are arranged in the circumferential direction, along with the bottom protruding part 452 having the cup drain port 451 therein (i.e., the outer projections 453 and the bottom protruding part 452 are arranged on the same circumference distanced radially from the central axis J1). The inner projections 463 are arranged in the circumferential direction, along with the bottom protruding part 462 having the cup exhaust port 461 therein. In the example illustrated in FIG. 3, fifteen outer projections 453 and fifteen inner projections 463 are provided on the cup part 4.

Each outer projection 453 has a generally columnar shape, and the diameter of each outer projection 453 is approximately equal to the outer diameter of the bottom protruding part 452 having the cup drain port 451 therein. Each inner projection 463 has a generally columnar shape, and the diameter of each inner projection 463 is approximately equal to the outer diameter of the bottom protruding part 462 having the cup exhaust port 461 therein. The amounts of protrusion of each outer projection 453, each inner projection 463, the bottom protruding part 452, and the bottom protruding part 462 from the cup bottom 42 (i.e., the heights thereof in the up-down direction) are approximately equal. Each outer projection 453 and each inner projection 463 have no internal passages, and the space within the cup part 4 and the space below the cup part 4 are not in communication with each other through the outer projections 453 and the inner projections 463.

Figure 4:
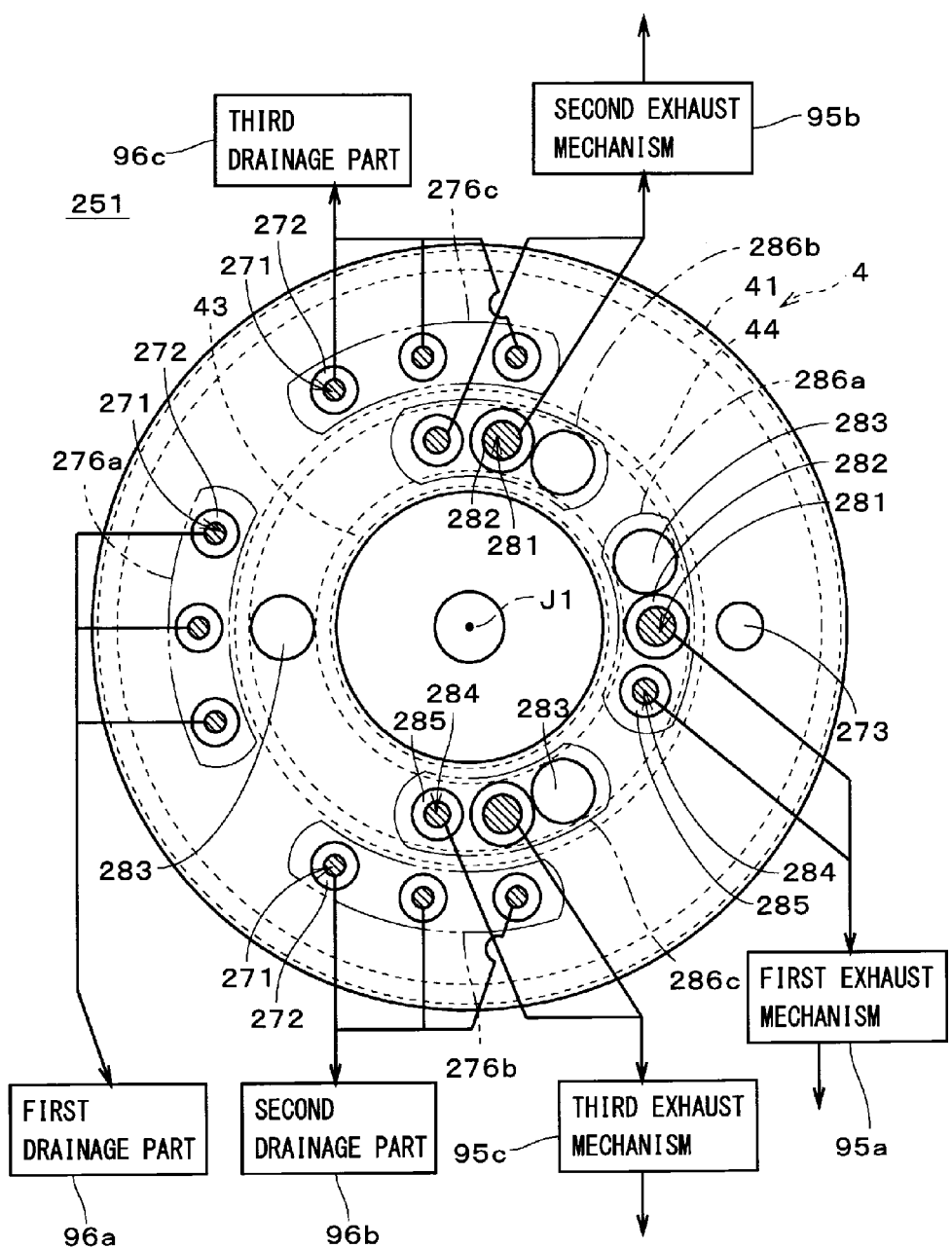
FIG. 4 is a plan view of a chamber lower surface part.

FIG. 4 is a plan view of the chamber lower surface part 251. In FIG. 4, the cup outer wall part 41, the partition wall 44, and the cup inner wall part 43 of the cup part 4 are also shown by broken lines. In the chamber 21, a plurality of chamber drain ports 271 and a plurality of chamber exhaust ports 281 and 284 are provided in the chamber bottom 256 of the chamber lower surface part 251. In order to facilitate comprehension of the drawing, the chamber drain ports 271 and the chamber exhaust ports 281 and 284 are cross-hatched in FIG. 4 (the same applies to FIGS. 13, 16, and 20).

The chamber drain ports 271 are provided in corresponding ones of a plurality of bottom protruding parts 272 provided on the chamber bottom 256 of the chamber lower surface part 251. The chamber drain ports 271 are arranged in the circumferential direction. The chamber drain ports 271 have similar sizes and structures, and the bottom protruding parts 272 also have similar sizes and structures.

The chamber drain ports 271 include a plurality of chamber drain port groups. In the example illustrated in FIG. 4, the chamber bottom 256 of the chamber lower surface part 251 has nine chamber drain ports 271, and the nine chamber drain ports 271 include a first chamber drain port group 276a, a second chamber drain port group 276b, and a third chamber drain port group 276c. In the following description, the first chamber drain port group 276a, the second chamber drain port group 276b, and the third chamber drain port group 276c are also collectively referred to as "chamber drain port groups 276a to 276c." In FIG. 4, the chamber drain port groups 276a to 276c are each enclosed in a dashed double-dotted line (the same applies to FIG. 26).

The chamber drain port groups 276a to 276c each include three chamber drain ports 271. In each of the chamber drain port groups 276a to 276c, the three chamber drain ports 271 are equiangularly arranged in the circumferential direction. The three chamber drain ports 271 in the first chamber drain port group 276a are connected to a first drainage part 96a outside the substrate processing apparatus 1. The three chamber drain ports 271 in the second chamber drain port group 276b are connected to a second drainage part 96b outside the substrate processing apparatus 1. The three chamber drain ports 271 in the third chamber drain port group 276c are connected to a third drainage part 96c outside the substrate processing apparatus 1. The first drainage part 96a, the second drainage part 96b, and the third drainage part 96c are provided independently of one another.

The chamber bottom 256 of the chamber lower surface part 251 has one outer projection 273 that protrudes upward. The outer projection 273 is arranged in the circumferential direction, along with the bottom protruding parts 272 having the chamber drain ports 271 therein. The outer projection 273 has a generally columnar shape, and the diameter of the outer projection 273 is approximately equal to the outer diameter of each bottom protruding part 272. The outer projection 273 has no internal passage.

The chamber exhaust ports 281 are provided in corresponding ones of a plurality of bottom protruding parts 282 provided on the chamber bottom 256 of the chamber lower surface part 251. The chamber exhaust ports 284 are provided in corresponding ones of a plurality of bottom protruding parts 285 that are provided on the chamber bottom 256 of the chamber lower surface part 251 and protrude upward. Each chamber exhaust port 284 is adjacent in the circumferential direction to a chamber exhaust port 281. In order to facilitate distinction between the chamber exhaust ports 281 and 284, the chamber exhaust ports 281 and 284 are respectively referred to as "large chamber exhaust ports 281" and "small chamber exhaust ports 284" in the following description. The large chamber exhaust ports 281 and the small chamber exhaust ports 284 are also collectively referred to simply as "chamber exhaust ports."

The small chamber exhaust ports 284 have a smaller diameter than the large chamber exhaust ports 281. In other words, the area of the upper ends of the small chamber exhaust ports 284 is smaller than the area of the upper ends of the large chamber exhaust ports 281. The outer diameter of the bottom protruding parts 285 having the small chamber exhaust ports 284 therein is smaller than the outer diameter of the bottom protruding parts 282 having the large chamber exhaust ports 281 therein. The small chamber exhaust ports 284 are arranged along with the large chamber exhaust ports 281 in the circumferential direction. The large chamber exhaust ports 281 have similar sizes and structures, and the bottom protruding parts 282 also have similar sizes and structures. The small chamber exhaust ports 284 have similar sizes and structures, and the bottom protruding parts 285 also have similar sizes and structures.

The chamber bottom 256 of the chamber lower surface part 251 has a plurality of inner projections 283 that protrude upward. The inner projections 283 are arranged along with the bottom protruding parts 282 and the bottom protruding parts 285 in the circumferential direction. Each inner projection 283 has a generally columnar shape, and the diameter of the inner projections 283 is approximately equal to the outer diameter of the bottom protruding parts 282 having the large chamber exhaust ports 281 therein. Each inner projection 283 has no internal passage.

In the example illustrated in FIG. 4, three large chamber exhaust ports 281, three small chamber exhaust ports 284, and four inner projections 283 are provided in or on the chamber bottom 256 of the chamber lower surface part 251. A first chamber exhaust port group 286a that is located on the opposite side of the aforementioned first chamber drain port group 276a, with the central axis J1 located therebetween, includes one large chamber exhaust port 281, one small chamber exhaust port 284, and one inner projection 283.

Like the first chamber exhaust port group 286a, a second chamber exhaust port group 286b that is located on the opposite side of the second chamber drain port group 276b, with the central axis J1 located therebetween, also includes one large chamber exhaust port 281, one small chamber exhaust port 284, and one inner projection 283. Like the first chamber exhaust port group 286a, a third chamber exhaust port group 286c that is located on the opposite side of the third chamber drain port group 276c, with the central axis J1 located therebetween, also includes one large chamber exhaust port 281, one small chamber exhaust port 284, and one inner projection 283.

In the following description, the first chamber exhaust port group 286a, the second chamber exhaust port group 286b, and the third chamber exhaust port group 286c are also collectively referred to as "chamber exhaust port groups 286a to 286c." In FIG. 4, the chamber exhaust port groups 286a to 286c are each enclosed in a dashed double-dotted line. In each of the chamber exhaust port groups 286a to 286c, the large chamber exhaust port 281, the small chamber exhaust port 284, and the inner projection 283 are equiangularly arranged in the circumferential direction. Among the four inner projections 283, one inner projection 283 is not included in any of the chamber exhaust port groups 286a to 286c and is located on the opposite side of the outer projection 273, with the central axis J1 located therebetween.

The large chamber exhaust port 281 and the small chamber exhaust port 284 in the first chamber exhaust port group 286a are connected to a first exhaust mechanism 95a. The large chamber exhaust port 281 and the small chamber exhaust port 284 in the second chamber exhaust port group 286b are connected to a second exhaust mechanism 95b. The large chamber exhaust port 281 and the small chamber exhaust port 284 in the third chamber exhaust port group 286c are connected to a third exhaust mechanism 95c. The first exhaust mechanism 95a, the second exhaust mechanism 95b, and the third exhaust mechanism 95c are disposed outside the substrate processing apparatus 1. The first exhaust mechanism 95a, the second exhaust mechanism 95b, and the third exhaust mechanism 95c continue the suction of gas during use of the substrate processing apparatus 1. In the following description, the first exhaust mechanism 95a, the second exhaust mechanism 95b, and the third exhaust mechanism 95c are also collectively referred to as "exhaust mechanisms 95a to 95c."

In the substrate processing apparatus 1, the controller 10 controls the cup rotation mechanism 7 such that the cup exhaust port 461 is caused to selectively overlap with one of the large chamber exhaust ports 281 and the small chamber exhaust ports 284. Also, the cup drain port 451 is caused to selectively overlap with one of the chamber drain ports 271.

Figure 5:
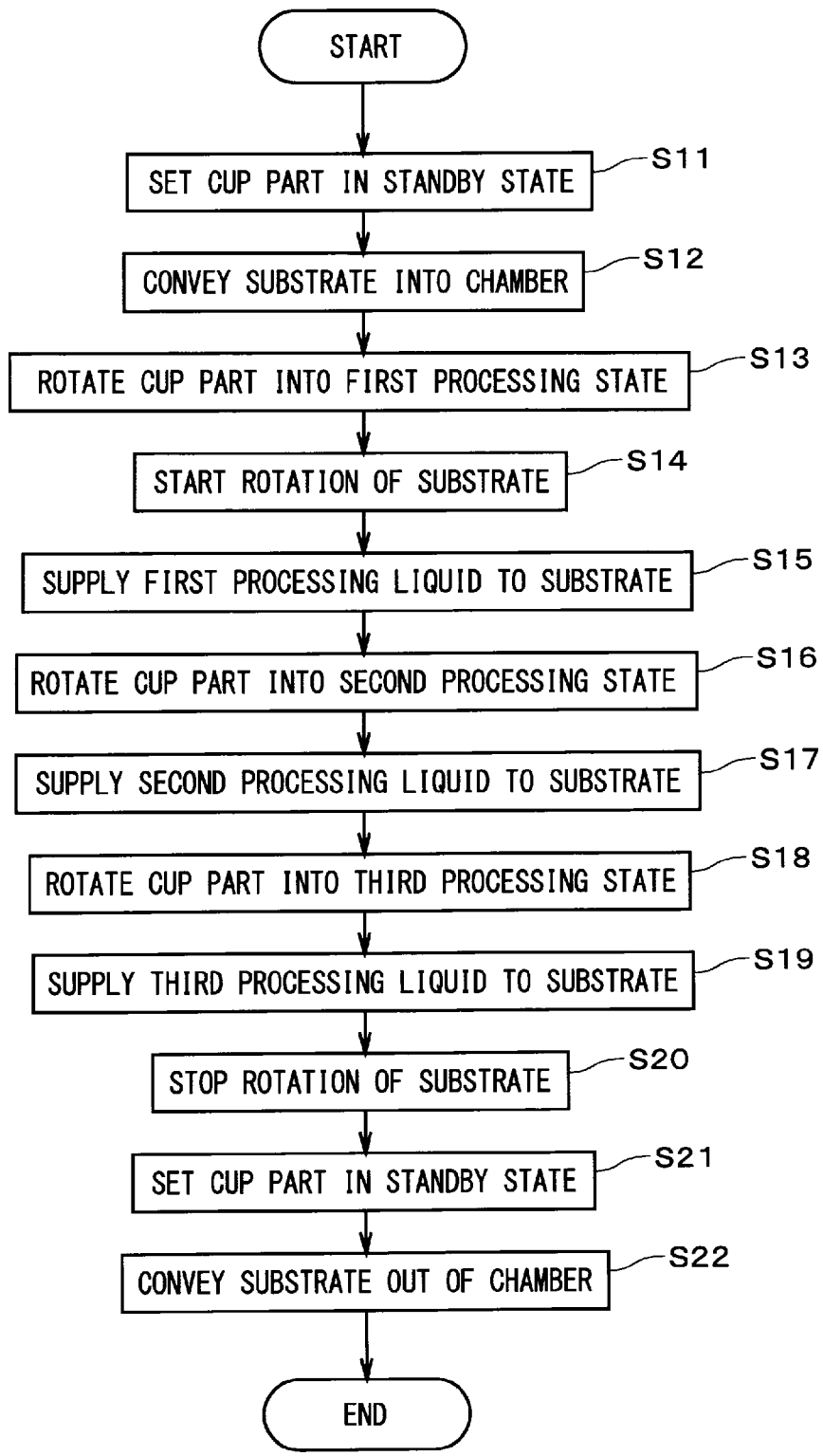
FIG. 5 is a flow chart of processing that is performed on a substrate.

FIG. 5 illustrates an example flow chart of processing performed on the substrate 9 by the substrate processing apparatus 1. When the substrate 9 is processed in the substrate processing apparatus 1, the controller 10 controls the cup rotation mechanism 7 such that the cup part 4 rotates and stops to face the orientation illustrated in FIG. 2 (step S11). In the following description, the orientation of the cup part 4 (i.e., the state of the cup part 4) illustrated in FIG. 2 is referred to as a "standby state."

In the standby state illustrated in FIG. 2, the cup exhaust port 461 overlaps in the up-down direction with one inner projection 283 that is not included in any of the chamber exhaust port groups 286a to 286 c (see FIG. 4), among the four inner projections 283 of the chamber bottom 256. That is, FIG. 2 illustrates a state in which the cup exhaust port 461 is located at a position spaced in the circumferential position from all of the large chamber exhaust ports 281 and all of the small chamber exhaust ports 284 (see FIG. 4). The lower end of the cup exhaust port 461 and the upper end surface of the inner projection 283 of the chamber bottom 256 are in close proximity to and oppose each other in the up-down direction. Thus, the cup exhaust port 461 is substantially blocked.

Here, the cup drain port 451 overlaps in the up-down direction with the outer projection 273 of the chamber bottom 256. The lower end of the cup drain port 451 and the upper end surface of the outer projection 273 are in close proximity to and oppose each other in the up-down direction. Thus, the cup drain port 451 is substantially blocked.

In the standby state illustrated in FIG. 2, the large chamber exhaust port 281 in the first chamber exhaust port group 286a overlaps in the up-down direction with an inner projection 463 of the cup bottom 42. The upper end of the large chamber exhaust port 281 and the lower end surface of the inner projection 463 are in close proximity to and oppose each other in the up-down direction. Thus, the large chamber exhaust port 281 is substantially blocked.

The small chamber exhaust port 284 in the first chamber exhaust port group 286a illustrated in FIG. 4 also overlaps in the up-down direction with an inner projection 463 of the cup bottom 42. The upper end of the small chamber exhaust port 284 and the lower end surface of the inner projection 463 are in close proximity to and oppose each other in the up-down direction. Thus, the small chamber exhaust port 284 is substantially blocked. Similarly, the large chamber exhaust ports 281 and the small chamber exhaust ports 284 in the second chamber exhaust port group 286b and the third chamber exhaust port group 286c are also in close proximity to and oppose inner projections 463 in the up-down direction and are thus substantially blocked.

Each chamber drain port 271 overlaps in the up-down direction with an outer projection 453 of the cup bottom 42. The upper end of the chamber drain port 271 and the lower end surface of the outer projection 453 are in close proximity to and oppose each other in the up-down direction. Thus, each chamber drain port 271 is substantially blocked.

When the cup part 4 enters the standby state, the chamber lid part 26 and the top plate 22 move to the retracted positions illustrated in FIG. 2, and the carrying-in port 64 is opened. Then, a substrate 9 is conveyed into the chamber 21 in the housing 6 through the carrying-in port 64 and held by the substrate holder 31 (step S12).

As described above, when the cup part 4 is in the standby state in the substrate processing apparatus 1, the lower end of the cup exhaust port 461 is in close proximity to the chamber bottom 256, and the upper end of each large chamber exhaust port 281 and the upper end of each small chamber exhaust port 284 are in close proximity to the cup bottom 42. This substantially stops the suction of the gas in the cup part 4 through the cup exhaust port 461 even if the first exhaust mechanism 95a, the second exhaust mechanism 95b, and the third exhaust mechanism 95c (see FIG. 4) continue the suction of gas. As a result, the entry of the gas outside the housing 6 from the open carrying-in port 64 into the housing 6 and the chamber 21 can be suppressed at the time of conveying the substrate 9 into the chamber.

In the substrate processing apparatus 1, the upper end of each large chamber exhaust port 281 and the upper end of each small chamber exhaust port 284 do not necessarily need to be in close proximity to the cup bottom 42 as long as the lower end of the cup exhaust port 461 is in close proximity to the chamber bottom 256. Also, the lower end of the cup exhaust port 461 does not necessarily need to be in close proximity to the chamber bottom 256 as long as the upper end of each large chamber exhaust port 281 and the upper end of each small chamber exhaust port 284 are in close proximity to the cup bottom 42. In the substrate processing apparatus 1, the suction of the gas in the cup part 4 through the cup exhaust port 461 is stopped either when the lower end of the cup exhaust port 461 is in close proximity to the chamber bottom 256 or when the upper end of each large chamber exhaust port 281 and the upper end of each small chamber exhaust port 284 are in close proximity to the cup bottom 42. As a result, the entry of the gas outside the housing 6 from the open carrying-in port 64 into the housing 6 and the chamber 21 can be suppressed, similarly to the aforementioned example.

When the substrate 9 is held, the lid part 65 is moved upward to block the carrying-in port 64 as illustrated in FIG. 1. Also, the chamber lid part 26 and the top plate 22 are moved downward and located at the processing positions illustrated in FIG. 1. This forms a chamber space within the chamber 21. The plate holder 261 releases hold of the top plate 22. The chamber space receives supply of an inert gas such as nitrogen from, for example, the upper nozzle 51.

Then, the controller 10 controls the cup rotation mechanism 7 such that the cup part 4 rotates from the standby state and stops to face the orientation illustrated in FIG. 1 (step S13). In the following description, the orientation of the cup part 4 (i.e., the state of the cup part 4) illustrated in FIG. 1 is referred to as a "first processing state."

In the first processing state illustrated in FIG. 1, the cup exhaust port 461 overlaps in the up-down direction with the large chamber exhaust port 281 in the first chamber exhaust port group 286a, as described above. The lower end of the cup exhaust port 461 and the upper end of this large chamber exhaust port 281 are in close proximity to and oppose each other in the up-down direction. Thus, the cup exhaust port 461 and the large chamber exhaust port 281 in the first chamber exhaust port group 286a are substantially connected to each other. Then, the gas in the cup part 4 is discharged through the cup exhaust port 461 and the large chamber exhaust port 281 to the outside of the chamber 21 and the housing 6 by the first exhaust mechanism 95a (see FIG. 4). The gas in the chamber 21 outside the cup part 4 is also discharged through the inner cup space 46, the cup exhaust port 461, and the large chamber exhaust port 281 to the outside of the chamber 21 and the housing 6.

When the cup part 4 is in the first processing state, the small chamber exhaust port 284 in the first chamber exhaust port group 286a and the large chamber exhaust ports 281 and the small chamber exhaust ports 284 in the second chamber exhaust port group 286b and the third chamber exhaust port group 286c illustrated in FIG. 4 overlap in the up-down direction with inner projections 463 (see FIG. 3) of the cup bottom 42 and are thus substantially blocked.

As illustrated in FIG. 1, the cup drain port 451 overlaps in the up-down direction with the central chamber drain port 271 in the first chamber drain port group 276a. The lower end of the cup drain port 451 and the upper end of this chamber drain port 271 are in close proximity to and oppose each other in the up-down direction. Thus, the cup drain port 451 and the chamber drain port 271 in the first chamber drain port group 276a are substantially connected to each other. The chamber drain ports 271 (see FIG. 4) other than this chamber drain port 271 overlap in the up-down direction with outer projections 453 of the cup bottom 42 and are thus substantially blocked.

When the cup part 4 enters the first processing state, the substrate rotation mechanism 32 is driven to start the rotation of the substrate 9, the substrate holder 31, and the top plate 22 (step S14). The substrate 9, the substrate holder 31, and the top plate 22 are rotated at the same rotational speed in the same rotational direction. Step S14 may be performed in parallel with step S13, or may be performed between steps S12 and S13.

Then, the supply of a first processing liquid from the upper nozzle 51 of the processing liquid supply part 5 to the upper surface 91 of the rotating substrate 9 is started (step S15). The first processing liquid that is continuously supplied to the central portion of the upper surface 91 of the substrate 9 is caused to flow radially outward by centrifugal force. The first processing liquid spreads over the upper surface 91 of the substrate 9 and covers the entire upper surface 91. Thus, processing using the first processing liquid is performed on the upper surface 91 of the substrate 9. Since the upper surface 91 of the substrate 9 is in close proximity to the lower surface of the top plate 22 located at the processing position, the processing using the first processing liquid is performed on the substrate 9 in a relatively narrow space between the upper surface 91 of the substrate 9 and the lower surface of the top plate 22. This makes it possible to suppress diffusion of a processing liquid atmosphere in the space above the substrate 9 and also suppress a drop in the temperature of the substrate 9 being processed.

The first processing liquid reaching the outer peripheral edge of the substrate 9 disperses radially outward from this outer peripheral edge and flows into the outer cup space 45 of the cup part 4. The first processing liquid flowing into the outer cup space 45 is discharged through the cup drain port 451 and the chamber drain port 271 to the first drainage part 96a (see FIG. 4) outside the chamber 21 and the housing 6. The first processing liquid discharged to the first drainage part 96a is discarded. Alternatively, the first processing liquid discharged to the first drainage part 96a may be recovered and reused as necessary.

During the processing of the substrate 9 using the first processing liquid, the gas in the chamber 21 is, as described above, discharged through the inner cup space 46, the cup exhaust port 461, and the large chamber exhaust port 281 to the outside of the chamber 21 and the housing 6 by the first exhaust mechanism 95a.

When a predetermined period of time has elapsed since the supply of the first processing liquid from the upper nozzle 51 was started, the supply of the first processing liquid is stopped, and the processing of the substrate 9 using the first processing liquid ends. The first processing liquid remaining on the substrate 9 is removed from the surface of the substrate 9 by the rotation of the substrate 9 and discharged through the outer cup space 45, the cup drain port 451, and the chamber drain port 271 to the first drainage part 96a.

Figure 6:
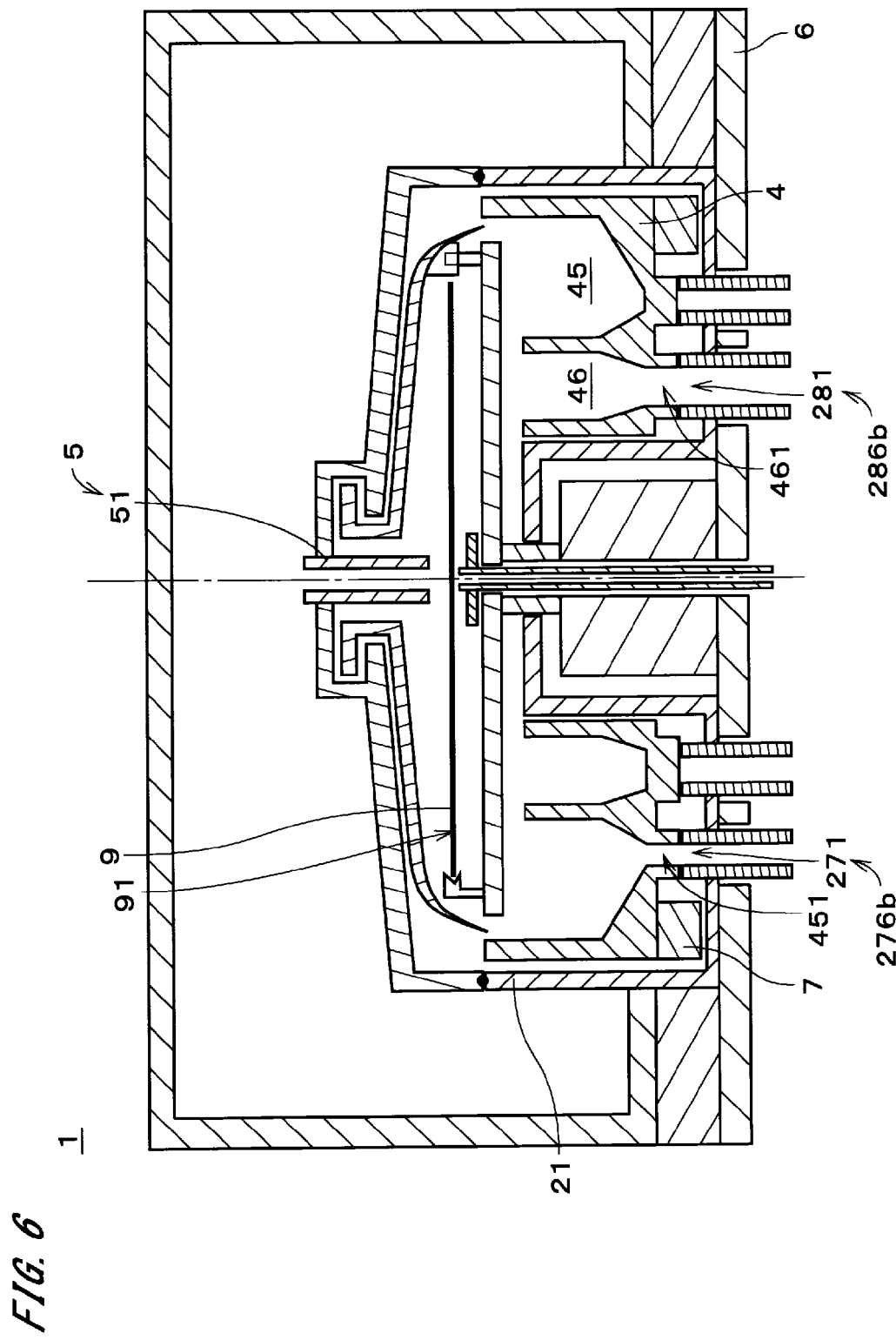
FIG. 6 is a cross-sectional view of the substrate processing apparatus.

When the processing using the first processing liquid ends, the controller 10 controls the cup rotation mechanism 7 such that the cup part 4 rotates from the first processing state and stops to face the orientation illustrated in FIG. 6 (step S16). In the following description, the orientation of the cup part 4 (i.e., the state of the cup part 4) illustrated in FIG. 6 is referred to as a "second processing state."

In the second processing state illustrated in FIG. 6, the cup exhaust port 461 overlaps in the up-down direction with the large chamber exhaust port 281 in the second chamber exhaust port group 286b. The lower end of the cup exhaust port 461 and the upper end of this large chamber exhaust port 281 are in close proximity to and oppose each other in the up-down direction. Thus, the cup exhaust port 461 and the large chamber exhaust port 281 in the second chamber exhaust port group 286b are substantially connected to each other. Then, the gas in the cup part 4 is discharged through the cup exhaust port 461 and the large chamber exhaust port 281 to the outside of the chamber 21 and the housing 6 by the second exhaust mechanism 95b (see FIG. 4). The gas outside the cup part 4 is also discharged through the inner cup space 46, the cup exhaust port 461, and the large chamber exhaust port 281 to the outside of the chamber 21 and the housing 6.

When the cup part 4 is in the second processing state, the small chamber exhaust port 284 in the second chamber exhaust port group 286b and the large chamber exhaust ports 281 and the small chamber exhaust ports 284 in the first chamber exhaust port group 286a and the third chamber exhaust port group 286c illustrated in FIG. 4 overlap in the up-down direction with inner projections 463 (see FIG. 3) of the cup bottom 42 and are thus substantially blocked.

The cup drain port 451 overlaps in the up-down direction with the central chamber drain port 271 in the second chamber drain port group 276b. The lower end of the cup drain port 451 and the upper end of this chamber drain port 271 are in close proximity to and oppose each other in the up-down direction. Thus, the cup drain port 451 and this chamber drain port 271 in the second chamber drain port group 276b are substantially connected to each other. The chamber drain ports 271 (see FIG. 4) other than this chamber drain port 271 overlap in the up-down direction with outer projections 453 of the cup bottom 42 and are thus substantially blocked.

When the cup part 4 enters the second processing state, the supply of a second processing liquid from the upper nozzle 51 of the processing liquid supply part 5 to the upper surface 91 of the rotating substrate 9 is started (step S17). The second processing liquid that is continuously supplied to the central portion of the upper surface 91 of the substrate 9 is spread over the upper surface 91 of the substrate 9 by centrifugal force and covers the entire upper surface 91. Thus, processing using the second processing liquid is performed on the upper surface 91 of the substrate 9.

The second processing liquid reaching the outer peripheral edge of the substrate 9 disperses radially outward from this outer peripheral edge and flows into the outer cup space 45 of the cup part 4. The second processing liquid flowing into the outer cup space 45 is discharged through the cup drain port 451 and the chamber drain port 271 to the second drainage part 96b (see FIG. 4) outside the chamber 21 and the housing 6. The second processing liquid discharged to the second drainage part 96a is discarded. Alternatively, the second processing liquid discharged to the second drainage part 96b may be recovered and reused as necessary.

During the processing of the substrate 9 using the second processing liquid, the gas in the chamber 21 is, as described above, discharged through the inner cup space 46, the cup exhaust port 461, and the large chamber exhaust port 281 to the outside of the chamber 21 and the housing 6 by the second exhaust mechanism 95b.

When a predetermined period of time has elapsed since the supply of the second processing liquid from the upper nozzle 51 was started, the supply of the second processing liquid is stopped, and the processing of the substrate 9 using the second processing liquid ends. The second processing liquid remaining on the substrate 9 is removed from the surface of the substrate 9 by the rotation of the substrate 9 and discharged to the second drainage part 96b through the outer cup space 45, the cup drain port 451, and the chamber drain port 271.

Figure 7:
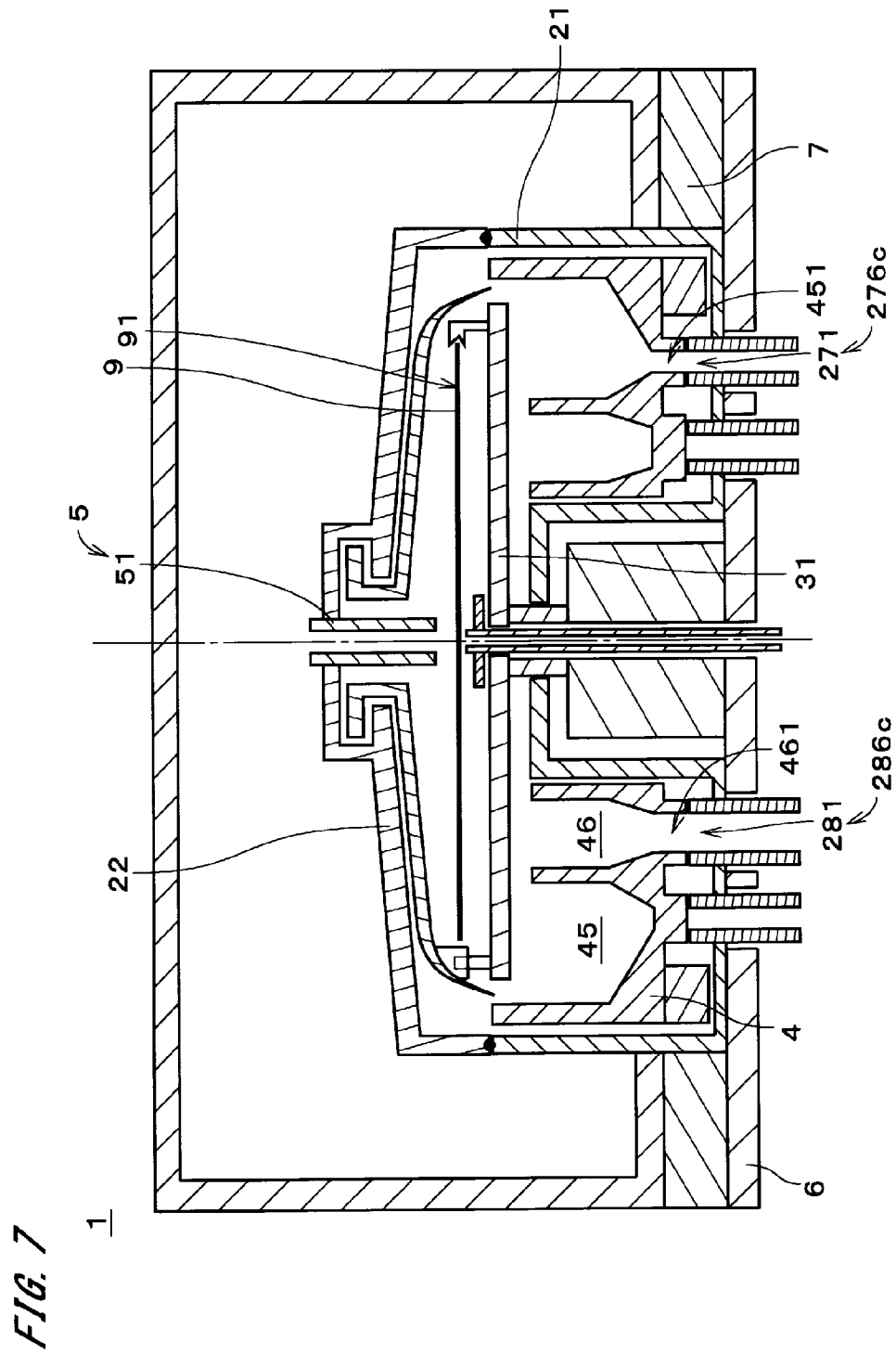
FIG. 7 is a cross-sectional view of the substrate processing apparatus.

When the processing using the second processing liquid ends, the controller 10 controls the cup rotation mechanism 7 such that the cup part 4 rotates from the second processing state and stops to face the orientation illustrated in FIG. 7 (step S18). In the following description, the orientation of the cup part 4 (i.e., the state of the cup part 4) illustrated in FIG. 7 is referred to as a "third processing state."

In the third processing state illustrated in FIG. 7, the cup exhaust port 461 overlaps in the up-down direction with the large chamber exhaust port 281 in the third chamber exhaust port group 286c. The lower end of the cup exhaust port 461 and the upper end of this large chamber exhaust port 281 are in close proximity to and oppose each other in the up-down direction. Thus, the cup exhaust port 461 and the large chamber exhaust port 281 in the third chamber exhaust port group 286c are substantially connected to each other. Then, the gas in the cup part 4 is discharged through the cup exhaust port 461 and the large chamber exhaust port 281 to the outside of the chamber 21 and the housing 6 by the third exhaust mechanism 95c (see FIG. 4). The gas in the chamber 21 outside the cup part 4 is also discharged through the inner cup space 46, the cup exhaust port 461, and the large chamber exhaust port 281 to the outside of the chamber 21 and the housing 6.

When the cup part 4 is in the third processing state, the small chamber exhaust port 284 in the third chamber exhaust port group 286c and the large chamber exhaust ports 281 and the small chamber exhaust ports 284 in the first chamber exhaust port group 286a and the second chamber exhaust port group 286b illustrated in FIG. 4 overlap in the up-down direction with inner projections 463 (see FIG. 3) of the cup bottom 42 and are thus substantially blocked.

The cup drain port 451 overlaps in the up-down direction with the central chamber drain port 271 in the third chamber drain port group 276c. The lower end of the cup drain port 451 and the upper end of this chamber drain port 271 are in close proximity to and oppose each other in the up-down direction. Thus, the cup drain port 451 and the chamber drain port 271 in the third chamber drain port group 276c are substantially connected to each other. The chamber drain ports 271 (see FIG. 4) other than this chamber drain port 271 overlap in the up-down direction with outer projections 453 of the cup bottom 42 and are thus substantially blocked.

When the cup part 4 enters the third processing state, the supply of a third processing liquid from the upper nozzle 51 of the processing liquid supply part 5 to the upper surface 91 of the rotating substrate 9 is started (step S19). The third processing liquid that is continuously supplied to the central portion of the upper surface 91 of the substrate 9 is spread over the upper surface 91 of the substrate 9 by centrifugal force and covers the entire upper surface 91. Thus, the processing using the third processing liquid is performed on the upper surface 91 of the substrate 9.

The third processing liquid reaching the outer peripheral edge of the substrate 9 disperses radially outward from this outer peripheral edge and flows into the outer cup space 45 of the cup part 4. The third processing liquid flowing into the outer cup space 45 is discharged through the cup drain port 451 and the chamber drain port 271 to the third drainage part 96c (see FIG. 4) outside the chamber 21 and the housing 6. The third processing liquid discharged to the third drainage part 96c is discarded. Alternatively, the third processing liquid discharged to the third drainage part 96c may be recovered and reused as necessary.

During the processing of the substrate 9 using the third processing liquid, the gas in the chamber 21 is, as described above, discharged through the inner cup space 46, the cup exhaust port 461, and the large chamber exhaust port 281 to the outside of the chamber 21 and the housing 6 by the third exhaust mechanism 95c.

When a predetermined period of time has elapsed since the supply of the third processing liquid from the upper nozzle 51 was started, the supply of the third processing liquid is stopped, and the processing of the substrate 9 using the third processing liquid ends. The third processing liquid remaining on the substrate 9 is removed from the surface of the substrate 9 by the rotation of the substrate 9 and discharged to the third drainage part 96c through the outer cup space 45, the cup drain port 451, and the chamber drain port 271.

When the third processing liquid is removed from the surface of the substrate 9, the rotation of the substrate 9, the substrate holder 31, and the top plate 22 is stopped (step S20). Then, the controller 10 controls the cup rotation mechanism 7 such that the cup part 4 rotates and enters the standby state illustrated in FIG. 2 (step S21). Step S21 may be performed in parallel with step S20. When the cup part 4 enters the standby state, the chamber lid part 26 and the top plate 22 are moved upward and located at the retracted positions illustrated in FIG. 2. Thereafter, the lid part 65 is moved downward to open the carrying-in port 64, and the substrate 9 is conveyed out of the substrate processing apparatus 1 (step S22).

As described above, when the cup part 4 is in the standby state in the substrate processing apparatus 1, the lower end of the cup exhaust port 461 is in close proximity to the chamber bottom 256, and the upper end of each large chamber exhaust port 281 and the upper end of each small chamber exhaust port 284 are in close proximity to the cup bottom 42. This substantially stops the suction of the gas in the cup part 4 through the cup exhaust port 461 even if the first exhaust mechanism 95a, the second exhaust mechanism 95b, and the third exhaust mechanism 95c (see FIG. 4) continue the suction of gas. As a result, the entry of the gas outside the housing 6 into the housing 6 and the chamber 21 through the open carrying-in port 64 can be suppressed at the time of conveying the substrate 9 out of the chamber.

As described above, in the substrate processing apparatus 1, the large chamber exhaust ports 281 arranged in the circumferential direction are provided in the chamber bottom 256. Then, the controller 10 controls the cup rotation mechanism 7 such that the cup exhaust port 461 selectively overlaps with one of the large chamber exhaust ports 281. In the state in which the cup exhaust port 461 overlaps with the large chamber exhaust port 281 in the first chamber exhaust port group 286a, the gas in the cup part 4 is discharged through the cup exhaust port 461 and this large chamber exhaust port 281 to the outside of the chamber 21 and the housing 6 by the first exhaust mechanism 95a.

In the state in which the cup exhaust port 461 overlaps with the large chamber exhaust port 281 in the second chamber exhaust port group 286b, the gas in the cup part 4 is discharged through the cup exhaust port 461 and this large chamber exhaust port 281 to the outside of the chamber 21 and the housing 6 by the second exhaust mechanism 95b. In the state in which the cup exhaust port 461 overlaps with the large chamber exhaust port 281 in the third chamber exhaust port group 286c, the gas in the cup part 4 is discharged through the cup exhaust port 461 and this large chamber exhaust port 281 to the outside of the chamber 21 and the housing 6 by the third exhaust mechanism 95c.

In this way, the substrate processing apparatus 1 can easily switch the exhaust mechanism for exhausting gas from the cup part 4 among the first exhaust mechanism 95a, the second exhaust mechanism 95b, and the third exhaust mechanism 95c by rotating the cup part 4 within the chamber 21 and the housing 6 via the cup rotation mechanism 7 without opening the chamber 21 and the housing 6. Moreover, the destination to which the exhaust gas from the cup part 4 is discharged (hereinafter, referred to as an "exhaust destination") can be switched with a simple-structure mechanism, and this simplifies the structure of the substrate processing apparatus 1. Accordingly, the substrate processing apparatus 1 can be made more compact than in the case where a switcher for switching the exhaust destination from the cup part is provided outside the housing. Moreover, undesirable mixing and contact of gaseous or misty processing liquids that are being discharged can be suppressed by switching the exhaust destination from the cup part 4 within the chamber 21, as compared with the case where the exhaust gas is guided to a switching device outside the housing through, for example, common piping.

As described above, in the substrate processing apparatus 1, the chamber drain ports 271 arranged in the circumferential direction are provided in the chamber bottom 256. In the state in which the cup exhaust port 461 overlaps with the large chamber exhaust port 281 in the first chamber exhaust port group 286a, the cup drain port 451 overlaps with the central chamber drain port 271 in the first chamber drain port group 276a. Thus, the first processing liquid flowing into the cup part 4 is discharged through the cup drain port 451 and this chamber drain port 271 to the first drainage part 96a outside the chamber 21 and the housing 6.

In the state in which the cup exhaust port 461 overlaps with the large chamber exhaust port 281 in the second chamber exhaust port group 286b, the cup drain port 451 overlaps with the central chamber drain port 271 in the second chamber drain port group 276b. The second processing liquid flowing into the cup part 4 is discharged through the cup drain port 451 and this chamber drain port 271 to the second drainage part 96b outside the chamber 21 and the housing 6. In the state in which the cup exhaust port 461 overlaps with the large chamber exhaust port 281 in the third chamber exhaust port group 286c, the cup drain port 451 overlaps with the central chamber drain port 271 in the third chamber drain port group 276c. The third processing liquid flowing into the cup part 4 is discharged through the cup drain port 451 and this chamber drain port 271 to the third drainage part 96c outside the chamber 21 and the housing 6.

In this way, the substrate processing apparatus 1 can simultaneously switch the exhaust destination from the cup part 4 and the destination to which the processing liquid from the cup part 4 is discharged (hereinafter, referred to as a "drainage destination") with a single mechanism by rotating the cup part 4 via the cup rotation mechanism 7. This mechanism consequently simplifies the structure of the substrate processing apparatus 1 and allows the substrate processing apparatus 1 to be made more compact.

The cup part 4 includes the partition wall 44 between the cup inner wall part 43 and the cup outer wall part 41, and the processing liquid from the processing liquid supply part 5 flows into the outer cup space 45 between the cup outer wall part 41 and the partition wall 44. The cup drain port 451 is located on the radially outer side of the lower end of the partition wall 44, and the cup exhaust port 461 is located on the radially inner side of the lower end of the partition wall 44. Thus, the entry of processing liquids into the cup exhaust port 461 can be prevented or suppressed with a simple structure.

In the substrate processing apparatus 1, the rotor 72 is disposed within the housing 6, and the stator 71 is disposed outside the housing 6. This structure allows the positions of the cup drain port 451 and the cup exhaust port 461 to be changed by rotating the cup part 4 while the carrying-in port 64 of the housing 6 is closed. This structure also reduces the size of the internal space of the housing 6. Moreover, disposing the stator 71 around the rotor 72 allows other constituent elements such as the substrate rotation mechanism 32 and the lower nozzle 52 to be easily disposed in the space below the central portion of the housing 6.

Since the rotor 72 is disposed within the chamber 21 as described above, the positions of the cup drain port 451 and the cup exhaust port 461 can be changed by rotating the cup part 4 while the chamber 21 is sealed to maintain the chamber space. Also, the size of the chamber space can be reduced because the stator 71 is disposed outside the chamber 21.

In the substrate processing apparatus 1, the rotor 72 rotates in a floating state within the chamber space of the housing 6. This eliminates the need to provide a structure for supporting the rotor 72 in the chamber space, thus making the substrate processing apparatus 1 more compact and simplifying the structure of the apparatus. Processing liquids will thus not adhere to such a support structure, and this prevents generation of particles or the like due to drying of attached processing liquids. Moreover, particles or the like will not be generated by the friction between the rotor 72 and such a support structure, and this improves cleanliness within the chamber space and the housing 6.

Figure 8:
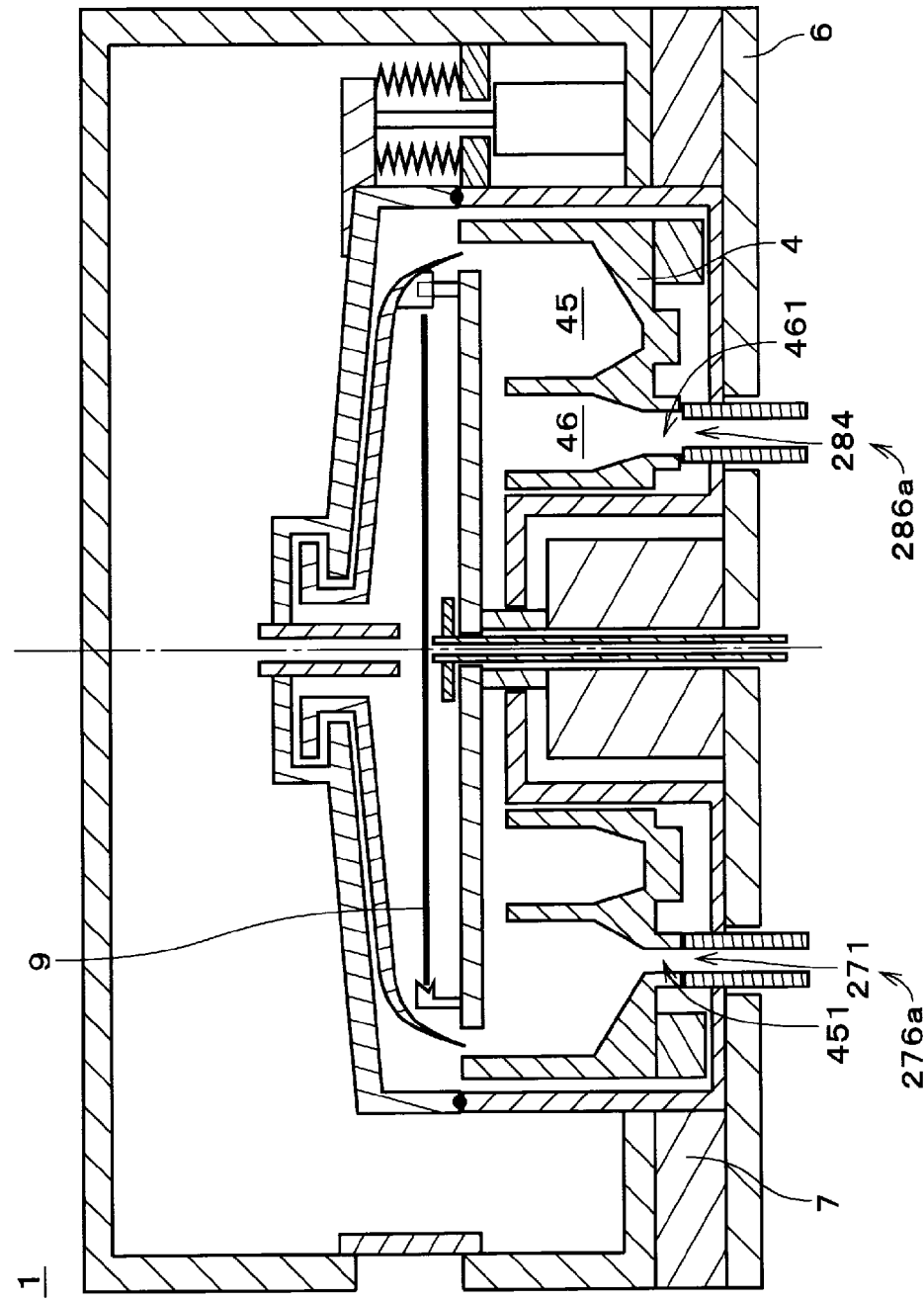
FIG. 8 is a cross-sectional view of the substrate processing apparatus.

The substrate processing apparatus 1 may sometimes be required to reduce the flow rate of exhaust gas exhausted from the chamber 21 via the first exhaust mechanism 95a and reduce the consumption of nitrogen, for example, in the case of filling the chamber space with a nitrogen gas. In this case, the cup rotation mechanism 7 is controlled by the controller 10 such that the cup exhaust port 461 overlaps in the up-down direction with the small chamber exhaust port 284 in the first chamber exhaust port group 286a as illustrated in FIG. 8. The cup exhaust port 461 is in close proximity to and opposes the small chamber exhaust port 284 in the up-down direction. Thus, the cup exhaust port 461 is substantially connected to the small chamber exhaust port 284. The gas in the cup part 4 is discharged through the cup exhaust port 461 and this small chamber exhaust port 284 to the outside of the chamber 21 and the housing 6 by the first exhaust mechanism 95a (see FIG. 4).

As described above, the area of the upper end of the small chamber exhaust port 284 is smaller than the area of the upper end of the large chamber exhaust port 281. Thus, the area of overlap between the cup exhaust port 461 and a chamber exhaust port can be changed by changing the orientation of the cup part 4 via the cup rotation mechanism 7 from the state in which the cup exhaust port 461 overlaps with a large chamber exhaust port 281 to the state in which the cup exhaust port 461 overlaps with a small chamber exhaust port 284. This reduces the flow rate of exhaust gas exhausted from the chamber 21 via the first exhaust mechanism 95a.

The cup drain port 451 overlaps with the upper chamber drain port 271 in FIG. 4 among the three chamber drain ports 271 in the first chamber drain port group 276a. The first processing liquid flowing into the outer cup space 45 of the cup part 4 is discharged through the cup drain port 451 and this chamber drain port 271 to the first drainage part 96a (see FIG. 4) outside the chamber 21 and the housing 6.

In this way, the substrate processing apparatus 1 can easily change the flow rate of exhaust gas from the chamber 21 according to, for example, the content of processing performed on the substrate 9 by controlling the cup rotation mechanism 7 via the controller 10 to change the area of overlap between the cup exhaust port 461 and a chamber exhaust port. In the substrate processing apparatus 1, changing the area of overlap between the cup exhaust port 461 and a chamber exhaust port corresponds to causing the cup exhaust port 461 to selectively overlap with either the large chamber exhaust port 281 (see FIG. 1) or the small chamber exhaust port 284 in the first chamber exhaust port group 286a. Accordingly, the flow rate of exhaust gas from the chamber 21 can be changed with a simple structure without changing the suction force of the first exhaust mechanism 95a.

Figure 9:
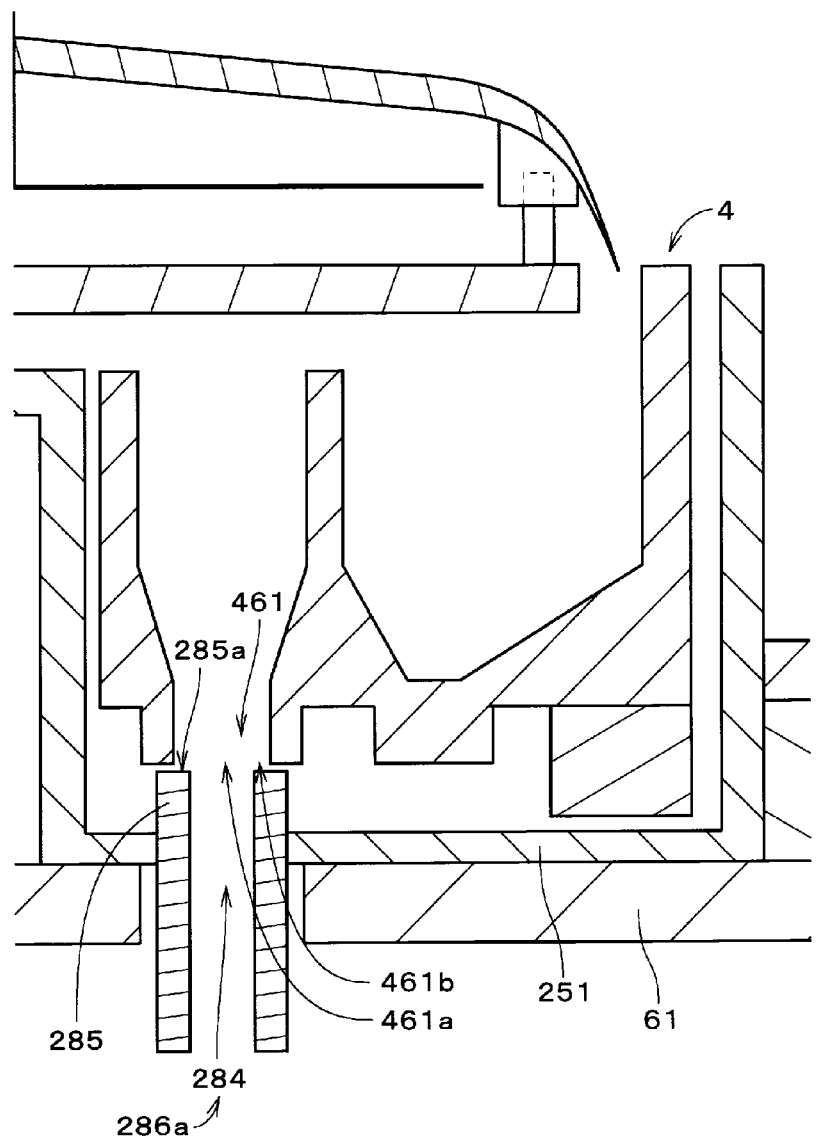
FIG. 9 is an enlarged cross-sectional view of part of the substrate processing apparatus.

FIG. 9 is an enlarged view of the small chamber exhaust port 284 in the first chamber exhaust port group 286a and the cup exhaust port 461 that overlaps with this small chamber exhaust port 284. As illustrated in FIG. 9, an upper end surface 285a of the bottom protruding part 285 having the small chamber exhaust port 284 therein is approximately perpendicular to the aforementioned up-down direction. A generally circular region in the central portion of the lower end of the cup exhaust port 461 is an overlap region 461a that overlaps with the upper end of the small chamber exhaust port 284. A ring-shaped region of the lower end of the cup exhaust port 461 around the overlap region 461a (i.e., a region excluding the overlap region 461a) is a non-overlap region 461b that does not overlap with the upper end of the small chamber exhaust port 284.

The non-overlap region 461b of the cup exhaust port 461 is in close proximity to and opposes the upper end surface 285a of the bottom protruding part 285 of the chamber bottom 256 in the up-down direction. Thus, the non-overlap region 461b of the cup exhaust port 461 is substantially blocked. This prevents or suppresses the suction of the gas below the cup part 4 into the small chamber exhaust port 284 through the non-overlap region 461b of the cup exhaust port 461 when gas is exhausted through the cup exhaust port 461 and the small chamber exhaust port 284 by the first exhaust mechanism 95a. As a result, the gas in the cup part 4 can be discharged with efficiency. The substrate processing apparatus 1 can easily block the non-overlap region 461b of the cup exhaust port 461 by using a simple structure, i.e., the upper end surface 285a of the bottom protruding part 285.

The small chamber exhaust port 284 does not necessarily need to be provided within the bottom protruding part 285 as long as the small chamber exhaust port 284 is provided in the chamber bottom 256. Even if the bottom protruding part 285 is omitted, the non-overlap region 461b of the cup exhaust port 461 is substantially blocked by coming in close proximity to the chamber bottom 256 around the small chamber exhaust port 284. Even in this case, the gas in the cup part 4 can be discharged with efficiency as described above.

The substrate processing apparatus 1 may sometimes be required to make fine adjustments of the flow rate of exhaust gas exhausted from the chamber 21 via the first exhaust mechanism 95a. In this case, the cup rotation mechanism 7 rotates the cup part 4 by a slight angle (e.g., five degrees) from the state in which the cup exhaust port 461 overlaps with one chamber exhaust port out of the large chamber exhaust port 281 and the small chamber exhaust port 284 in the first chamber exhaust port group 286a, while maintaining the overlap between the cup exhaust port 461 and this one chamber exhaust port.

Figure 10:
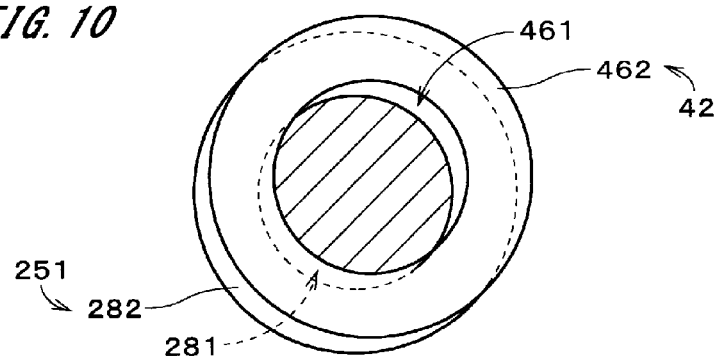
FIG. 10 is a plan view illustrating the vicinity of a cup exhaust port.

FIG. 10 is a plan view illustrating the vicinity of the cup exhaust port 461. FIG. 10 illustrates a state in which, when the above one chamber exhaust port is the large chamber exhaust port 281, the cup part 4 is rotated by a slight angle while maintaining the overlap between the cup exhaust port 461 and this one chamber exhaust port. The overlap region of the cup exhaust port 461 and the large chamber exhaust port 281 is cross-hatched in FIG. 10. The area of overlap between the cup exhaust port 461 and the above one chamber exhaust port (in the example illustrated in FIG. 10, the large chamber exhaust port 281) is changed by the slight-angle rotation of the cup part 4. As a result, the flow rate of exhaust gas exhausted from the chamber 21 via the first exhaust mechanism 95*a* can be adjusted finely with a simple structure.

In the state illustrated in FIG. 10, the non-overlap region of the lower end of the cup exhaust port 461, excluding the region of overlap with the large chamber exhaust port 281, is substantially blocked when the non-overlap region is in close proximity to and opposes in the up-down direction the upper end surface of the bottom protruding part 282 (i.e., part of the chamber bottom 256) having the above one chamber exhaust port therein. The upper end surface of the bottom protruding part is approximately perpendicular to the up-down direction. The non-overlap region of the upper end of the one chamber exhaust port, excluding the region of overlap with the cup exhaust port 461, is also substantially blocked when the non-overlap region is in close proximity to and opposes in the up-down direction the lower end surface of the bottom protruding part 462 (i.e., part of the cup bottom 42) having the cup exhaust port 461 therein. The lower end surface of the bottom protruding part 462 is also approximately perpendicular to the up-down direction.

In the substrate processing apparatus 1, changing the flow rate of exhaust gas does not necessarily need to be achieved by causing the cup exhaust port 461 to selectively overlap with either the large chamber exhaust port 281 or the small chamber exhaust port 284. For example, if the flow rate of exhaust gas can be changed to a desired value by changing the area of the overlap region of the cup exhaust port 461 and the large chamber exhaust port 281, the above-described change in the area of overlap between the cup exhaust port 461 and the chamber exhaust port may be implemented by rotating the cup part 4 while maintaining the overlap between the cup exhaust port 461 and the large chamber exhaust port 281. Accordingly, the flow rate of exhaust gas exhausted from the chamber 21 via the first exhaust mechanism 95*a* can be adjusted finely with a simple structure.

Even in this case, the non-overlap region of the lower end of the cup exhaust port 461, excluding the region of overlap with the large chamber exhaust port 281, is substantially blocked, as in the state illustrated in FIG. 10, when the non-overlap region is in close proximity to and opposes the chamber bottom 256 in the up-down direction. The non-overlap region of the upper end of this large chamber exhaust port 281, excluding the region of overlap with the cup exhaust port 461, is also substantially blocked when the non-overlap region is in close proximity to and opposes the cup bottom 42 in the up-down direction. Thus, the gas in the cup part 4 can be discharged with efficiency by the first exhaust mechanism 95*a*.

To be more specific, the above non-overlap region of the cup exhaust port 461 is substantially blocked when the non-overlap region is in close proximity to and opposes in the up-down direction the upper end surface of the bottom protruding part 282 having the large chamber exhaust port 281 therein. The above non-overlap region of the large chamber exhaust port 281 is also substantially blocked when the non-overlap region is in close proximity to and opposes in the up-down direction the lower end surface of the bottom protruding part 462 having the cup exhaust port 461 therein. The upper end surface of the bottom protruding part 282 and the lower end surface of the bottom protruding part 462 are approximately perpendicular to the up-down direction. In this way, the substrate processing apparatus 1 can substantially block the non-overlap region of the cup exhaust port 461 and the non-overlap region of the large chamber exhaust port 281 with a simple structure.

While the above has been a description of changing the flow rate of exhaust gas exhausted via the first exhaust mechanism 95*a* and fine adjustments of the flow rate of exhaust gas during the processing using the first processing liquid, the same applies to the case of changing the flow rate of exhaust gas exhausted via the second exhaust mechanism 95*b* and fine adjustments of the flow rate of exhaust gas during the processing using the second processing liquid. The same also applies to the case of changing the flow rate of exhaust gas exhausted via the third exhaust mechanism 95*c* and fine adjustments of the flow rate of exhaust gas during the processing using the third processing liquid.

Figure 11:
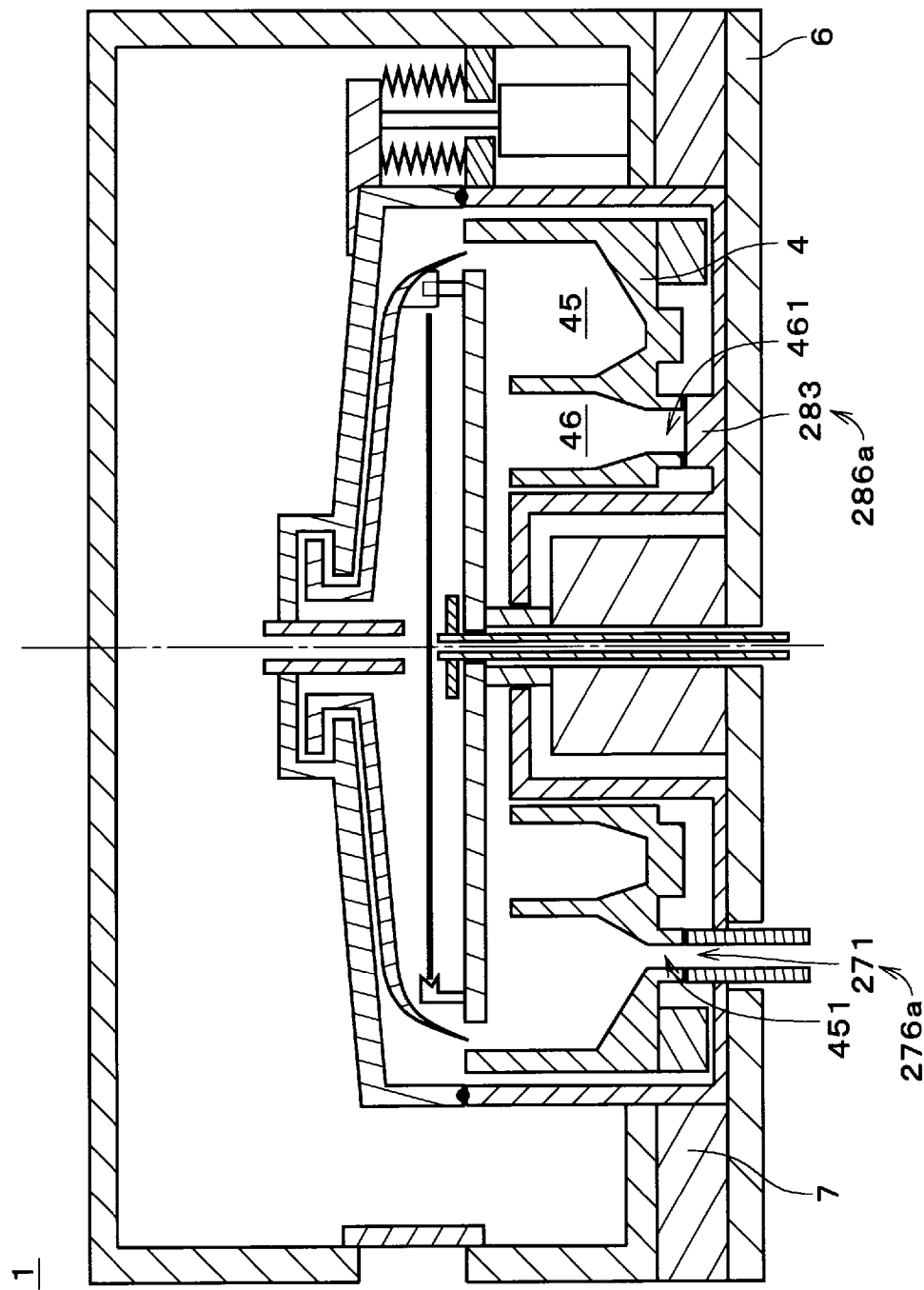
FIG. 11 is a cross-sectional view of the substrate processing apparatus.

The substrate processing apparatus 1 may sometimes be required to stop the first exhaust mechanism 95*a* exhausting gas from the chamber 21, for example, in the case of reducing the rotational speed of the substrate 9 (or stopping the rotation of the substrate 9) so that the upper surface 91 of the substrate 9 is puddled with the first processing liquid at the time of processing the substrate 9 using the first processing liquid. In this case, the cup rotation mechanism 7 is controlled by the controller 10 so that the cup drain port 451 overlaps with the lower chamber drain port 271 in FIG. 4 among the three chamber drain ports 271 in the first chamber drain port group 276*a* as illustrated in FIG. 11. In this state, the first processing liquid in the outer cup space 45 of the cup part 4 is discharged through the cup drain port 451 and the chamber drain port 271 to the first drainage part 96*a* outside the chamber 21 and the housing 6.

Here, the cup exhaust port 461 is located at a position spaced in the circumferential direction from the large chamber exhaust port 281 and the small chamber exhaust port 284 in the first chamber exhaust port group 286*a*, and overlaps with the inner projection 283 in the first chamber exhaust port group 286*a*. The lower end of the cup exhaust port 461 is in close proximity to and opposes the upper end surface of the inner projection 283 in the up-down direction and is substantially blocked. This substantially stops the first exhaust mechanism 95*a* exhausting the gas in the chamber 21.

In this way, the substrate processing apparatus 1 can cause the cup exhaust port 461 to selectively overlap with either the large chamber exhaust port 281 (which may be the small chamber exhaust port 284) or the inner projection 283 in the first chamber exhaust port group 286*a*, via the controller 10 controlling the cup rotation mechanism 7. Accordingly, the apparatus can easily select either an exhaust state of exhausting the gas in the chamber 21 via the first exhaust mechanism 95*a* or an exhaust stop state of stopping the discharge of the gas, when discharging the first processing liquid to the first drainage part 96*a* through the cup drain port 451.

While the above has been a description of stopping the discharge of gas via the first exhaust mechanism 95*a* during the processing using the first processing liquid, the same applies to the case of stopping the discharge of gas via the second exhaust mechanism 95*b* during the processing using the second processing liquid. The same also applies to the case of stopping the discharge of gas via the third exhaust mechanism 95*c* during the processing using the third processing liquid.

Figure 12:
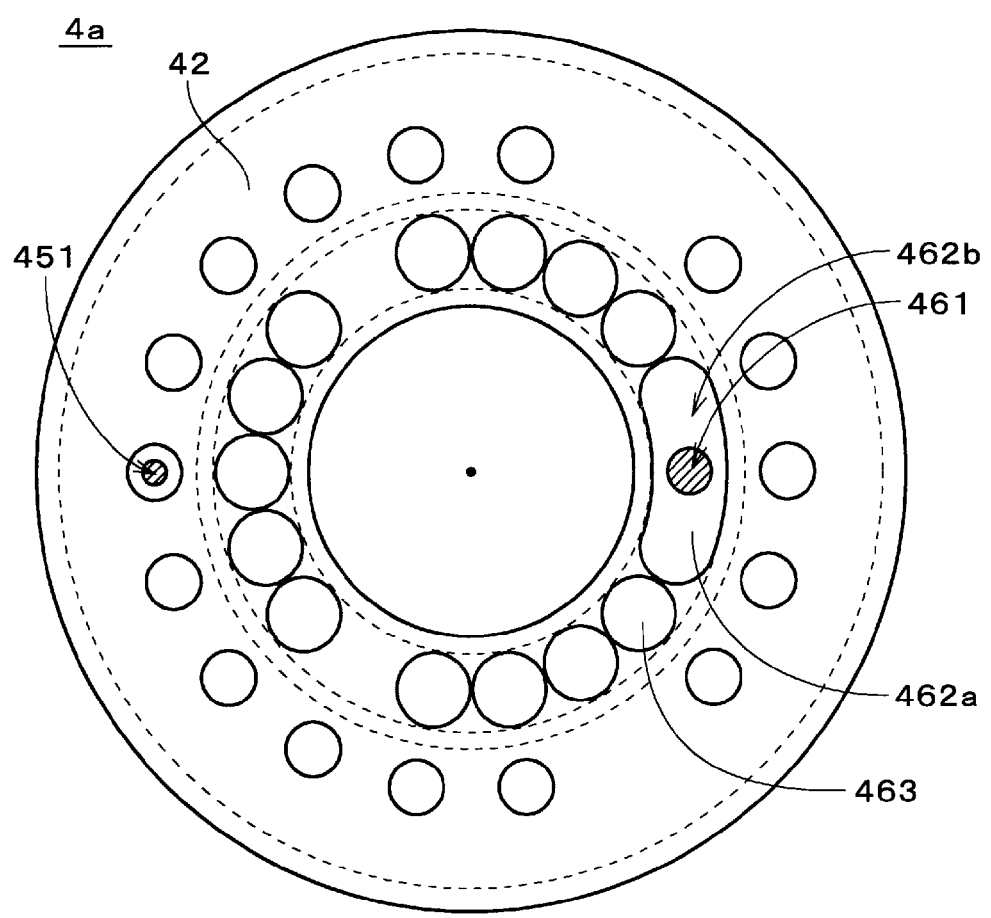
FIG. 12 is a bottom view of the cup part.
Figure 13:
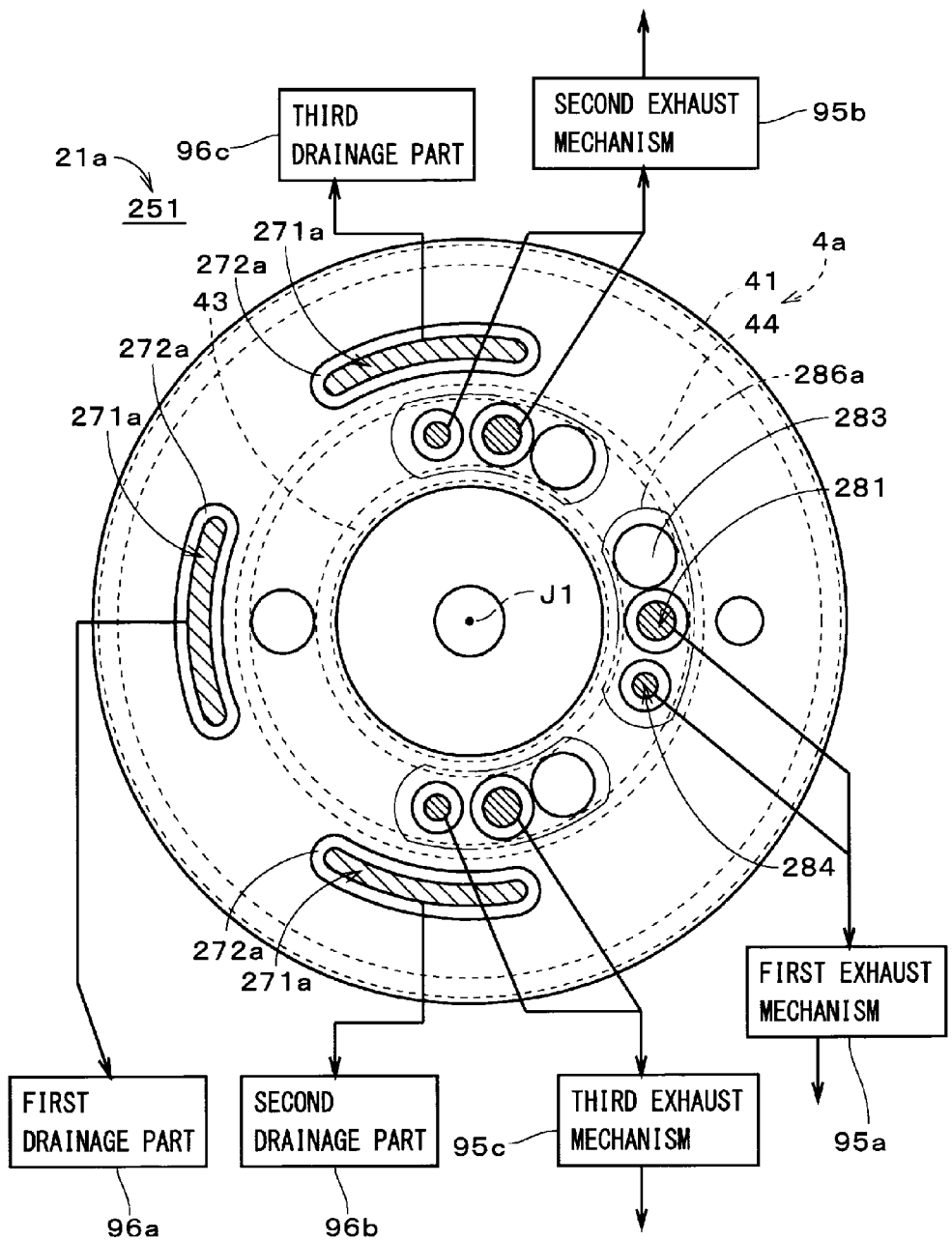
FIG. 13 is a plan view of the chamber lower surface part.

In the substrate processing apparatus 1, the shapes of the cup bottom 42 and the chamber lower surface part 251 may be changed. FIG. 12 is a bottom view of another preferable cup part 4a. FIG. 13 is a plan view of a chamber lower surface part 251 of another preferable chamber 21a. As in FIG. 4, a cup outer wall part 41, a partition wall 44, and a cup inner wall part 43 of the cup part 4a are also indicated by broken lines in FIG. 13.

In the cup part 4a illustrated in FIG. 12, a bottom protruding part 462a that has a different shape from the bottom protruding part 462 of the cup part 4 illustrated in FIG. 3 is provided on the cup bottom 42 and protrudes downward. The other constituent elements of the cup part 4a are almost the same as those of the cup part 4 illustrated in FIG. 3 and given the same reference numerals in the following description. As illustrated in FIG. 12, the bottom protruding part 462a has a generally arc-like shape that is long in the circumferential direction and centered on the central axis J1. The bottom protruding part 462a is provided almost throughout a circumferential region in which the bottom protruding part 462 in FIG. 3 and the two inner projections 463 adjacent to and on the opposite circumferential sides of the bottom protruding part 462 are disposed. A lower end surface 462b of the bottom protruding part 462a is approximately perpendicular to the up-down direction. The cup exhaust port 461 is formed in approximately the circumferential center of the bottom protruding part 462a. The cup exhaust port 461 has a similar size and shape to the cup exhaust port 461 illustrated in FIG. 3.

In the chamber 21a illustrated in FIG. 13, bottom protruding parts 272a and chamber drain ports 271a that have different shapes from the bottom protruding parts 272 and the chamber drain ports 271 of the chamber 21 illustrated in FIG. 4 are provided on and in the chamber bottom 256 of the chamber lower surface part 251. The other constituent elements of the chamber 21a are almost the same as those of the chamber 21 illustrated in FIG. 3 and given the same reference numerals in the following description. In the example illustrated in FIG. 13, three bottom protruding parts 272a and three chamber drain ports 271a are provided on and in the chamber bottom 256 of the chamber lower surface part 251. The three chamber drain ports 271a are respectively disposed at the positions of the chamber drain port groups 276a to 276c illustrated in FIG. 3. The three chamber drain ports 271a are connected respectively to the first drainage part 96a, the second drainage part 96b, and the third drainage part 96c.

As illustrated in FIG. 13, each bottom protruding part 272a and each chamber drain port 271a have generally arc-like shapes that are long in the circumferential direction and centered on the central axis J1. Each bottom protruding part 272a is provided almost throughout a circumferential region in which the three bottom protruding parts 272 in one chamber drain port group in FIG. 3 are disposed. Each chamber drain port 271a is provided almost throughout a circumferential region in which the three chamber drain ports 271 in one chamber drain port group are disposed. The circumferential length of the chamber drain port 271a is longer than the circumferential length of the cup drain port 451 illustrated in FIG. 12.

In the state in which the cup exhaust port 461 overlaps in the up-down direction with the large chamber exhaust port 281 in the first chamber exhaust port group 286a, the cup drain port 451 overlaps in the up-down direction with the circumferential central portion of the chamber drain port 271a connected to the first drainage part 96a. This state is hereinafter referred to as a "large-flow exhaust state."

In the large-flow exhaust state, the gas in the cup part 4a is discharged through the cup exhaust port 461 and the above large chamber exhaust port 281 to the outside of the chamber 21a and the housing 6 by the first exhaust mechanism 95a. The first processing liquid in the outer cup space 45 of the cup part 4a is discharged through the cup drain port 451 and that chamber drain port 271a to the first drainage part 96a. Note that the upper end of the small chamber exhaust port 284 in the first chamber exhaust port group 286a is substantially blocked when the upper end is in close proximity to and opposes in the up-down direction the lower end surface 462b of the bottom protruding part 462a that extends around the cup exhaust port 461.

When the cup part 4a is rotated from the large-flow exhaust state while maintaining the overlap between the cup drain port 451 and the above chamber drain port 271a, the cup exhaust port 461 moves to a position shifted from the large chamber exhaust port 281 in the circumferential direction. For example, the cup exhaust port 461 enters a state in which the cup exhaust port 461 overlaps in the up-down direction with the small chamber exhaust port 284 in the first chamber exhaust port group 286a while maintaining the overlap between the cup drain port 451 and the above chamber drain port 271a. This state is hereinafter referred to as a "small-flow exhaust state."

In the small-flow exhaust state, the gas in the cup part 4a is discharged through the cup exhaust port 461 and the above small chamber exhaust port 284 to the outside of the chamber 21a by the first exhaust mechanism 95a. The flow rate of exhaust gas from the chamber 21a in the small-flow exhaust state is smaller than the flow rate of exhaust gas flow from the chamber 21a in the large-flow exhaust state. In the small-flow exhaust state, the first processing liquid in the outer cup space 45 of the cup part 4a is discharged through the cup drain port 451 and this chamber drain port 271a to the first drainage part 96a, as in the large-flow exhaust state. Note that the upper end of the large chamber exhaust port 281 in the first chamber exhaust port group 286a is substantially blocked when the upper end is in close proximity to and opposes in the up-down direction the lower end surface 462b of the bottom protruding part 462a that extends around the cup exhaust port 461.

When the cup part 4a is rotated from the large-flow exhaust state or the small-flow exhaust state while maintaining the overlap between the cup drain port 451 and the above chamber drain port 271a, the cup exhaust port 461 moves to a position shifted from the large chamber exhaust port 281 and the small chamber exhaust port 284 in the circumferential direction. For example, the cup exhaust port 461 enters a state in which the cup exhaust port 461 overlaps in the up-down direction with the inner projection 283 in the first chamber exhaust port group 286a while maintaining the overlap between the cup drain port 451 and the above chamber drain port 271a. This state is hereinafter referred to as an "exhaust stop state."

In the exhaust stop state, the lower end of the cup exhaust port 461 is substantially blocked when the lower end is in close proximity to and opposes the upper end surface of the inner projection 283 in the first chamber exhaust port group 286a in the up-down direction. The upper end of the large chamber exhaust port 281 in the first chamber exhaust port group 286a is substantially blocked when the upper end is in close proximity to and opposes in the up-down direction the lower end surface 462b of the bottom protruding part 462a that extends around the cup exhaust port 461. The upper end of the small chamber exhaust port 284 in the first chamber exhaust port group 286a is substantially blocked when the upper end is in close proximity to and opposes in the up-down direction the lower end surface of an inner projection 463 that is adjacent to the bottom protruding part 462a in the circumferential direction. This substantially stops the suction of the gas in the cup part 4a through the cup exhaust port 461 via the first exhaust mechanism 95a (i.e., the discharge of gas from the chamber 21a by the first exhaust mechanism 95a). In the exhaust stop state, the first processing liquid in the outer cup space 45 of the cup part 4a is discharged through the cup drain port 451 and the chamber drain port 271a to the first drainage part 96a, as in the large-flow exhaust state and the small-flow exhaust state.

The provision of the cup part 4a and the chamber 21a illustrated in FIGS. 12 and 13 allows the exhaust state and the exhaust stop state of the first exhaust mechanism 95a to be easily switched while continuing the discharge of the first processing liquid to the first drainage part 96a. Also, the selective switching between the large-flow exhaust state and the small-flow exhaust state in the exhaust state of the first exhaust mechanism 95a allows the flow rate of exhaust gas to be easily changed. Moreover, the exhaust stop state can be achieved with a simple structure as described above.

While the above has been a description of the large-flow exhaust state, the small-flow exhaust state, and the exhaust stop state of the first exhaust mechanism 95a during the processing using the first processing liquid in the case of using the cup part 4a and the chamber 21a, the same applies to the large-flow exhaust state, the small-flow exhaust state, and the exhaust stop state of the second exhaust mechanism 95b during the processing using the second processing liquid. The same also applies to the large-flow exhaust state, the small-flow exhaust state, and the exhaust stop state of the third exhaust mechanism 95c during the processing using the third processing liquid.

Figure 14:
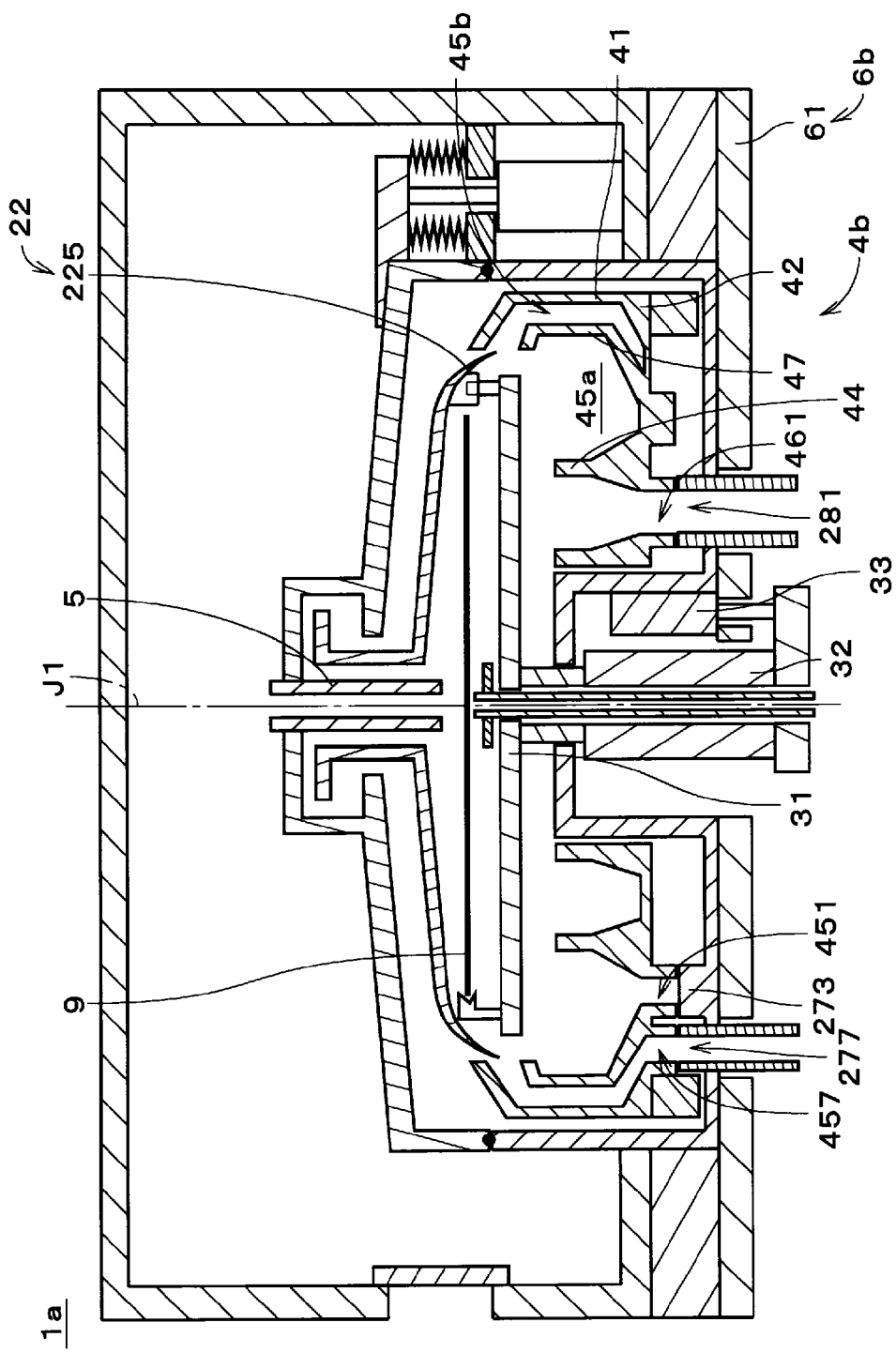
FIG. 14 is a cross-sectional view of a substrate processing apparatus according to a second embodiment.

FIG. 14 is a cross-sectional view of a substrate processing apparatus 1a according to a second embodiment. The substrate processing apparatus 1a includes a cup part 4b and a chamber 21b that have different shapes from the cup part 4 and the chamber 21 illustrated in FIG. 1. The substrate processing apparatus 1a further includes an elevating mechanism 33. Except for these points, the substrate processing apparatus 1a has almost the same structure as the substrate processing apparatus 1 illustrated in FIG. 1. In the following description, constituent elements of the substrate processing apparatus 1a that correspond to those of the substrate processing apparatus 1 are given the same reference numerals.

As illustrated in FIG. 14, the cup part 4b includes another partition wall 47 that is located between the partition wall 44 and the cup outer wall part 41 in the radial direction. In order to facilitate distinction between the partition walls 44 and 47, the partition walls 44 and 47 are respectively referred to as a "first partition wall 44" and a "second partition wall 47" in the following description. The second partition wall 47 has a generally cylindrical shape about the central axis J1. The second partition wall 47 extends upward from the cup bottom 42. The second partition wall 47 extends outwardly in the radial direction as approaching upward from the cup bottom 42, and from a position above a predetermined position in the up-down direction, extends upward almost in parallel with the central axis J1. The cup drain port 451 is located on the radially inner side of the lower end of the second partition wall 47 and on the radially outer side of the lower end of the first partition wall 44. In the following description, the space between the first partition wall 44 and the second partition wall 47 of the cup part 4b is referred to as a "first outer cup space 45a." The space between the second partition wall 47 and the cup outer wall part 41 of the cup part 4b is referred to as a "second outer cup space 45b."

Figure 15:
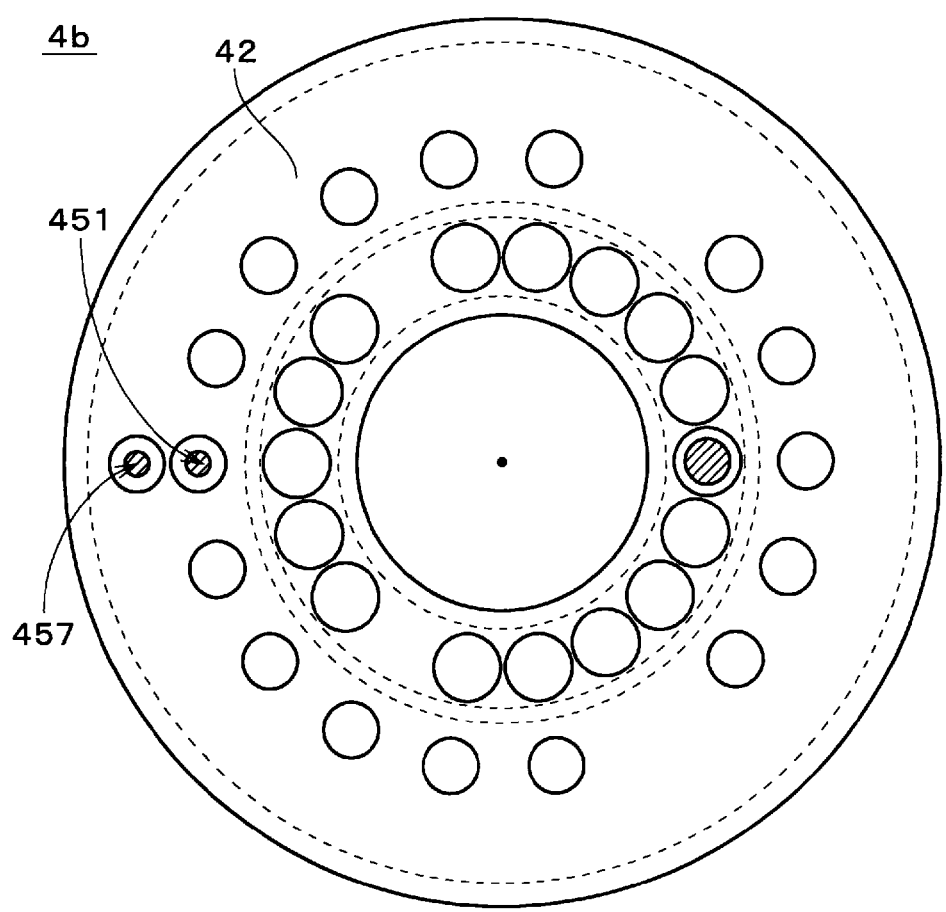
FIG. 15 is a bottom view of the cup part.

FIG. 15 is a bottom view of the cup part 4b. As illustrated in FIGS. 14 and 15, the cup bottom 42 of the cup part 4b has another cup drain port 457 at a position spaced from the cup drain port 451. The cup drain port 457 is located on the radially outer side of the lower end of the second partition wall 47 and on the radially inner side of the lower end of the cup outer wall part 41. That is, the cup drain port 457 is located on the radially outer side of the cup drain port 451. In order to facilitate distinction between the cup drain ports 451 and 457, the cup drain ports 451 and 457 are respectively referred to as an "inner cup drain port 451" and an "outer cup drain port 457" in the following description.

The size and shape of the lower end of the outer cup drain port 457 may, for example, be almost the same as the size and shape of the lower end of the inner cup drain port 451. In other words, the area of the lower end of the outer cup drain port 457 is almost equal to the area of the lower end of the inner cup drain port 451. While in FIGS. 14 and 15, the outer cup drain port 457 and the inner cup drain port 451 are arranged side by side in the radial direction, the outer cup drain port 457 and the inner cup drain port 451 may be disposed at different circumferential positions.

Figure 16:
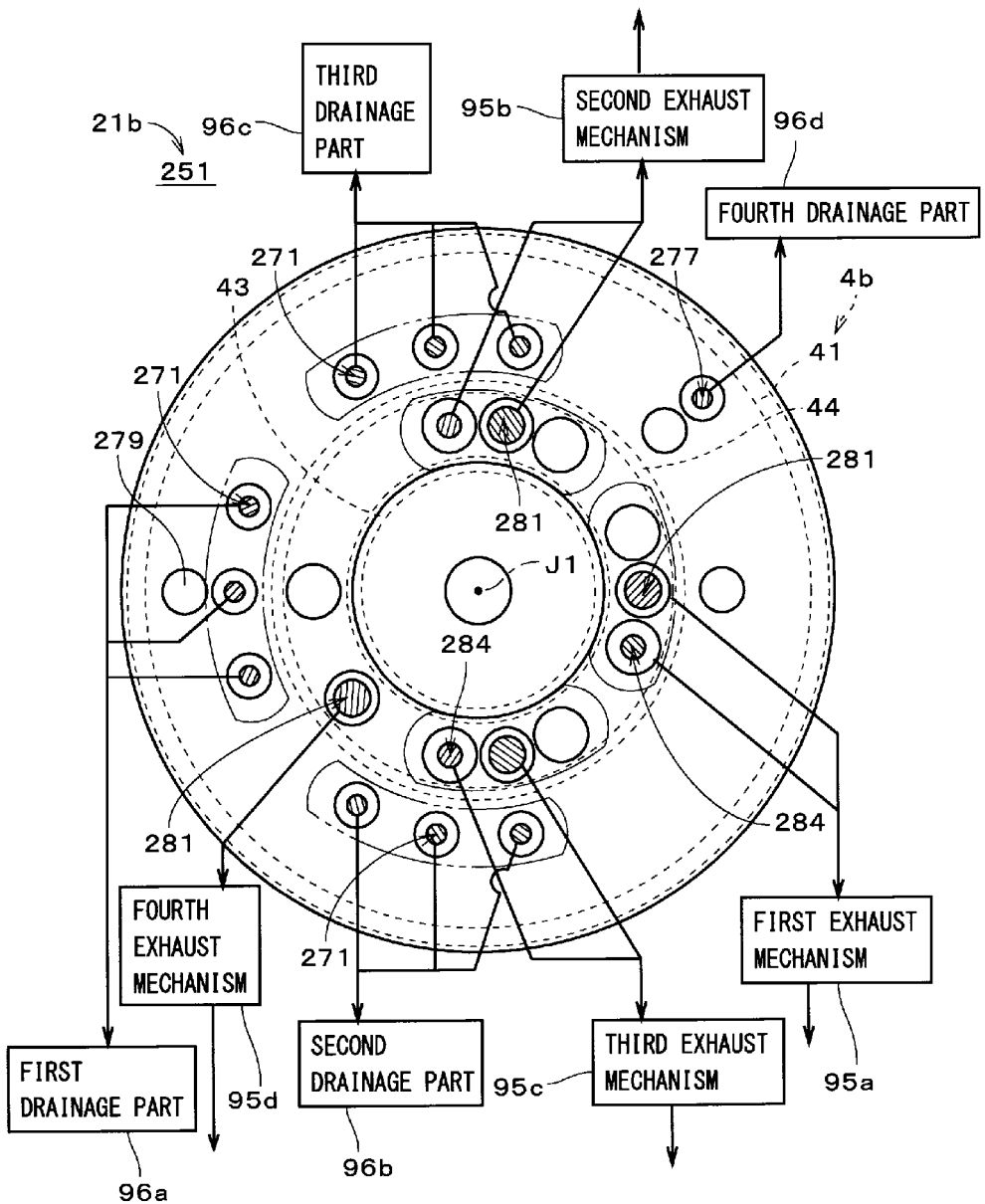
FIG. 16 is a plan view of the chamber lower surface part.

FIG. 16 is a bottom view of the chamber lower surface part 251 of the chamber 21b. The cup outer wall part 41, the first partition wall 44, and the cup inner wall part 43 of the cup part 4b are also indicated by broken lines in FIG. 16. As illustrated in FIGS. 14 and 16, a chamber bottom 256 of a chamber lower surface part 251 of the chamber 21b has another chamber drain port 277 that is located on the radially outer side of a plurality of chamber drain ports 271. In order to facilitate distinction between the chamber drain ports 271 and 277, the chamber drain ports 271 and 277 are respectively referred to as "inner chamber drain ports 271" and an "outer chamber drain port 277" in the following description.

The outer chamber drain port 277 is located at a different circumferential position from the inner chamber drain ports 271. The size and shape of the lower end of the outer chamber drain port 277 may, for example, be almost the same as the size and shape of the lower ends of the inner chamber drain ports 271. In other words, the area of the lower end of the outer chamber drain port 277 is almost equal to the area of the lower end of each inner chamber drain port 271. The outer chamber drain port 277 is connected to another drainage part (hereinafter, referred to as a "fourth drainage part 96d") that is provided independently of the first drainage part 96a, the second drainage part 96b, and the third drainage part 96c.

The chamber bottom 256 of the chamber lower surface part 251 has another large chamber exhaust port 281, in addition to the three large chamber exhaust ports 281 illustrated in FIG. 4. This other large chamber exhaust port 281 is connected to another exhaust mechanism (hereinafter, referred to as a "fourth exhaust mechanism 95d") that is provided independently of the first exhaust mechanism 95a, the second exhaust mechanism 95b, and the third exhaust mechanism 95c. This large chamber exhaust port 281 is located on the opposite side of the outer chamber drain port 277, with the central axis J1 located therebetween, and arranged along with the other large chamber exhaust ports 281 and a plurality of small chamber exhaust ports 284 in the circumferential direction.

In the example illustrated in FIG. 14, the outer cup drain port 457 overlaps in the up-down direction with the outer chamber drain port 277. The lower end of the outer cup drain port 457 is in close proximity to and opposes the upper end of the outer chamber drain port 277 in the up-down direction. Thus, the outer cup drain port 457 and the outer chamber drain port 277 are substantially connected to each other. The outer cup drain port 457 is connected to the fourth drainage part 96d via the outer chamber drain port 277. The inner cup drain port 451 is substantially blocked when overlapping with the outer projection 273 of the chamber bottom 256 in the up-down direction.

In the example illustrated in FIG. 14, the cup exhaust port 461 overlaps in the up-down direction with the aforementioned large chamber exhaust port 281 connected to the fourth exhaust mechanism 95d. The lower end of the cup exhaust port 461 is in close proximity to and opposes the upper end of this large chamber exhaust port 281 in the up-down direction. Thus, the cup exhaust port 461 and this large chamber exhaust port 281 are substantially connected to each other. The cup exhaust port 461 is connected to the fourth exhaust mechanism 95d via the large chamber exhaust port 281.

The elevating mechanism 33 moves the substrate holder 31 relative to the cup part 4b in the up-down direction. In the example illustrated in FIG. 14, the elevating mechanism 33 is disposed adjacent to the substrate rotation mechanism 32. The substrate 9 is moved along with the substrate holder 31 in the up-down direction by the elevating mechanism 33 moving the substrate rotation mechanism 32 in the up-down direction. The substrate 9 is movable between the position illustrated in FIG. 14 and the position illustrated in FIG. 17 in the up-down direction. In the following description, the relative position of the substrate 9 with respect to the cup part 4b in FIG. 17 is referred to as a "first position," and the relative position of the substrate 9 with respect to the cup part 4b illustrated in FIG. 14 is referred to as a "second position." The second position is above the first position.

Figure 17:
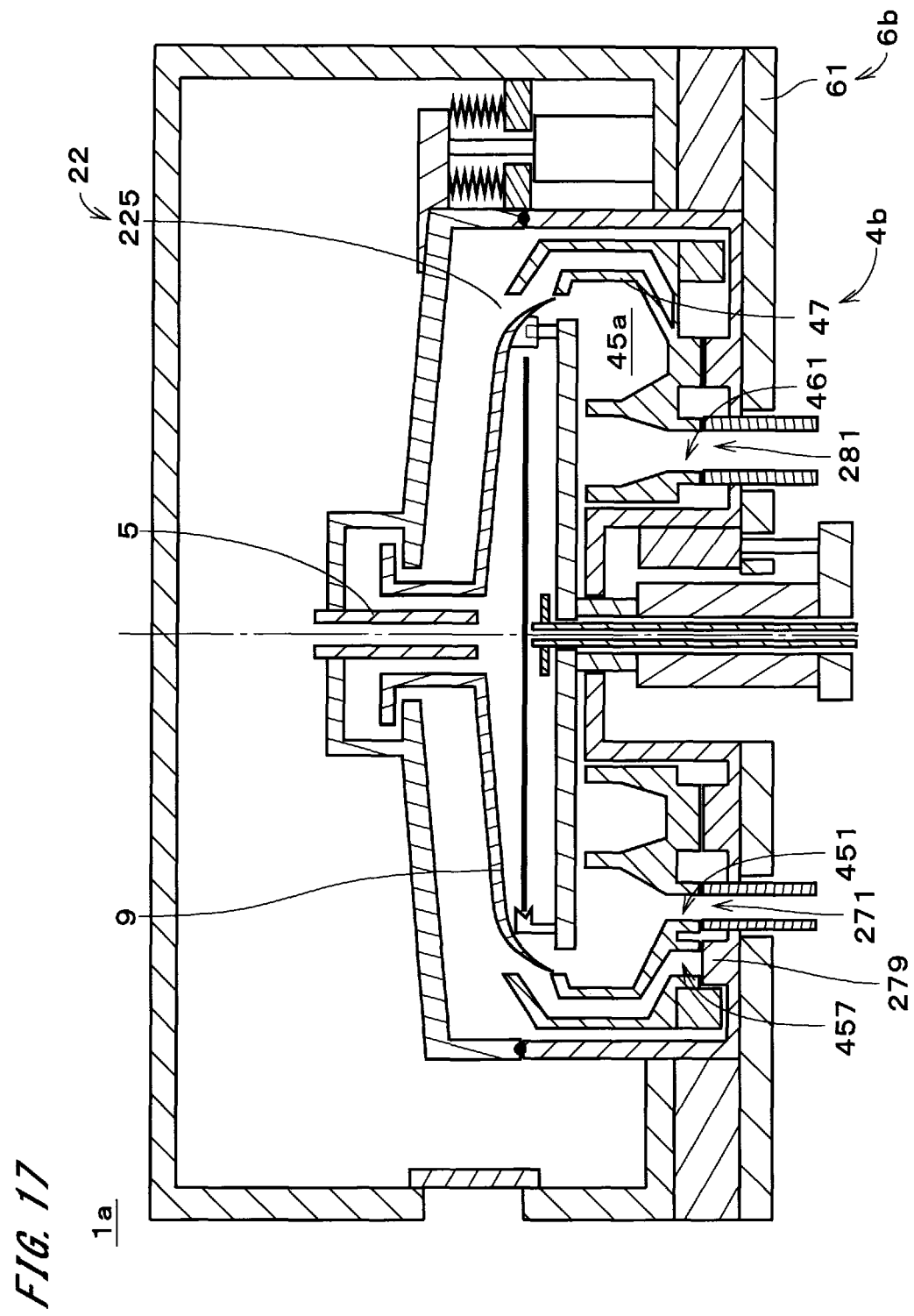
FIG. 17 is a cross-sectional view of the substrate processing apparatus.

In FIG. 17, the orientation of the cup part 4b is different from the orientation thereof illustrated in FIG. 14 and similar to the orientation thereof in FIG. 1. More specifically, the cup exhaust port 461 overlaps in the up-down direction with the large chamber exhaust port 281 connected to the first exhaust mechanism 95a. The inner cup drain port 451 overlaps in the up-down direction with an inner chamber drain port 271 connected to the first drainage part 96a. On the other hand, the outer cup drain port 457 is substantially blocked when overlapping in the up-down direction with an outer projection 279 provided in the chamber bottom 256 of the chamber lower surface part 251. The large chamber exhaust port 281 (see FIG. 16) connected to the fourth exhaust mechanism 95d is substantially blocked when overlapping in the up-down direction with an inner projection 463 of the cup part 4b.

In the state in which the substrate 9 is located at the first position as illustrated in FIG. 17, the lower end portion of the plate side wall part 225 of the top plate 22 is located on the radially inner side of the second partition wall 47 of the cup part 4b and overlaps in the radial direction with the upper end portion of the second partition wall 47. Thus, the first processing liquid supplied from the processing liquid supply part 5 onto the substrate 9 flows into the first outer cup space 45a. The first processing liquid in the first outer cup space 45a is discharged through the inner cup drain port 451 and the inner chamber drain port 271 to the first drainage part 96a. In the same manner, when the substrate 9 is processed using the second processing liquid in the substrate processing apparatus 1a, the substrate 9 is located at the first position, and the second processing liquid flows into the first outer cup space 45a and is discharged to the second drainage part 96b. In the same manner, when the substrate 9 is processed using the third processing liquid, the substrate 9 is located at the first position, and the third processing liquid flows into the first outer cup space 45a and is discharged to the third drainage part 96c.

When a fourth processing liquid is supplied from the processing liquid supply part 5 to the substrate 9 in the substrate processing apparatus 1a, the substrate 9 is located at the second position as illustrated in FIG. 14. In the state in which the substrate 9 is located at the second position, the lower end portion of the plate side wall parts 225 of the top plate 22 is located above the upper end of the second partition wall 47 of the cup part 4b. The lower end portion of the plate side wall part 225 is located on the radially inner side of the cup outer wall part 41 of the cup part 4b and overlaps in the radial direction with the upper end portion of the cup outer wall part 41. Thus, the fourth processing liquid supplied from the processing liquid supply part 5 onto the substrate 9 flows into the second outer cup space 45b.

Since the outer cup drain port 457 overlaps with the outer chamber drain port 277 as described above, the fourth processing liquid in the second outer cup space 45b is discharged through the outer cup drain port 457 and the outer chamber drain port 277 to the fourth drainage part 96d (see FIG. 16) outside the chamber 21b and the housing 6. The fourth processing liquid discharged to the fourth drainage part 96d is recovered and reused.

In the substrate processing apparatus 1a, the space into which the processing liquid in the cup part 4b flows is divided into the first outer cup space 45a and the second outer cup space 45b, and the first outer cup space 45a and the second outer cup space 45b can be selectively used by moving the substrate 9 up and down. This structure suppresses mixing of a plurality of types of processing liquids in the cup part 4b. As a result, the processing liquid (in the above example, the fourth processing liquid) discharged through the outer cup space 45b different from the ones used for the other processing liquids can be recovered and reused with efficiency. It is also possible to reduce heat generation or the like due to undesirable mixing and contact of processing liquids. Note that the fourth processing liquid may be a processing liquid different from the first to third processing liquids, or may be the same type of processing liquid as one of the first to third processing liquids.

Figure 18:
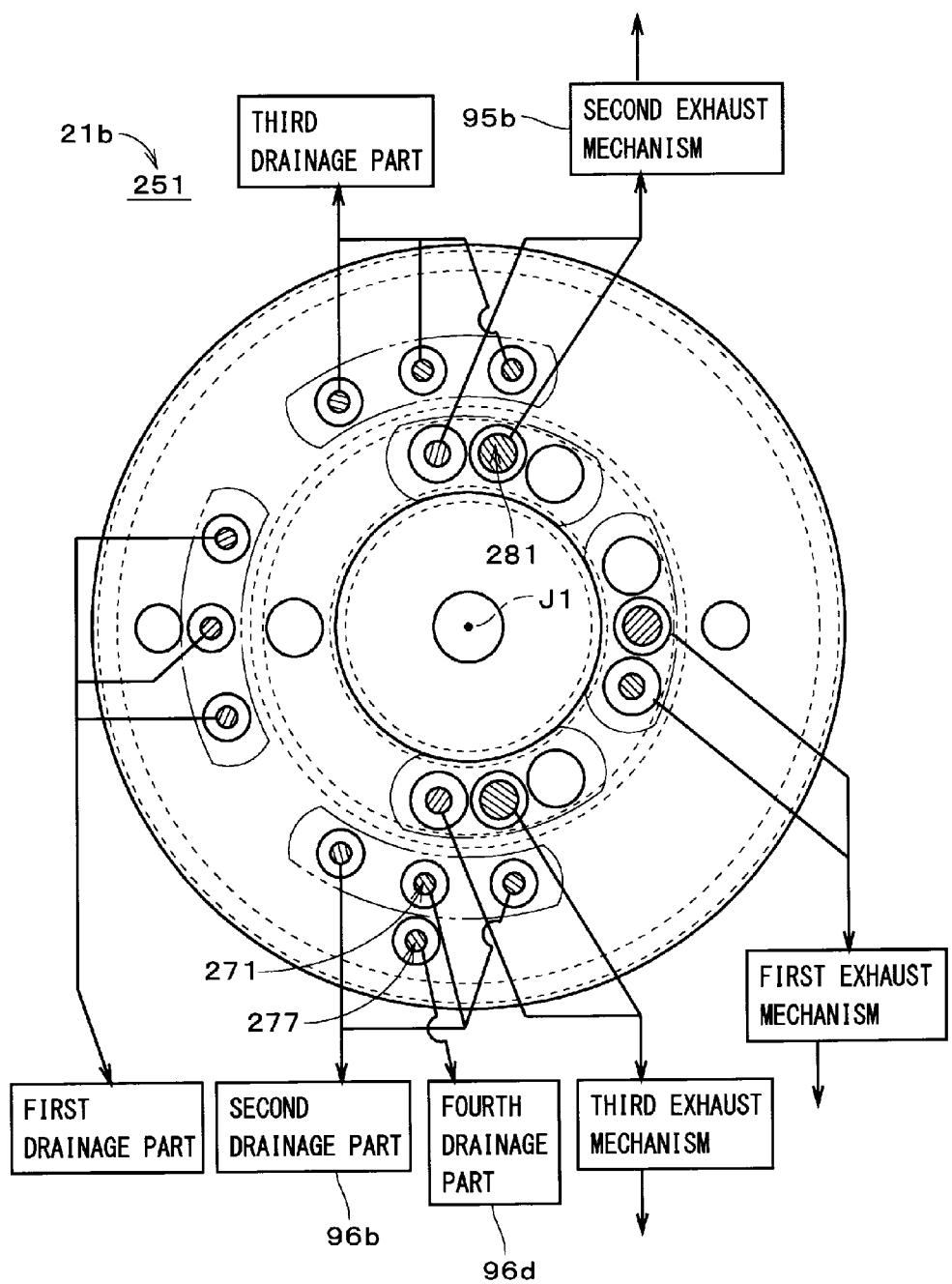
FIG. 18 is a plan view of the chamber lower surface part.

FIG. 18 is a plan view illustrating another preferable example of the chamber lower surface part 251 of the chamber 21b. In the example illustrated in FIG. 18, the outer chamber drain port 277 connected to the fourth drainage part 96d is located at the same circumferential position as one inner chamber drain port 271 that is connected to the second drainage part 96b. The fourth processing liquid received from the substrate 9 located at the aforementioned second position is discharged through the outer cup drain port 457 and the outer chamber drain port 277 to the fourth drainage part 96d. The gas in the chamber 21 is exhausted by the second exhaust mechanism 95b through the large chamber exhaust port 281 that is located on the opposite side of the outer chamber drain port 277 with the central axis J1 located therebetween. The structure illustrated in FIG. 18 is, for example, suitable for the case where there is no need to separately exhaust gas while two types of acid processing liquids are separately recovered by the second drainage part 96b and the fourth drainage part 96d. The structure in FIG. 18 simplifies the exhaust mechanism by omitting the fourth exhaust mechanism.

Figure 19:
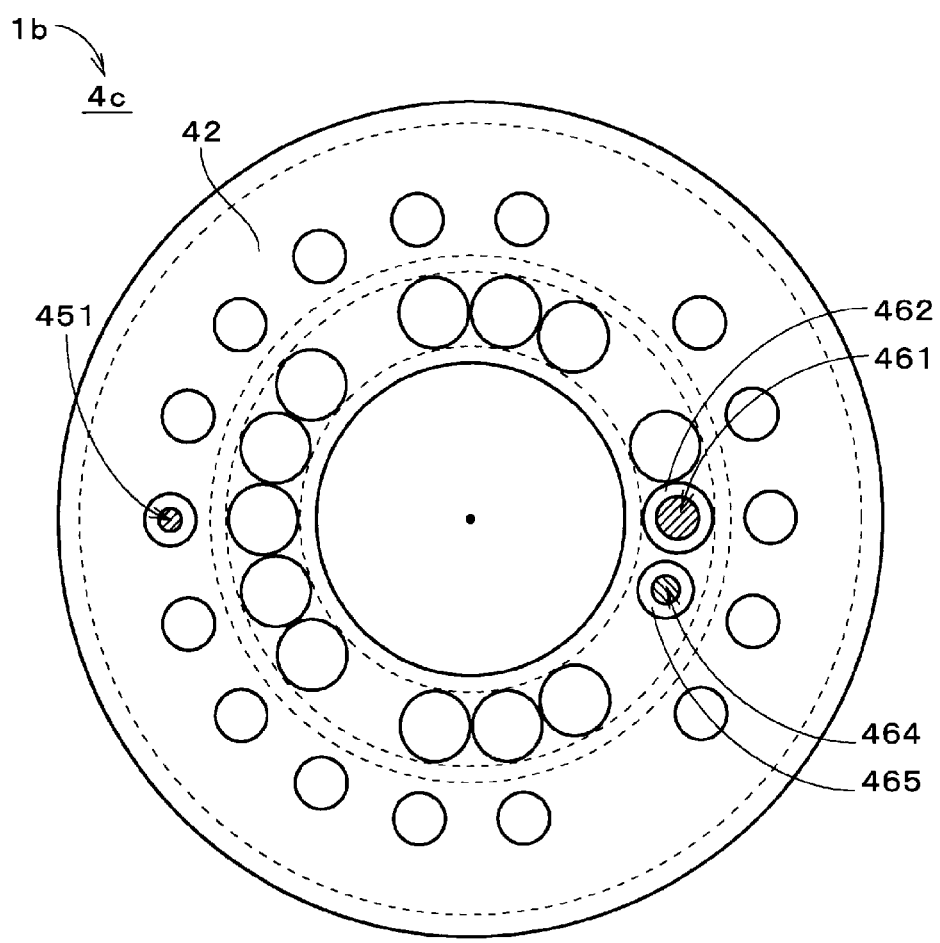
FIG. 19 is a bottom view of the cup part of a substrate processing apparatus according to a third embodiment.
Figure 20:
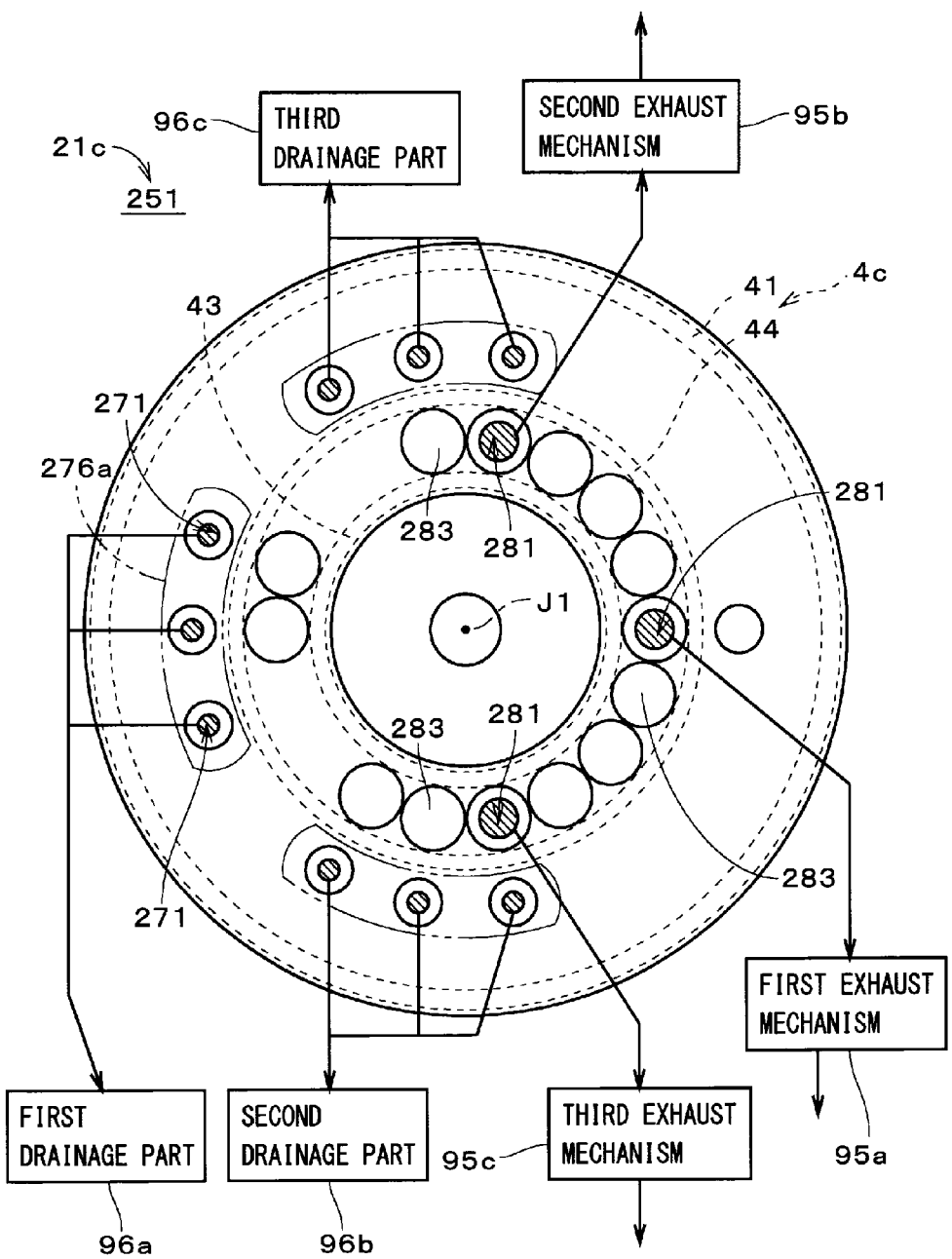
FIG. 20 is a plan view of the chamber lower surface part.

FIG. 19 is a bottom view of a cup part 4c of a substrate processing apparatus 1b according to a third embodiment. FIG. 20 is a plan view of a chamber lower surface part 251 of a chamber 21c of the substrate processing apparatus 1b. A cup outer wall part 41, a partition wall 44, and a cup inner wall part 43 of the cup part 4c are indicated by broken lines in FIG. 20. The substrate processing apparatus 1b has almost the same structure as the substrate processing apparatus 1 illustrated in FIG. 1, except for the inclusion of the cup part 4c and the chamber 21c that have different shapes from the cup part 4 and the chamber 21 illustrated in FIG. 1. In the following description, constituent elements of the substrate processing apparatus 1b that correspond to those of the substrate processing apparatus 1 are given the same reference numerals.

As illustrated in FIG. 19, the cup part 4c has, in addition to the cup drain port 451 and the cup exhaust port 461, a cup exhaust port 464 in the cup bottom 42, the cup exhaust port 464 being arranged along with the cup exhaust port 461 in the circumferential direction. The cup exhaust port 464 is provided in a plurality of bottom protruding parts 465 that are provided in the cup bottom 42 and protrude downward. The cup exhaust port 464 is adjacent to the cup exhaust port 461 in the circumferential direction. In order to facilitate distinction between the cup exhaust ports 461 and 464, the cup exhaust ports 461 and 464 are respectively referred to as a "large cup exhaust port 461" and a "small cup exhaust port 464" in the following description. The large cup exhaust port 461 and the small cup exhaust port 464 are also collectively referred to simply as "cup exhaust ports."

The small cup exhaust port 464 has a smaller diameter than the large cup exhaust port 461. In other words, the area of the lower end of the small cup exhaust port 464 is smaller than the area of the lower end of the large cup exhaust port 461. The outer diameter of the bottom protruding part 465 having the small cup exhaust port 464 therein is smaller than the outer diameter of the bottom protruding part 462 having the large cup exhaust port 461 therein. The lower end surface of the bottom protruding part 465 is approximately perpendicular to the up-down direction.

As illustrated in FIG. 20, the chamber bottom 256 of the chamber lower surface part 251 of the chamber 21c has omitted the small chamber exhaust ports 284 provided in the chamber bottom 256 of the chamber lower surface part 251 of the chamber 21 illustrated in FIG. 4, and has inner projections 283 instead of the small chamber exhaust ports 284. Thus, the first exhaust mechanism 95a, the second exhaust mechanism 95b, and the third exhaust mechanism 95c are each connected to one large chamber exhaust port 281 (hereinafter, simply referred to as a "chamber exhaust port 281").

When the substrate processing apparatus 1b processes the substrate 9 using the first processing liquid, usually the cup part 4c is rotated to the orientation indicated in FIG. 1, and the first processing liquid flowing into the outer cup space 45 is discharged through the cup drain port 451 in FIG. 19 and the central chamber drain port 271 of the first chamber drain port group 276a in FIG. 20 to the first drainage part 96a outside the chamber 21c and the housing 6. The gas in the cup part 4c is discharged to the outside of the chamber 21c and the housing 6 by the first exhaust mechanism 95a through the large cup exhaust port 461 and the chamber exhaust port 281 that is located on the opposite side of the first chamber drain port group 276a, with the central axis J1 located therebetween.

Figure 21:
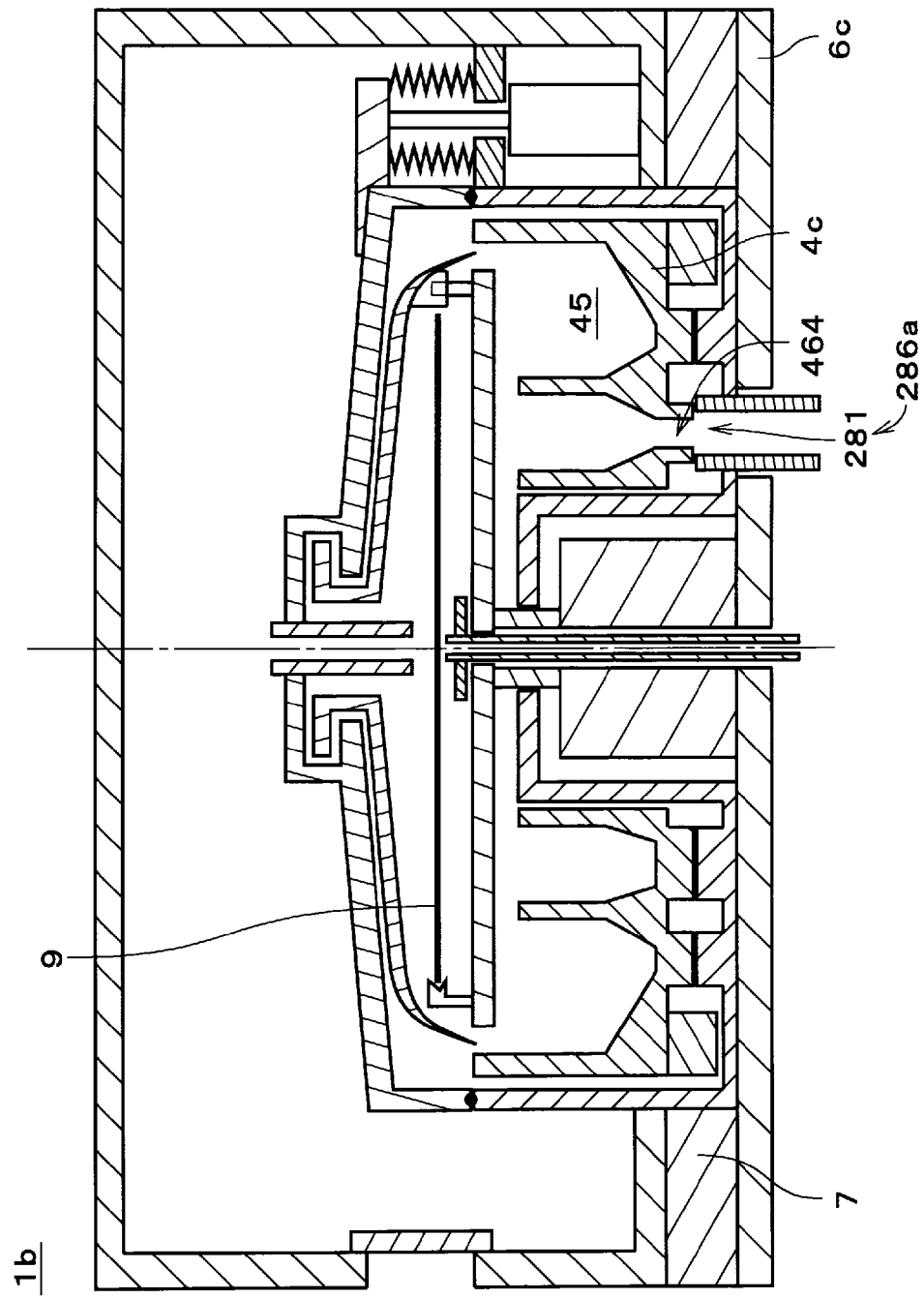
FIG. 21 is a cross-sectional view of the substrate processing apparatus.

When there is demand to reduce the flow rate of exhaust gas exhausted from the chamber 21c via the first exhaust mechanism 95a, the cup rotation mechanism 7 is controlled by the controller 10 so that the small cup exhaust port 464 overlaps in the up-down direction with the chamber exhaust port 281 in the first chamber exhaust port group 286a as illustrated in FIG. 21. The small cup exhaust port 464 is in close proximity to and opposes the chamber exhaust port 281 in the up-down direction. Thus, the small cup exhaust port 464 is substantially connected to the chamber exhaust port 281. The gas in the cup part 4c is discharged through the small cup exhaust port 464 and the chamber exhaust port 281 to the outside of the chamber 21c and the housing 6 by the first exhaust mechanism 95a.

As described above, the area of the lower end of the small cup exhaust port 464 is smaller than the area of the lower end of the large cup exhaust port 461. Thus, the area of overlap between a cup exhaust port and the chamber exhaust port 281 can be changed by the cup rotation mechanism 7 changing the orientation of the cup part 4c from the state in which the large cup exhaust port 461 and the chamber exhaust port 281 overlap with each other to the state in which the small cup exhaust port 464 and the chamber exhaust port 281 overlap with each other. This reduces the flow rate of exhaust gas exhausted from the chamber 21c via the first exhaust mechanism 95a.

The cup drain port 451 illustrated in FIG. 19 overlaps with the lower chamber drain port 271 in FIG. 20 among the three chamber drain ports 271 in the first chamber drain port group 276a illustrated in FIG. 20. The first processing liquid flowing in the outer cup space 45 of the cup part 4c is discharged through the cup drain port 451 and this chamber drain port 271 to the first drainage part 96a outside the chamber 21c and the housing 6.

In this way, the substrate processing apparatus 1b can easily change the flow rate of exhaust gas from the chamber 21c according to, for example, the content of processing performed on the substrate 9 by controlling the cup rotation mechanism 7 via the controller 10 to change the area of overlap between the cup exhaust port and the chamber exhaust port 281, as in the substrate processing apparatus 1 illustrated in FIG. 1. In the substrate processing apparatus 1b, changing the area of overlap between the cup exhaust port and the chamber exhaust port 281 corresponds to causing either the large cup exhaust port 461 or the small cup exhaust port 464 to selectively overlap with the chamber exhaust port 281 in the first chamber exhaust port group 286a. Accordingly, the flow rate of exhaust gas from the chamber 21c can be easily changed with a simple structure without changing the suction force of the first exhaust mechanism 95a.

Figure 22:
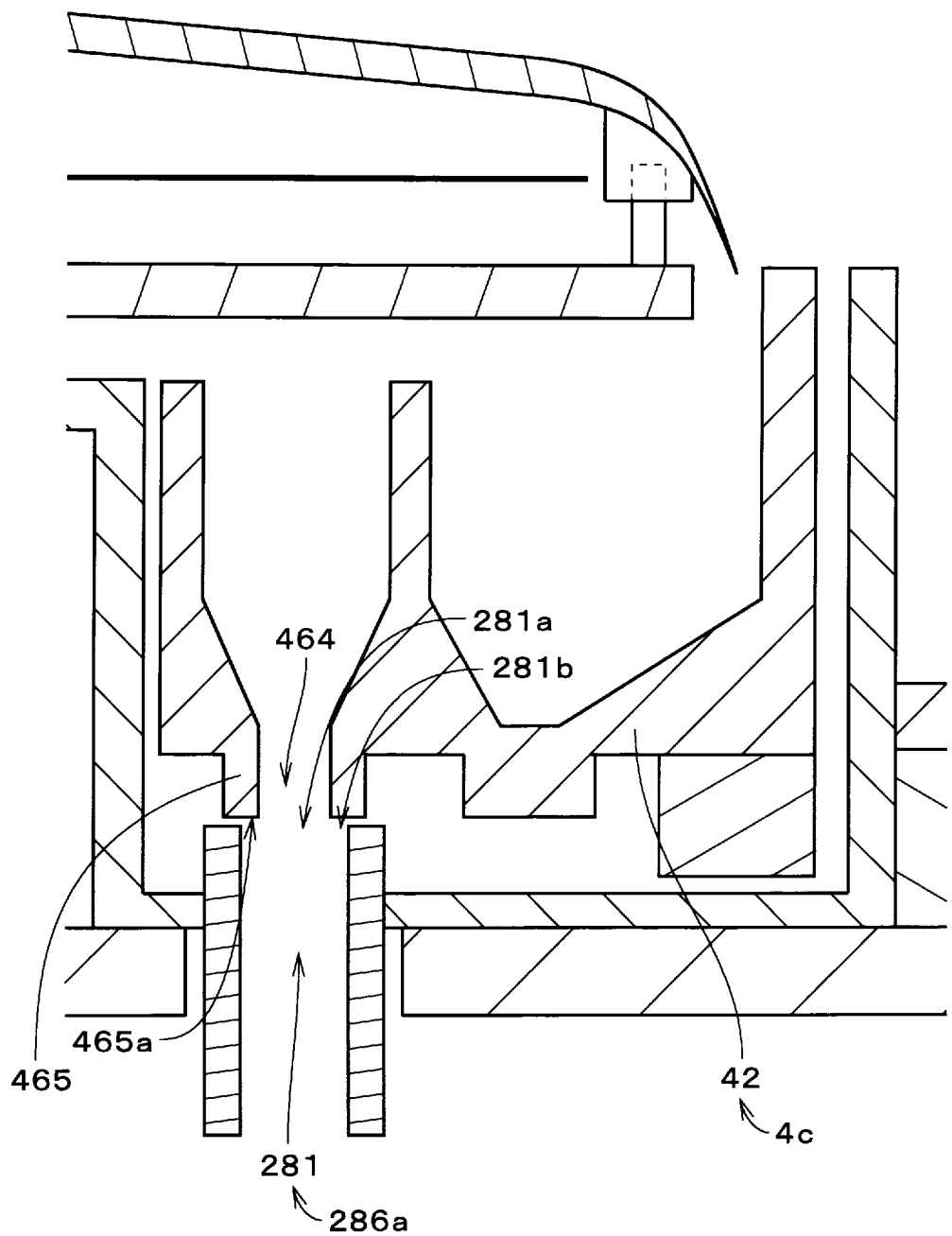
FIG. 22 is an enlarged cross-sectional view of part of the substrate processing apparatus.

FIG. 22 is an enlarged view of the small cup exhaust port 464 and the chamber exhaust port 281 of the first chamber exhaust port group 286a that overlaps in the up-down direction with the small cup exhaust port 464. As illustrated in FIG. 22, a lower end surface 465a of the bottom protruding part 465 having the small cup exhaust port 464 therein is approximately perpendicular to the up-down direction as described above. A generally circular region in the central portion of the upper end of the chamber exhaust port 281 is an overlap region 281a that overlaps with the lower end of the small cup exhaust port 464. A circular ring-shaped region of the upper end of the chamber exhaust port 281 around the overlap region 281a (i.e., the region excluding the overlap region 281a) is a non-overlap region 281b that does not overlap with the lower end of the small cup exhaust port 464.

The non-overlap region 281b of the chamber exhaust port 281 is in close proximity to and opposes the lower end surface 465a of the bottom protruding part 465 of the cup bottom 42 in the up-down direction. Thus, the non-overlap region 281b of the chamber exhaust port 281 is substantially blocked. This prevents or suppresses the suction of the gas below the cup part 4c into the chamber exhaust port 281 through the non-overlap region 281b of the chamber exhaust port 281 when gas is exhausted through the small cup exhaust port 464 and the chamber exhaust port 281 by the first exhaust mechanism 95a. As a result, the gas in the cup part 4c can be discharged with efficiency. The substrate processing apparatus 1b can easily block the non-overlap region 281b of the chamber exhaust port 281 by using a simple structure, i.e., the lower end surface 465a of the bottom protruding part 465.

The small cup exhaust port 464 does not necessarily need to be provided within the bottom protruding part 465 as long as the small cup exhaust port 464 is provided in the cup bottom 42. Even if the bottom protruding part 465 is omitted, the non-overlap region 281b of the chamber exhaust port 281 is substantially blocked by coming in close proximity to the cup bottom 42 around the small cup exhaust port 464. Even in this case, the gas in the cup part 4c can be discharged with efficiency as described above.

The substrate processing apparatus 1b may sometimes be required to make fine adjustments of the flow rate of exhaust gas exhausted from the chamber 21c via the first exhaust mechanism 95a, as is the case with the above-described substrate processing apparatus 1. In this case, the cup rotation mechanism 7 rotates the cup part 4c by a slight angle (e.g., five degrees) from the state in which one chamber exhaust port out of the large cup exhaust port 461 and the small cup exhaust port 464 illustrated in FIG. 19 overlaps with the chamber exhaust port 281 connected to the first exhaust mechanism 95a illustrated in FIG. 20, while maintaining the overlap between the one cup exhaust port and the chamber exhaust port 281.

This slight-angle rotation of the cup part 4c changes the area of overlap between the above one cup exhaust port and the chamber exhaust port 281. As a result, the flow rate of exhaust gas exhausted from the chamber 21c via the first exhaust mechanism 95a can be adjusted finely with a simple structure.

In this case, as in FIG. 10, the non-overlap region of the upper end of the chamber exhaust port 281, excluding the region of overlap with the one cup exhaust port, is substantially blocked by coming in close proximity to and opposing in the up-down direction the lower end surface of the bottom protruding part having the one cup exhaust port therein (i.e., the surface that is part of the cup bottom 42 and approximately perpendicular to the up-down direction). The non-overlap region of the lower end of the one cup exhaust port, excluding the region of overlap with the chamber exhaust port 281, is also substantially blocked by coming in close proximity to and opposing in the up-down direction the upper end surface of the bottom protruding part 282 having the chamber exhaust port 281 thereof (i.e., the surface that is part of the chamber bottom 256 and approximately perpendicular to the up-down direction).

While the above has been a description of changing the flow rate via the first exhaust mechanism 95a during the processing using the first processing liquid in the case where the cup part 4c and the chamber 21c are provided, the same applies to the case of changing the flow rate via the second exhaust mechanism 95b during the processing using the second processing liquid. The same also applies to the case of changing the flow rate via the third exhaust mechanism 95c during the processing using the third processing liquid.

Figure 23:
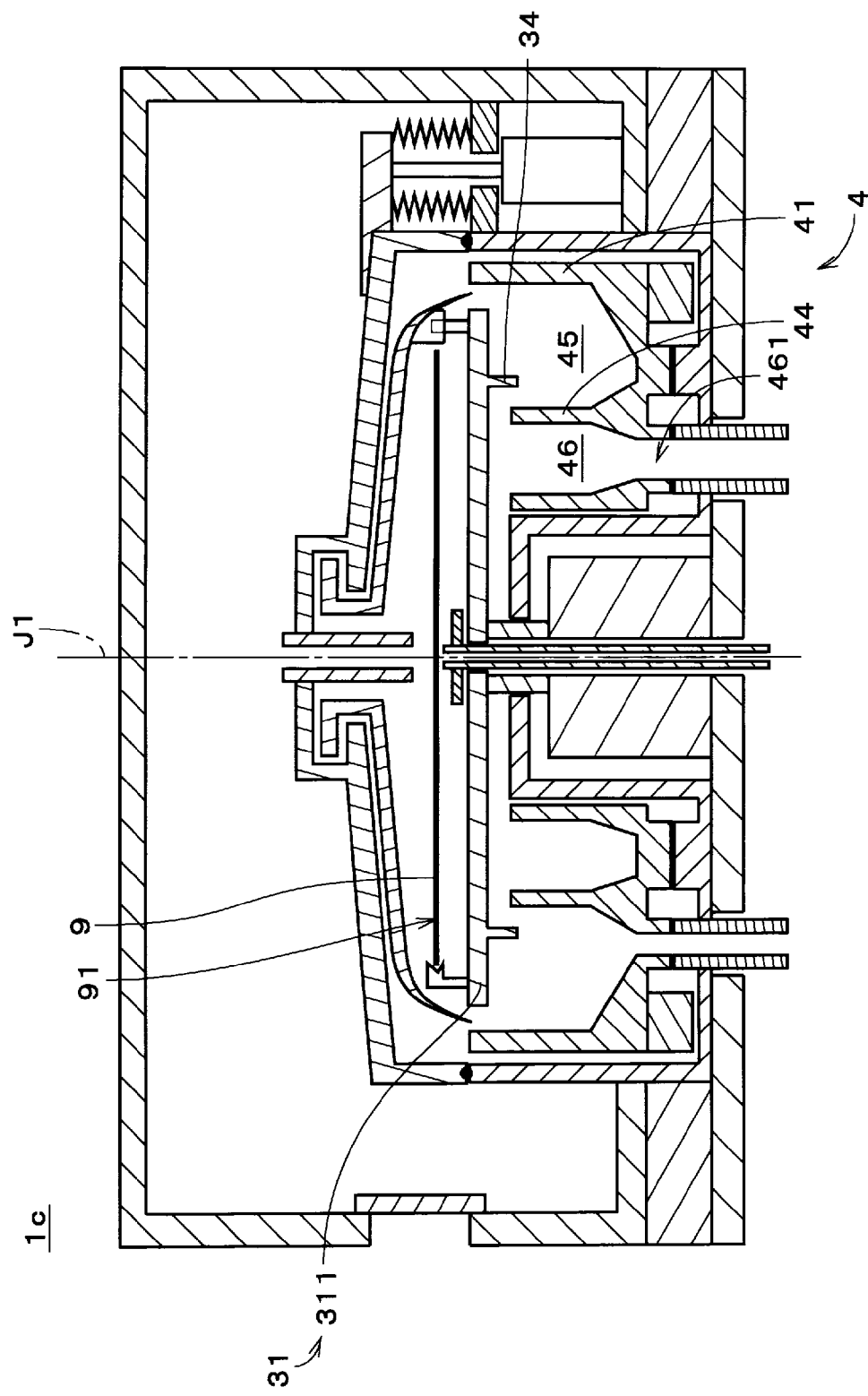
FIG. 23 is a cross-sectional view of a substrate processing apparatus according to a fourth embodiment.

FIG. 23 is a cross-sectional view of a substrate processing apparatus 1c according to a fourth embodiment. The substrate processing apparatus 1c has almost the same structure as the substrate processing apparatus 1 illustrated in FIG. 1, except that a protruding part 34 is additionally included. In the following description, constituent elements of the substrate processing apparatus 1c that correspond to those of the substrate processing apparatus 1 are given the same reference numerals.

The protruding part 34 protrudes downward (i.e., toward the cup part 4) from the lower surface of the base part 311 of the substrate holder 31. The protruding part 34 has a ring shape surrounding the central axis J1. To be more specific, the protruding part 34 is a generally cylindrical part centered on the central axis J1. The protruding part 34 may, for example, be formed integrally with the base part 311. In the example illustrated in FIG. 23, the protruding part 34 is provided on the radially outer side of the partition wall 44 of the cup part 4 and on the radially inner side of the cup outer wall part 41. The protruding part 34 may be spaced above the partition wall 44 at the same radial position as the partition wall 44 of the cup part 4.

There are cases where the substrate processing apparatus 1c reduces the rotational speed of the substrate 9 (or stops the rotation of the substrate 9) while processing the substrate 9 so that an upper surface 91 of the substrate 9 is puddled with the processing liquid, as in the above-described substrate processing apparatus 1. At this time, the processing liquid flowing from the surface of the substrate 9 to the upper surface of the base part 311 may make its way to the lower surface of the base part 311 (i.e., flow along the surface of the base part 311 to the lower surface thereof).

In the substrate processing apparatus 1c that includes the ring-shaped protruding part 34 that protrudes downward from the lower surface of the base part 311 as described above, processing liquids making their way to the lower surface of the base part 311 will flow along the outer circumferential surface of the protruding part 34 and drop in the outer cup space 45 of the cup part 4. In this way, the substrate processing apparatus 1c can prevent processing liquids that have made their way to the lower surface of the base part 311 from flowing to the radially inner side of the protruding part 34. Since the protruding part 34 is provided on the radially outer side of the partition wall 44 of the cup part 4 or at the same radial position as the partition wall 44, the processing liquid is prevented from dropping in the inner cup space 46 and flowing into the exhaust mechanism through the cup exhaust port 461. The above-described substrate processing apparatuses 1, 1a, and 1b may also include the protruding part 34.

Figure 24:
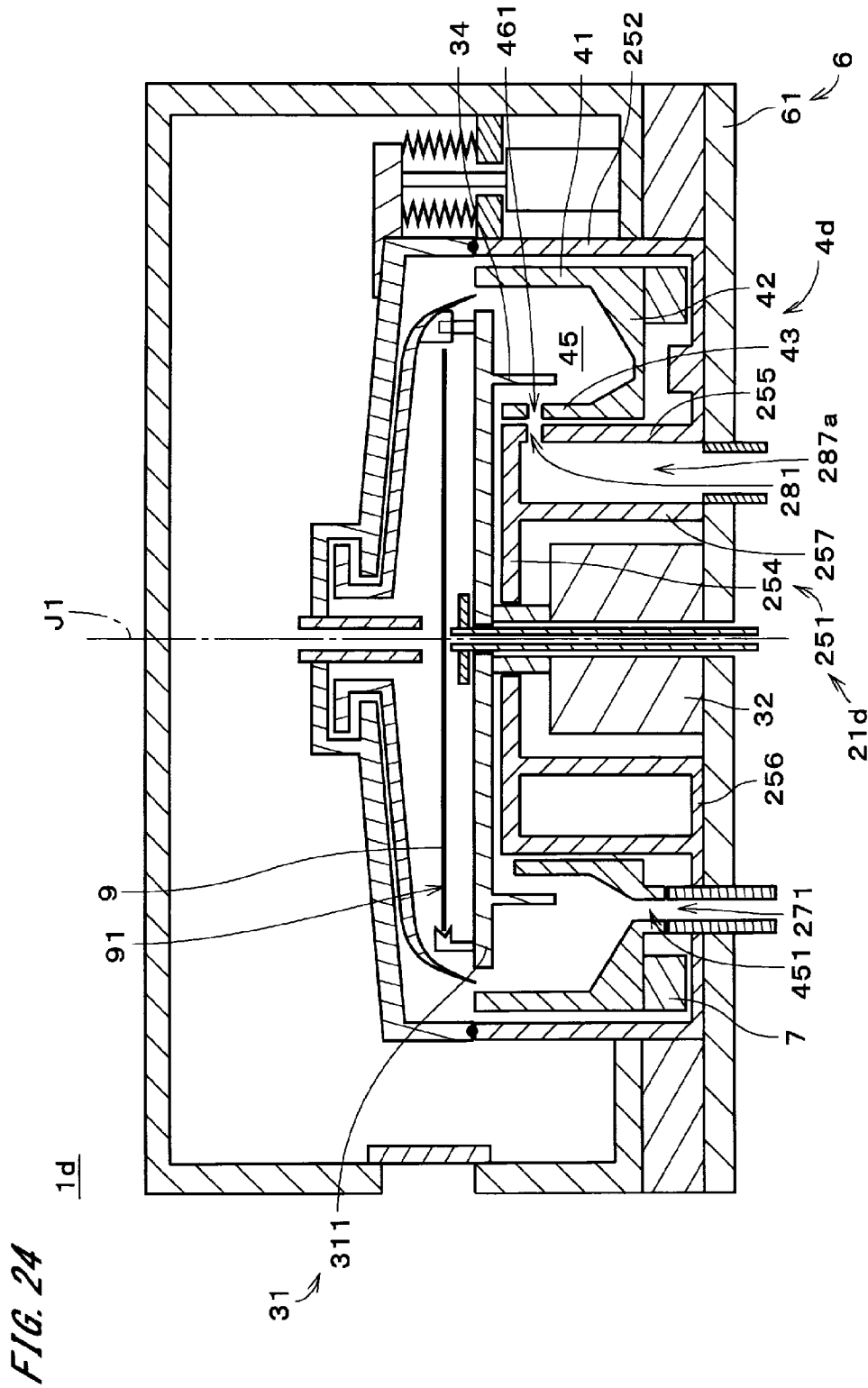
FIG. 24 is a cross-sectional view of a substrate processing apparatus according to a fifth embodiment.
Figure 25:
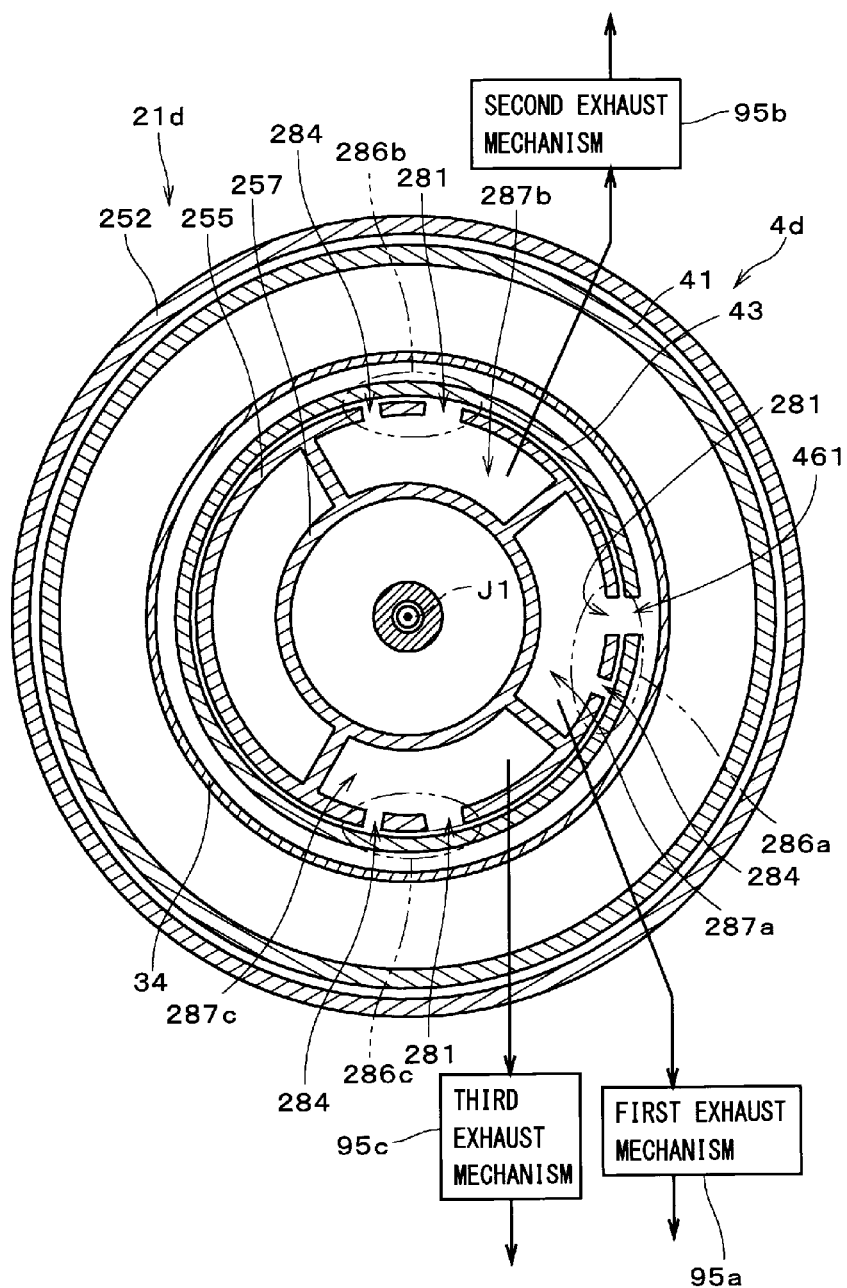
FIG. 25 is a transverse cross-sectional view of the chamber and the cup part.

FIG. 24 is a cross-sectional view of a substrate processing apparatus 1d according to a fifth embodiment. The substrate processing apparatus 1d includes a cup part 4d and a chamber 21d that have different shapes from the cup part 4 and the chamber 21 illustrated in FIG. 1. In the substrate processing apparatus 1d, the cup exhaust port 461 is provided in the cup inner wall part 43, and the chamber exhaust ports 281 and 284 are provided in the chamber inner wall parts 255 that oppose the cup inner wall part 43 in the radial direction on the radially inner side of the cup inner wall part 43 (the chamber exhaust ports 284 are illustrated in FIG. 25). The substrate processing apparatus 1d includes a protruding part 34, similarly to the substrate processing apparatus 1c illustrated in FIG. 23. The other constituent elements of the substrate processing apparatus 1d are almost the same as those of the substrate processing apparatus 1 illustrated in FIG. 1. In the following description, constituent elements of the substrate processing apparatus 1d that correspond to those of the substrate processing apparatus 1 are given the same reference numerals.

Figure 26:
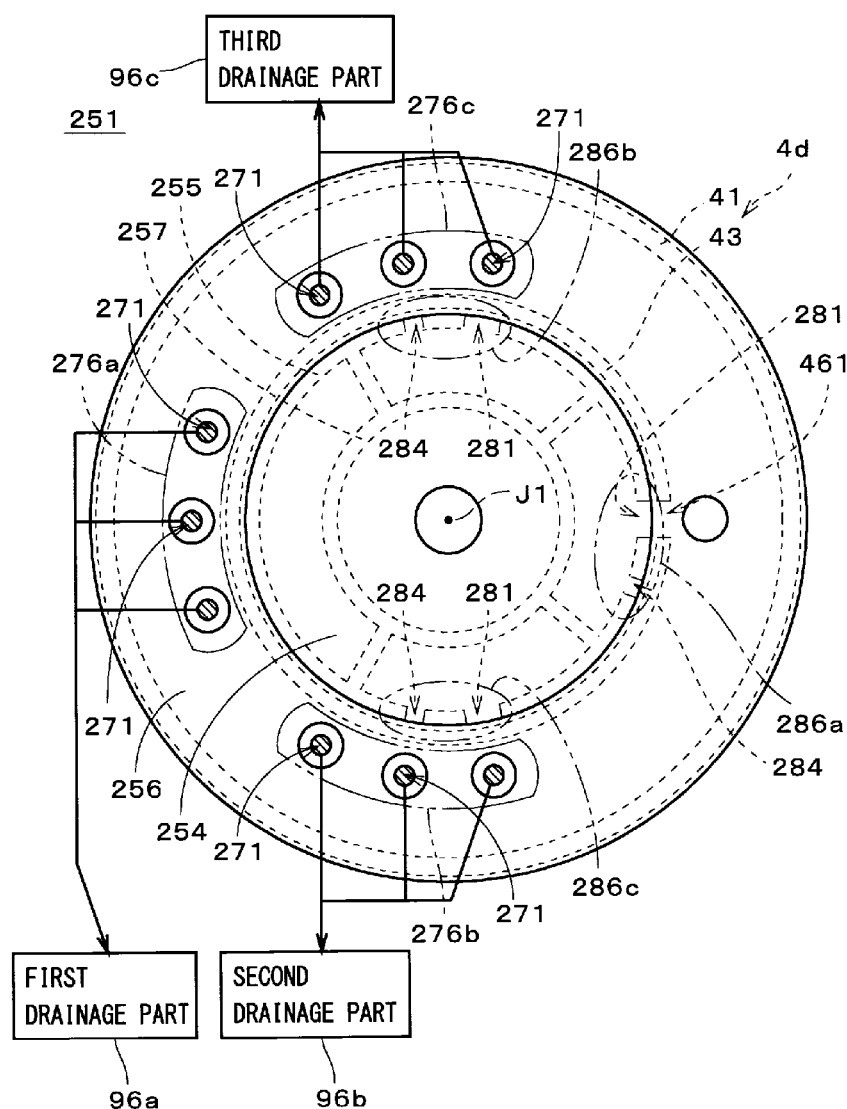
FIG. 26 is a plan view of the chamber lower surface part.

FIG. 25 is a transverse cross-sectional view of a cross-section of the chamber 21d and the cup part 4d, taken at the position of the cup exhaust port 461 and the chamber exhaust ports 281 and 284. FIG. 26 is a plan view of the chamber lower surface part 251. A cup outer wall part 41, a cup inner wall part 43, a chamber inner wall part 255, and a duct inner wall part 257 are indicated by broken lines in FIG. 26.

As illustrated in FIGS. 24 to 26, the cup part 4d has omitted the partition wall 44 illustrated in FIG. 1, and has only a cup space 45 as its internal space. The generally cylindrical cup inner wall part 43 is located on the radially outer side of the position of the cylindrical cup inner wall part 43 illustrated in FIG. 1. The generally cylindrical chamber inner wall part 255 of the chamber lower surface part 251 is located on the radially outer side of the position of the cylindrical chamber inner wall part 255 illustrated in FIG. 1. The generally cylindrical duct inner wall part 257 is provided between the chamber inner wall part 255 and the substrate rotation mechanism 32. The duct inner wall part 257 extends downward from the lower surface of the lower surface central part 254. The chamber bottom 256 also extends on the radially inner side from the chamber inner wall parts 255, and the lower end portion of the duct inner wall part 257 is connected to the chamber bottom 256.

The space between the chamber inner wall parts 255 and the duct inner wall part 257 (i.e., the space surrounded by the chamber inner wall parts 255, the lower surface central part 254, the duct inner wall part 257, and the chamber bottom 256) is divided into a plurality of separate spaces. In the example illustrated in FIG. 25, the space between the chamber inner wall parts 255 and the duct inner wall part 257 includes a first duct 287a, a second duct 287b, and a third duct 287c. As illustrated in FIG. 24, the first duct 287a has a through hole that passes through the chamber bottom 256 and the housing bottom 61, and is connected via this through hole to a first exhaust mechanism 95a illustrated in FIG. 25. The second duct 287b is connected to a second exhaust mechanism 95b via another similar through hole that is provided in the bottom, and the third duct 287c is connected to a third exhaust mechanism 95c via yet another similar through hole that is provided in the bottom.

The cup exhaust port 461 may, for example, be a through hole that passes through the cup inner wall part 43. This through hole may, for example, have a circular cross-section. The cross-sectional shape of the through hole may be changed appropriately. For example, only one cup exhaust port 461 may be provided in the vicinity of the upper end of the cup inner wall part 43. The cup exhaust port 461 opposes in the radial direction the inner circumferential surface of the protruding part 34 located on the radially outer side of the cup inner wall part 43. In other words, the lower end of the protruding part 34 is located below the lower end of the cup exhaust port 461 or at the same position in the up-down direction as the lower end of the cup exhaust port 461.

The chamber exhaust ports 281 and 284 may, for example, be through holes that pass through the chamber inner wall part 255. These through holes may, for example, have circular cross-sections. The cross-sectional shapes of the through holes may be changed appropriately. The chamber exhaust ports 281 and 284 may, for example, be arranged in the circumferential direction in the vicinity of the upper end of the chamber inner wall parts 255. The chamber exhaust ports 281 and 284 are disposed at almost the same position in the up-down direction as the cup exhaust port 461. In the example illustrated in FIG. 25, three large chamber exhaust ports 281 and three small chamber exhaust ports 284 are alternately arranged in the circumferential direction. The cross-sectional shape and area of the large chamber exhaust ports 281 are almost the same as the cross-sectional shape and area of the cup exhaust port 461. The cross-sectional area of the small chamber exhaust ports 284 is smaller than the cross-sectional areas of the cup exhaust port 461 and the large chamber exhaust ports 281.

In the following description, one large chamber exhaust port 281 and one small chamber exhaust port 284 that are connected to the first duct 287a are collectively referred to as a "first chamber exhaust port group 286a." One large chamber exhaust port 281 and one small chamber exhaust port 284 that are connected to the second duct 287b are collectively referred to as a "second chamber exhaust port group 286b." One large chamber exhaust port 281 and one small chamber exhaust port 284 that are connected to the third duct 287c are collectively referred to as a "third chamber exhaust port group 286c." The first chamber exhaust port group 286a, the second chamber exhaust port group 286b, and the third chamber exhaust port group 286c are also collectively referred to as "chamber exhaust port groups 286a to 286c." Each of the chamber exhaust port groups 286a to 286c is enclosed by a dashed double-dotted line in FIGS. 25 and 26.

The large chamber exhaust port 281 and the small chamber exhaust port 284 in the first chamber exhaust port group 286a are connected to the first exhaust mechanism 95a via the first duct 287a. The large chamber exhaust port 281 and the small chamber exhaust port 284 in the second chamber exhaust port group 286b are connected to the second exhaust mechanism 95b via the second duct 287b. The large chamber exhaust port 281 and the small chamber exhaust port 284 in the third chamber exhaust port group 286c are connected to the third exhaust mechanism 95c via the third duct 287c. The exhaust mechanisms 95a to 95c are disposed outside the substrate processing apparatus 1d. The exhaust mechanisms 95a to 95c continue the suction of gas while the substrate processing apparatus 1d is in use.

As illustrated in FIG. 26, the chamber bottom 256 has a plurality of (e.g., nine) chamber drain ports 271, and the chamber drain ports 271 include the first chamber drain port group 276a, the second chamber drain port group 276b, and the third chamber drain port group 276c, as in FIG. 4. The first chamber drain port group 276a, the second chamber drain port group 276b, and the third chamber drain port group 276c are located respectively on the opposite sides of the first chamber exhaust port group 286a, the second chamber exhaust port group 286b, and the third chamber exhaust port group 286c, with the central axis J1 located therebetween.

In each of the chamber drain port groups 276a to 276c, three chamber drain ports 271 are equiangularly arranged in the circumferential direction. The three chamber drain ports 271 in the first chamber drain port group 276a are connected to the first drainage part 96a. The three chamber drain ports 271 in the second chamber drain port group 276b are connected to the second drainage part 96b. The three chamber drain ports 271 in the third chamber drain port group 276c are connected to the third drainage part 96c. The first drainage part 96a, the second drainage part 96b, and the third drainage part 96c are provided independently of one another.

The substrate processing apparatus 1d causes the cup exhaust port 461 to selectively overlap with one of the large chamber exhaust ports 281 and the small chamber exhaust ports 284 by controlling the cup rotation mechanism 7 via the controller 10 (see FIG. 1). Also, the cup drain port 451 is caused to selectively overlap with one of the chamber drain ports 271.

In the state in which the cup exhaust port 461 overlaps in the radial direction with the large chamber exhaust port 281 in the first chamber exhaust port group 286a, the cup drain port 451 overlaps in the up-down direction with the central chamber drain port 271 in the first chamber drain port group 276a. The gas in the cup part 4d is discharged through the cup exhaust port 461, the above large chamber exhaust port 281, and the first duct 287a by the first exhaust mechanism 95a. The liquid in the cup part 4d is discharged through the cup drain port 451 and the above chamber drain port 271 by the first drainage part 96a.

In the state in which the cup exhaust port 461 overlaps in the radial direction with the small chamber exhaust port 284 in the first chamber exhaust port group 286a, the cup drain port 451 overlaps in the up-down direction with the upper chamber drain port 271 in FIG. 26 of the first chamber drain port group 276a. The gas in the cup part 4d is discharged through the cup exhaust port 461, the above small chamber exhaust port 284, and the first duct 287a by the first exhaust mechanism 95a. Since the cross-sectional area of the small chamber exhaust port 284 is smaller than the cross-sectional area of the large chamber exhaust port 281 as described above, the flow rate of exhaust gas can be reduced by using the small chamber exhaust port 284. The liquid in the cup part 4d is discharged by the first drainage part 96a. In other words, only the flow rate of exhaust gas can be changed by rotating the cup part 4d, without changing the exhaust destination.

In the state in which the cup drain port 451 overlaps in the up-down direction with the lower chamber drain port 271 in FIG. 26 of the first chamber drain port group 276a, the cup exhaust port 461 is located at a position spaced in the circumferential direction from the large chamber exhaust port 281 and the small chamber exhaust port 284 in the first chamber exhaust port group 286a. In this state, the cup exhaust port 461 is in close proximity to and opposes the outer circumferential surface of the chamber inner wall part 255 in the radial direction, without overlapping with any of the chamber exhaust ports 281 and 284, and is substantially blocked by the chamber inner wall part 255. This substantially stops the suction of the gas in the cup part 4d through the cup exhaust port 461. As a result, the liquid in the cup part 4d is discharged by the first drainage part 96a while the discharge of the gas in the cup part 4d is substantially stopped.

In the state in which the cup exhaust port 461 overlaps in the radial direction with the large chamber exhaust port 281 in the second chamber exhaust port group 286b, the cup drain port 451 overlaps in the up-down direction with the central chamber drain port 271 in the second chamber drain port group 276b. The gas in the cup part 4d is discharged at a relatively high flow rate by the second exhaust mechanism 95b, and the liquid in the cup part 4d is discharged by the second drainage part 96b.

In the state in which the cup exhaust port 461 overlaps in the radial direction with the small chamber exhaust port 284 in the second chamber exhaust port group 286b, the cup drain port 451 overlaps in the up-down direction with the right chamber drain port 271 in FIG. 26 of the second chamber drain port group 276b. The gas in the cup part 4d is discharged at a relatively low flow rate by the second exhaust mechanism 95b, and the liquid in the cup part 4d is discharged by the second drainage part 96b. That is, only the flow rate of exhaust gas can be changed by rotating the cup part 4d, without changing the exhaust destination.

In the state in which the cup drain port 451 overlaps in the up-down direction with the left chamber drain port 271 in FIG. 26 of the second chamber drain port group 276b, the cup exhaust port 461 overlaps with neither the chamber exhaust ports 281 nor 284 and is substantially blocked when the cup exhaust port 461 is in close proximity to the outer circumferential surface of the chamber inner wall part 255. This substantially stops the suction of the gas in the cup part 4d through the cup exhaust port 461. As a result, the liquid in the cup part 4d is discharged by the second drainage part 96b while the discharge of the gas in the cup part 4d is substantially stopped.

In the state in which the cup exhaust port 461 overlaps in the radial direction with the large chamber exhaust port 281 in the third chamber exhaust port group 286c, the cup drain port 451 overlaps in the up-down direction with the central chamber drain port 271 in the third chamber drain port group 276c. The gas in the cup part 4d is discharged at a relatively high flow rate by the third exhaust mechanism 95c, and the liquid in the cup part 4d is discharged by the third drainage part 96c.

In the state in which the cup exhaust port 461 overlaps in the radial direction with the small chamber exhaust port 284 in the third chamber exhaust port group 286c, the cup drain port 451 overlaps in the up-down direction with the right chamber drain port 271 in FIG. 26 of the third chamber drain port group 276c. The gas in the cup part 4d is discharged at a relatively low flow rate by the third exhaust mechanism 95c, and the liquid in the cup part 4d is discharged by the third drainage part 96c. That is, only the flow rate of exhaust gas can be changed by rotating the cup part 4d, without changing the exhaust destination.

In the state in which the cup drain port 451 overlaps in the up-down direction with the left chamber drain port 271 in FIG. 26 of the third chamber drain port group 276c, the cup exhaust port 461 overlaps with neither the chamber exhaust ports 281 nor 284 and is substantially blocked when the cup exhaust port 461 is in close proximity to the outer circumferential surface of the chamber inner wall part 255. This substantially stops the suction of the gas in the cup part 4d through the cup exhaust port 461. As a result, the liquid in the cup part 4d is discharged by the third drainage part 96c while the discharge of the gas in the cup part 4d is substantially stopped.

The substrate processing apparatus 1d, like the substrate processing apparatus 1 illustrated in FIG. 1, can easily switch the exhaust mechanism for exhausting gas from the cup part 4d among the first exhaust mechanism 95a, the second exhaust mechanism 95b, and the third exhaust mechanism 95c by rotating the cup part 4d within the chamber 21d and the housing 6 via the cup rotation mechanism 7 without opening the chamber 21d and the housing 6. Also, the exhaust destination from the cup part 4d can be switched with a simple-structure mechanism, and this simplifies the structure of the substrate processing apparatus 1d and makes the apparatus more compact. Moreover, undesirable mixing and contact of gaseous and misty processing liquids that are being discharged can be suppressed by switching the exhaust destination from the cup part 4d within the chamber 21d.

As described above, in the substrate processing apparatus 1d, the cup exhaust port 461 is provided in the cup inner wall part 43, and the chamber exhaust ports 281 and 284 in the first chamber exhaust port group 286a, the second chamber exhaust port group 286b, and the third chamber exhaust port group 286c are provided in the chamber inner wall part 255 that opposes the cup inner wall part 43. By providing the cup exhaust port 461 and the chamber exhaust ports 281 and 284 above the cup bottom 42, it is possible to suppress the entry of processing liquids into the exhaust mechanisms 95a to 95c through the cup exhaust port 461 and the chamber exhaust ports 281 and 284. It is also possible to further suppress the entry of processing liquids into the exhaust mechanisms 95a to 95c by providing the cup exhaust port 461 and the chamber exhaust ports 281 and 284 below the substrate holder 31.

Like the substrate processing apparatus 1c illustrated in FIG. 23, the substrate processing apparatus 1d includes a ring-shaped protruding part 34 that protrudes downward from the lower surface of the base part 311. Thus, processing liquids making their way to the lower surface of the base part 311 will flow along the outer circumferential surface of the protruding part 34 and drop in the cup space 45 of the cup part 4d. In this way, the substrate processing apparatus 1d can prevent processing liquids that have made their way to the lower surface of the base part 311 from flowing to the radially inner side of the protruding part 34. As a result, it is possible to further suppress the entry of processing liquids into the exhaust mechanisms 95a to 95c through the cup exhaust port 461 and the chamber exhaust ports 281 and 284. The lower end of the protruding part 34 is located below the lower end of the cup exhaust port 461 or at the same position in the up-down direction as the lower end of the cup exhaust port 461. This further suppresses the entry of processing liquids into the exhaust mechanisms 95a to 95c through the cup exhaust port 461 and the chamber exhaust ports 281 and 284.

In the substrate processing apparatus 1d, the three chamber drain ports 271 in the first chamber drain port group 276a may be replaced by one generally arc-like chamber drain port 271a (see FIG. 13) that is long in the circumferential direction. The same applies to the second chamber drain port group 276b and the third chamber drain port group 276c. The structure of the substrate processing apparatus 1d may be applied to the above-described substrate processing apparatus 1a.

Like the substrate processing apparatus 1b illustrated in FIGS. 19 and 20, the substrate processing apparatus 1d may be configured such that the cup inner wall part 43 of the cup part 4d has two large and small cup exhaust ports 461, each of the chamber exhaust port groups 286a to 286c includes only one chamber exhaust port 281, and the exhaust flow rate is changed by causing one of the above two cup exhaust ports 461 to selectively overlap with the chamber exhaust port 281.

The substrate processing apparatuses 1 and 1a to 1 d described above can be modified in various ways.

In the substrate processing apparatus 1 illustrated in FIG. 1, the chamber bottom 256 may have at least two chamber exhaust port groups among the chamber exhaust port groups 286a to 286c illustrated in FIG. 4. Similarly, the chamber inner wall part 255 in the substrate processing apparatus 1d illustrated in FIG. 24 may include at least two chamber exhaust port groups among the chamber exhaust port groups 286a to 286c illustrated in FIG. 25. Each chamber exhaust port group in the substrate processing apparatuses 1 and 1d may include only either one of the large chamber exhaust port 281 and the small chamber exhaust port 284. That is, the chambers 21 and 21d may have at least two chamber exhaust ports that are connected respectively to at least two mutually independent exhaust mechanisms. Hereinafter, those two chamber exhaust ports are respectively referred to as a "first chamber exhaust port" and a "second chamber exhaust port."

When the chambers 21 and 21d have the first chamber exhaust port and the second chamber exhaust port, the exhaust mechanisms can be easily switched as described above, by rotating the cup parts 4 and 4d such that the cup exhaust port 461 selectively overlaps with either the first chamber exhaust port or the second chamber exhaust port.

The chamber bottom 256 does not necessarily need to have the nine chamber drain ports 271 illustrated in FIGS. 4 and 26. It is, however, preferable for the chamber bottom 256 to have at least a first chamber drain port and a second chamber drain port that correspond respectively to the first chamber exhaust port and the second chamber exhaust port. The first chamber drain port and the second chamber drain port are connected respectively to two mutually independent drainage parts.

In the state in which the cup exhaust port 461 overlaps with the first chamber exhaust port, the cup drain port 451 overlaps with the first chamber drain port, and in the state in which the cup exhaust port 461 overlaps with the second chamber exhaust port, the cup drain port 451 overlaps with the second chamber drain port. Thus, the switching of the exhaust destination and the switching of the drainage destination can be achieved with a single mechanism as described above.

The first chamber exhaust port and the second chamber exhaust port described above may, for example, respectively be a large chamber exhaust port 281 connected to the first exhaust mechanism 95a and a large chamber exhaust port 281 connected to the second exhaust mechanism 95b. In this case, the first chamber drain port and the second chamber drain port are respectively one chamber drain port 271 that is connected to the first drainage part 96a and one chamber drain port 271 that is connected to the second drainage part 96b.

Alternatively, the first chamber exhaust port and the second chamber exhaust port may, for example, respectively be a small chamber exhaust port 284 that is connected to the third exhaust mechanism 95c and a small chamber exhaust port 284 that is connected to the first exhaust mechanism 95a. In this case, the first chamber drain port and the second chamber drain port are respectively one chamber drain port 271 that is connected to the third drainage part 96c and one chamber drain port 271 that is connected to the first drainage part 96a.

The cup exhaust port 461 does not necessarily need to be provided in the cup inner wall part 43 or the cup bottom 42, as long as the cup exhaust port 461 is provided in the cup part. For example, the cup exhaust port 461 may be provided in the vicinity of the boundary between the cup inner wall part 43 and the cup bottom 42.

Figure 27:
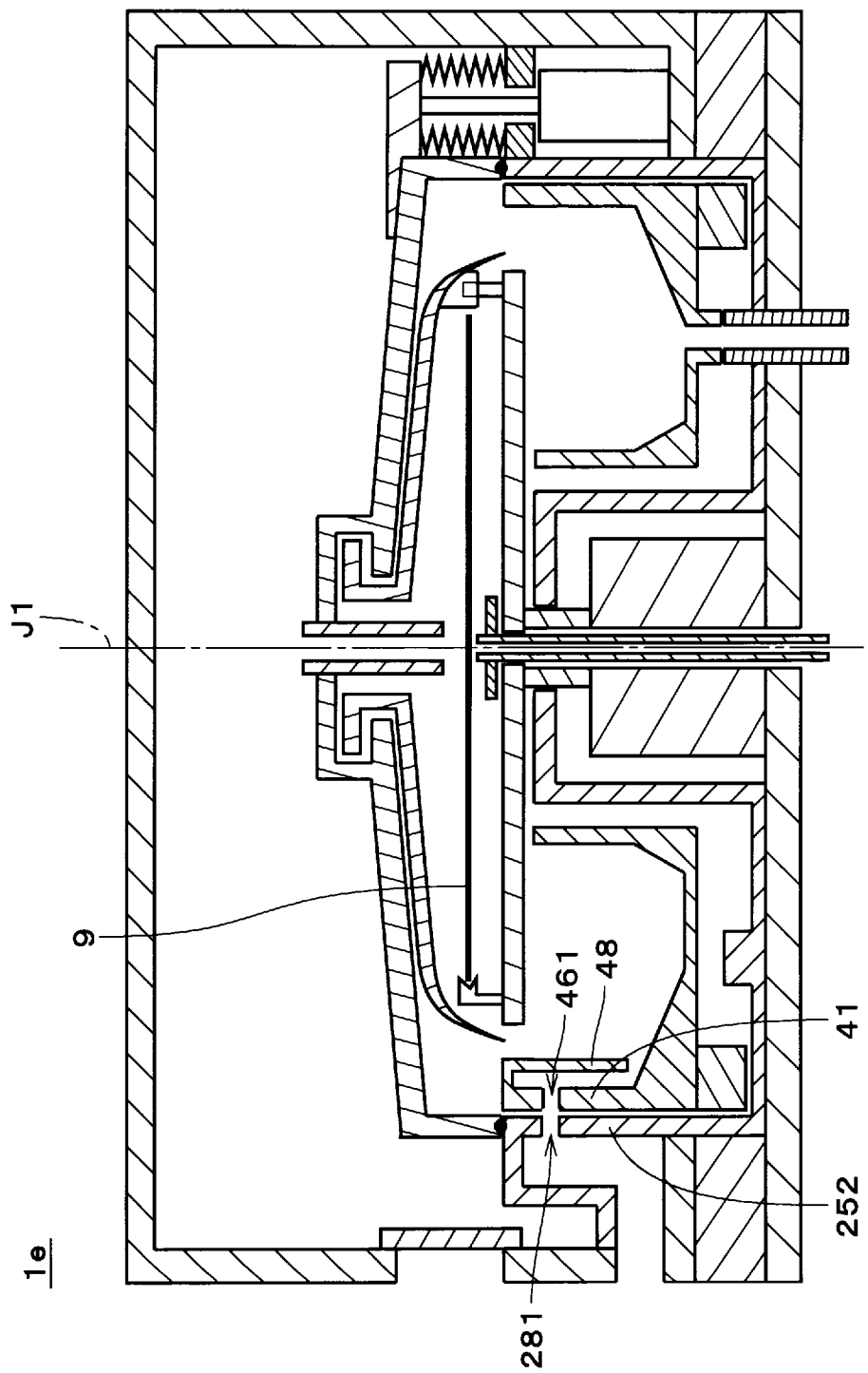
FIG. 27 is a cross-sectional view of the substrate processing apparatus.

Alternatively, the cup exhaust port 461 may be provided in the cup outer wall part 41 as in a substrate processing apparatus 1e illustrated in FIG. 27. In this case, the first chamber exhaust port and the second chamber exhaust port described above (e.g., the large chamber exhaust ports 281) are provided at approximately the same position in the up-down direction as the cup exhaust port 461 in the chamber outer wall part 252 that opposes the cup outer wall part 41. When the cup exhaust port 461 is provided in the cup outer wall part 41, there is preferably an overhang 48 that extends radially inward from the upper end portion of the cup outer wall part 41 and further extends downward so as to oppose the cup exhaust port 461 in the radial direction. The overhang 48 preferably covers the opposite sides of the cup exhaust port 461 in the circumferential direction. The provision of the overhang 48 suppresses the entry of processing liquids dispersed from the substrate 9 into the cup exhaust port 461.

In the substrate processing apparatus 1 illustrated in FIG. 1 and the substrate processing apparatus 1a illustrated in FIG. 14, the chamber bottom 256 may have at least one pair of a large chamber exhaust port 281 and a small chamber exhaust port 284 among the plurality of pairs of large chamber exhaust ports 281 and small chamber exhaust ports 284 illustrated in FIGS. 4 and 16. In this case, two chamber drain ports 271 corresponding to the large chamber exhaust port 281 and the small chamber exhaust port 284 are preferably provided in the chamber bottom 256. The chamber bottom 256 in the substrate processing apparatus 1b illustrated in FIG. 20 may have at least one chamber exhaust port 281. In this case, one chamber drain port group corresponding to this one chamber exhaust port 281 is preferably provided in the chamber bottom 256.

The numbers and circumferential positions of the (inner) chamber drain ports 271, the outer chamber drain port 277, the (large) chamber exhaust ports 281, the small chamber exhaust ports 284, the outer projections 273 and 279, and the inner projections 283 that are provided in the chamber bottom 256 may be changed appropriately. The numbers and circumferential positions of the (inner) cup drain port 451, the outer cup drain port 457, the (large) cup exhaust port 461, the small cup exhaust port 464, the outer projections 453, and the inner projections 463 that are provided in the cup bottom 42 may also be changed appropriately.

In the substrate processing apparatuses 1 and 1a to 1e, the numbers and circumferential positions of the (inner) chamber drain ports 271, the outer chamber drain port 277, the (large) chamber exhaust ports 281, the small chamber exhaust ports 284, the outer projections 273 and 279, and the inner projections 283 that are provided in the chambers 21 and 21a to 21d may be changed appropriately. The numbers and circumferential positions of the (inner) cup drain port 451, the outer cup drain port 457, the (large) cup exhaust port 461, the small cup exhaust port 464, the outer projections 453, and the inner projections 463 that are provided in the cup parts 4 and 4a to 4d may also be changed appropriately.

Processing liquids flowing from the substrate 9 into the cup part may be discharged through common piping to the outside of the chamber and the housing, and the discharge destination may be switched by means of valves or the like outside the housing. Even in this case, upsizing of the substrate processing apparatuses 1 and 1a to 1e is suppressed because of relatively small sizes of valves and piping for processing liquids.

The cup outer wall part 41, the cup inner wall part 43, the (first) partition wall 44, and the second partition wall 47 of the cup parts 4 and 4a to 4d may be of various shapes other than generally cylindrical shapes as long as they have generally tubular shapes.

The chamber opening-and-closing mechanism 23 does not necessarily need to move the chamber lid part 26 in the up-down direction and may, for example, move the chamber body 25 in the up-down direction while the chamber lid part 26 is fixed. The chambers 21 and 21a to 21d do not necessarily need to have generally cylindrical shapes and may be of various shapes. In the above-described substrate processing apparatuses 1 and 1a to 1 e, the chambers 21 and 21a to 21d do not necessarily need to form a sealed space. For example, the chamber lid part 26 and the top plate 22 may be omitted, and the chambers 21 and 21a to 21d may be open chambers that are open at the top.

The elevating mechanism 33 does not necessarily need to move the substrate 9 and the substrate holder 31 in the up-down direction and may, for example, move the cup part 4b in the up-down direction while the substrate holder 31 is located at a fixed position in the up-down direction.

The shapes and structures of the stator 71 and the rotor 72 of the cup rotation mechanism 7 may be modified in various ways. The rotor 72 does not necessarily need to rotate in a floating state and may, for example, rotate along a structure such as a guide that mechanically supports the rotor 72 within the chambers 21 and 21a to 21d. The cup rotation mechanism 7 does not necessarily need to be a hollow motor, and an axial-rotation motor may be used as a cup rotation mechanism.

The above-described substrate processing apparatuses may be used to process glass substrates used in display devices such as liquid crystal displays, plasma displays, and field emission displays (FEDs), instead of semiconductor substrates. The above-described substrate processing apparatuses may also be used to process other substrates such as optical disk substrates, magnetic disk substrates, magneto-optical disk substrates, photomask substrates, ceramic substrates, and solar-cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST 1, 1a to 1e Substrate processing apparatus
4, 4a to 4d Cup part
5 Processing liquid supply part
6 Housing
7 Cup rotation mechanism
9 Substrate
10 Controller
21, 21a to 21d Chamber
31 Substrate holder
33 Elevating mechanism
34 Protruding part
41 Cup outer wall part
42 Cup bottom
43 Cup inner wall part
44 (First) partition wall
45 (Outer) cup space
45a First outer cup space
45b Second outer cup space
47 Second partition wall
61 Housing bottom
71 Stator
72 Rotor
95a First exhaust mechanism
95b Second exhaust mechanism
95c Third exhaust mechanism
95d Fourth exhaust mechanism
96a First drainage part
96b Second drainage part
96c Third drainage part
96d Fourth drainage part
252 Chamber outer wall part 255 Chamber inner wall part
256 Chamber bottom
271 (Inner) chamber drain port
271a Chamber drain port
277 Outer chamber drain port
281 (Large) chamber exhaust port
281a Overlap region
281b Non-overlap region
282, 285 Bottom protruding part
284 Small chamber exhaust port
285a Upper end surface (of bottom protruding part)
451 (Inner) cup drain port
457 Outer cup drain port
461 (Large) cup exhaust port
461a Overlap region
461b Non-overlap region
462, 462a, 465 Bottom protruding part
462b, 465a Lower end surface (of bottom protruding part)
464 Small cup exhaust port
J1 Central axis
S11 to S22 Step

The invention claimed is:

1. A substrate processing apparatus for processing a substrate, comprising:
a substrate holder for holding a substrate in a horizontal position;
a processing liquid supply part for supplying a processing liquid to said substrate;
a cup part having a cup exhaust port and for receiving a processing liquid from said substrate; a chamber for internally housing said substrate holder and said cup part;
a cup rotation mechanism for rotating said cup part about a central axis pointing in an up-down direction; and
a controller is configured for rotating said cup part via said cup rotation mechanism and determining a position of said cup exhaust port in a circumferential direction about said central axis,
wherein said chamber has a first chamber exhaust port and a second chamber exhaust port that are arranged in said circumferential direction,
said controller is configured to controls said cup rotation mechanism to cause said cup exhaust port to selectively overlap with either said first chamber exhaust port or said second chamber exhaust port,
in a state in which said cup exhaust port overlaps with said first chamber exhaust port, gas in said cup part is discharged through said cup exhaust port and said first chamber exhaust port to an outside of said chamber by a first exhaust mechanism that is connected to said first chamber exhaust port, and
in a state in which said cup exhaust port overlaps with said second chamber exhaust port, the gas in said cup part is discharged through said cup exhaust port and said second chamber exhaust port to the outside of said chamber by a second exhaust mechanism that is connected to said second chamber exhaust port.

2. The substrate processing apparatus according to claim 1, wherein
said cup exhaust port is provided in a bottom of said cup part, and
said first chamber exhaust port and said second chamber exhaust port are provided in a bottom of said chamber.

3. The substrate processing apparatus according to claim 2, wherein
suction of the gas in said cup part through said cup exhaust port is stopped when either a lower end of said cup exhaust port is in close proximity to said bottom of said chamber or an upper end of said first chamber exhaust port and an upper end of said second chamber exhaust port are in close proximity to said bottom of said cup part, in a state in which said cup exhaust port is located at a position spaced in said circumferential direction from said first chamber exhaust port and said second chamber exhaust port.

4. The substrate processing apparatus according to claim 2, wherein
said bottom of said cup part has a cup drain port,
said bottom of said chamber has a first chamber drain port and a second chamber drain port that are arranged in said circumferential direction,
in a state in which said cup exhaust port overlaps with said first chamber exhaust port, said cup drain port overlaps with said first chamber drain port to discharge a processing liquid in said cup part to a first drainage part that is connected to said first chamber drain port and located outside said chamber,
in a state in which said cup exhaust port overlaps with said second chamber exhaust port, said cup drain port overlaps with said second chamber drain port to discharge a processing liquid in said cup part to a second drainage part that is connected to said second chamber drain port and located outside said chamber,
a length of said first chamber drain port in said circumferential direction is longer than a length of said cup drain port in said circumferential direction,
by rotating said cup part from a state in which said cup drain port overlaps with said first chamber drain port and said cup exhaust port overlaps with said first chamber exhaust port while maintaining the overlap between said cup drain port and said first chamber drain port, said cup exhaust port is moved to a position shifted from said first chamber exhaust port,
said cup exhaust port is provided in a bottom protruding part that is provided in said bottom of said cup part and protrudes downward,
a lower end surface of said bottom protruding part is perpendicular to said up-down direction, and
suction of the gas in said cup part through said cup exhaust port is stopped when an upper end of said first chamber exhaust port is in close proximity to said lower end surface of said bottom protruding part in a state in which said cup exhaust port is located at said position shifted from said first chamber exhaust port.

5. The substrate processing apparatus according to claim 1, wherein
said cup part has a ring shape about said central axis,
said cup part includes:
a circular ring-shaped bottom;
a cylindrical inner wall part that extends upward from an inner circumferential portion of said bottom; and
a cylindrical outer wall part that extends upward from an outer circumferential portion of said bottom,
said cup exhaust port is provided in either said inner wall part or said outer wall part, and
said first chamber exhaust port and said second chamber exhaust port are provided in a side wall part of said chamber that opposes either said inner wall part or said outer wall part of said cup part.

6. The substrate processing apparatus according to claim 5, wherein
suction of the gas in said cup part through said cup exhaust port is stopped when said cup exhaust port is in close proximity to said side wall part of said chamber in a state in which said cup exhaust port is located at a position spaced in said circumferential direction from said first chamber exhaust port and said second chamber exhaust port.

7. The substrate processing apparatus according to claim 1, wherein
a bottom of said cup part has a cup drain port,
a bottom of said chamber has a first chamber drain port and a second chamber drain port that are arranged in said circumferential direction,
in a state in which said cup exhaust port overlaps with said first chamber exhaust port, said cup drain port overlaps with said first chamber drain port to discharge a processing liquid in said cup part to a first drainage part that is connected to said first chamber drain port and located outside said chamber, and
in a state in which said cup exhaust port overlaps with said second chamber exhaust port, said cup drain port overlaps with said second chamber drain port to discharge a processing liquid in said cup part to a second drainage part that is connected to said second chamber drain port and located outside said chamber.

8. The substrate processing apparatus according to claim 7, wherein
said bottom of said chamber has another first chamber drain port that is arranged along with said first chamber drain port and said second chamber drain port in said circumferential direction and connected to said first drainage part, and
in a state in which said cup drain port overlaps with said another first chamber drain port, a processing liquid in said cup part is discharged to said first drainage part, and said cup exhaust port is located at a position spaced in said circumferential direction from said first chamber exhaust port and said second chamber exhaust port.

9. The substrate processing apparatus according to claim 7, wherein
a length of said first chamber drain port in said circumferential direction is longer than a length of said cup drain port in said circumferential direction, and
by rotating said cup part from a state in which said cup drain port overlaps with said first chamber drain port and said cup exhaust port overlaps with said first chamber exhaust port while maintaining the overlap between said cup drain port and said first chamber drain port, said cup exhaust port is moved to a position shifted from said first chamber exhaust port.

10. The substrate processing apparatus according to claim 7, wherein
said cup part has a ring shape about said central axis,
said cup part includes:
said bottom having a circular ring shape;
a cylindrical inner wall part that extends upward from an inner circumferential portion of said bottom;
a cylindrical outer wall part that extends upward from an outer circumferential portion of said bottom; and
a cylindrical partition wall that is located between said inner wall part and said outer wall part and extends upward from said bottom,
a processing liquid from said processing liquid supply part flows into a space between said outer wall part and said partition wall of said cup part,
said cup drain port is located on an outer side of said partition wall in a radial direction about said central axis, and
said cup exhaust port is located on an inner side of said partition wall in said radial direction.

11. The substrate processing apparatus according to claim 10, further comprising:
an elevating mechanism for moving said substrate holder relative to said cup part in said up-down direction,
wherein said cup part further includes another tubular partition wall that is located between said partition wall and said outer wall part and extends upward from said bottom,
said cup drain port is located on an inner side of said another partition wall in said radial direction,
said bottom of said cup part has another cup drain port that is located on an outer side of said another partition wall in said radial direction,
said bottom of said chamber has another chamber drain port that is located on an outer side of said first chamber drain port and said second chamber drain port in said radial direction and connected to another drainage part,
said substrate is moved along with said substrate holder between a first position relative to said cup part and a second position that is above said first position by said elevating mechanism,
in a state in which said substrate is located at said first position, a processing liquid supplied from said processing liquid supply part to said substrate flows into a space between said another partition wall and said partition wall of said cup part, and
in a state in which said substrate is located at said second position, a processing liquid supplied from said processing liquid supply part to said substrate flows into a space between said outer wall part and said another partition wall of said cup part, and said another cup drain port overlaps with said another chamber drain port to discharge the processing liquid to said another drainage part located outside said chamber.

12. The substrate processing apparatus according to claim 10, wherein
said substrate holder includes a disc-shaped holder body centered on said central axis,
said holder body opposes said cup part in said up-down direction above said cup part, and
said holder body has a ring-shaped protruding part that protrudes downward from a lower surface of said holder body and surrounds said central axis either on the outer side of said partition wall in the radial direction or at the same position in the radial direction as said partition wall.

13. The substrate processing apparatus according to claim 1, wherein
said substrate holder includes a disc-shaped holder body centered on said central axis,
said holder body opposes said cup part in said up-down direction above said cup part, and
said holder body has a ring-shaped protruding part that protrudes downward from a lower surface of said holder body and surrounds said central axis.

14. The substrate processing apparatus according to claim 1, wherein
said cup rotation mechanism includes:
a ring-shaped rotor that is disposed within said chamber and attached to said cup part; and
a stator that is disposed around said rotor outside said chamber and for generating a torque between said rotor and said stator.

15. The substrate processing apparatus according to claim 14, wherein said rotor is rotated in a floating state within said chamber by a magnetic force acting between said stator and said rotor.

16. The substrate processing apparatus according to claim 1, wherein
said chamber is a sealed-space forming part for forming a sealed space for disposing said substrate holder and said cup part.

17. A substrate processing apparatus for processing a substrate, comprising:
a substrate holder for holding a substrate in a horizontal position;
a processing liquid supply part for supplying a processing liquid to said substrate;
a cup part having a cup exhaust port in a bottom and for receiving a processing liquid from said substrate;
a chamber for internally housing said substrate holder and said cup part and having a chamber exhaust port in a bottom;
a cup rotation mechanism for rotating said cup part about a central axis pointing in an up-down direction; and
a controller configured for rotating said cup part via said cup rotation mechanism and determining a position of said cup exhaust port in a circumferential direction about said central axis,
wherein in a state in which said cup exhaust port overlaps with said chamber exhaust port, gas in said cup part is discharged through said cup exhaust port and said chamber exhaust port to an outside of said chamber by an exhaust mechanism that is connected to said chamber exhaust port, and
a flow rate of exhaust gas discharged from said chamber via said exhaust mechanism is changed by said controller controlling said cup rotation mechanism to change an area of overlap between said cup exhaust port and said chamber exhaust port.

18. The substrate processing apparatus according to claim 17, wherein
said chamber exhaust port includes:
a large chamber exhaust port; and
a small chamber exhaust port that is arranged along with said large chamber exhaust port in said circumferential direction and has a smaller area than said large chamber exhaust port, and
changing the area of overlap between said cup exhaust port and said chamber exhaust port corresponds to causing said cup exhaust port to selectively overlap with either said large chamber exhaust port or said small chamber exhaust port.

19. The substrate processing apparatus according to claim 18, wherein
a non-overlap region of a lower end of said cup exhaust port, excluding an overlap region of the lower end that overlaps with said small chamber exhaust port, is blocked when said non-overlap region is in close proximity to said bottom of said chamber.

20. The substrate processing apparatus according to claim 19, wherein
said small chamber exhaust port is provided in a bottom protruding part that is provided in said bottom of said chamber and protrudes upward,
an upper end surface of said bottom protruding part is perpendicular to said up-down direction, and
said non-overlap region of said cup exhaust port is blocked when said non-overlap region is in close proximity to said upper end surface of said bottom protruding part.

21. The substrate processing apparatus according to claim 18, wherein
by rotating said cup part by a slight angle from a state in which said cup exhaust port overlaps with one chamber exhaust port out of said large chamber exhaust port and said small chamber exhaust port while maintaining the overlap between said cup exhaust port and said one chamber exhaust port, the area of overlap between said cup exhaust port and said one chamber exhaust port is changed to finely adjust a flow rate of exhaust gas discharged from said chamber via said exhaust mechanism.

22. The substrate processing apparatus according to claim 17, wherein
said cup exhaust port includes:
a large cup exhaust port; and
a small cup exhaust port that is arranged along with said large cup exhaust port in said circumferential direction and has a smaller area than said large cup exhaust port, and
changing the area of overlap between said cup exhaust port and said chamber exhaust port corresponds to causing either said large cup exhaust port or said small cup exhaust port to selectively overlap with said chamber exhaust port.

23. The substrate processing apparatus according to claim 22, wherein
a non-overlap region of an upper end of said chamber exhaust port, excluding an overlap region of the upper end that overlaps with said small cup exhaust port, is blocked when said non-overlap region is in close proximity to said bottom of said cup part.

24. The substrate processing apparatus according to claim 23, wherein
said small cup exhaust port is provided in a bottom protruding part that is provided in said bottom of said cup part and protrudes downward,
a lower end surface of said bottom protruding part is perpendicular to said up-down direction, and
said non-overlap region of said chamber exhaust port is blocked when said non-overlap region is in close proximity to said lower end surface of said bottom protruding part.

25. The substrate processing apparatus according to claim 22, wherein
by rotating said cup part by a slight angle from a state in which one cup exhaust port out of said large cup exhaust port and said small cup exhaust port overlaps with said chamber exhaust port while maintaining the overlap between said one cup exhaust port and said chamber exhaust port, the area of overlap between said one cup exhaust port and said chamber exhaust port is changed to finely adjust a flow rate of exhaust gas discharged from said chamber via said exhaust mechanism.

26. The substrate processing apparatus according to claim 17, wherein
changing the area of overlap between said cup exhaust port and said chamber exhaust port is achieved by rotating said cup part while maintaining the overlap between said cup exhaust port and said chamber exhaust port.

27. The substrate processing apparatus according to claim 26, wherein
a non-overlap region of an upper end of said chamber exhaust port, excluding an overlap region of the upper end that overlaps with said cup exhaust port, is blocked when said non-overlap region is in close proximity to said bottom of said cup part, and a non-overlap region of a lower end of said cup exhaust port, excluding an overlap region of the lower end that overlaps with said chamber exhaust port, is blocked when said non-overlap region is in close proximity to said bottom of said chamber.

28. The substrate processing apparatus according to claim 27, wherein said cup exhaust port is provided in a bottom protruding part that is provided in said bottom of said cup part and protrudes downward, a lower end surface of said bottom protruding part is perpendicular to said up-down direction, and said non-overlap region of said chamber exhaust port is blocked when said non-overlap region is in close proximity to said lower end surface of said bottom protruding part.

29. The substrate processing apparatus according to claim 27, wherein said chamber exhaust port is provided in another bottom protruding part that is provided in said bottom of said chamber and protrudes upward, an upper end surface of said another bottom protruding part is perpendicular to said up-down direction, and said non-overlap region of said cup exhaust port is blocked when said non-overlap region is in close proximity to said upper end surface of said another bottom protruding part.

30. The substrate processing apparatus according to claim 17, wherein suction of the gas in said cup part through said cup exhaust port is stopped when either a lower end of said cup exhaust port is in close proximity to said bottom of said chamber or an upper end of said chamber exhaust port is in close proximity to said bottom of said cup part, in a state in which said cup exhaust port is located at a position spaced in said circumferential direction from said chamber exhaust port.

31. The substrate processing apparatus according to claim 17, wherein said cup rotation mechanism includes:

a ring-shaped rotor that is disposed within said chamber and attached to said cup part; and a stator that is disposed around said rotor outside said chamber and for generating a torque between said rotor and said stator.

32. The substrate processing apparatus according to claim 31, wherein said rotor is rotated in a floating state within said chamber by a magnetic force acting between said stator and said rotor.

33. The substrate processing apparatus according to claim 17, wherein said chamber is a sealed-space forming part for forming a sealed space for disposing said substrate holder and said cup part.

* * * * *